United States Patent
Hansell et al.

(10) Patent No.: US 10,554,257 B2
(45) Date of Patent: *Feb. 4, 2020

(54) SYSTEM AND METHOD FOR INFERRING SCHEMATIC AND TOPOLOGICAL PROPERTIES OF AN ELECTRICAL DISTRIBUTION GRID

(71) Applicants: Astrolink International LLC, Bethesda, MD (US); Dominion Energy Technologies, Inc., Richmond, VA (US)

(72) Inventors: Jerritt Hansell, Boulder, CO (US); Henrik F. Bernheim, Denver, CO (US); Yu Liao, Longmont, CO (US); Marcia Reid Martin, Longmont, CO (US); Andrew Louis Abendschein, Longmont, CO (US)

(73) Assignees: Dominion Energy Technologies, Inc., Richmond, VA (US); Astrolink International LLC, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/177,930

(22) Filed: Jun. 9, 2016

(65) Prior Publication Data

US 2016/0285511 A1    Sep. 29, 2016

Related U.S. Application Data

(63) Continuation of application No. 13/871,944, filed on Apr. 26, 2013.

(Continued)

(51) Int. Cl.
*H04B 3/54* (2006.01)
*H04L 12/24* (2006.01)
(Continued)

(52) U.S. Cl.
CPC .............. *H04B 3/54* (2013.01); *G01R 29/18* (2013.01); *G05B 13/02* (2013.01); *H02J 13/002* (2013.01);
(Continued)

(58) Field of Classification Search
CPC .............. H04B 3/54; H04B 2203/5433; H04B 2203/5466; H04B 3/542; H04B 3/546;
(Continued)

(56) References Cited

U.S. PATENT DOCUMENTS 3,733,586 A    5/1973  Lusk et al.
3,911,415 A   10/1975  Whyte
(Continued)

FOREIGN PATENT DOCUMENTS

CN    101770007 A    7/2010
EP    0395495 A1    10/1990
(Continued)

OTHER PUBLICATIONS

Author Unknown, "MicroPianet® Voltage Regulators," EnergyIdeas Clearinghouse PTR #6.4, Product and Technology Review, Jun. 2008, 6 pages, http://www.energyideas.org/documents/factsheets/PTR/Microplanet.pdf.

(Continued)

*Primary Examiner* — Patrick N Edouard
*Assistant Examiner* — Eboni N Giles
(74) *Attorney, Agent, or Firm* — Withrow & Terranova, PLLC

(57) ABSTRACT

A system and method for inferring schematic and topological properties of an electrical distribution grid is provided. The system may include Remote Hubs, Subordinate Remotes, a Substation Receiver, and an associated Computing Platform and Concentrator. At least one intelligent edge transmitter, called a Remote Hub Edge Transmitter, may (Continued)

transmit messages on the electrical distribution grid by injecting a modulated current into a power main that supplies an electric meter. The Subordinate Remotes, Remote Hubs, the Substation Receiver, and the associated Computing Platform and Concentrator may contain processing units which execute stored instructions allowing each node in the network to implement methods for organizing the on-grid network and transmitting and receiving messages on the network. The Substation Receiver, Computing Platform, and Concentrator may detect and infer schematic grid location attributes of the network and publish the detected and inferred attributes to other application systems including geospatial information systems.

10 Claims, 23 Drawing Sheets

Related U.S. Application Data

(60) Provisional application No. 61/779,222, filed on Mar. 13, 2013, provisional application No. 61/766,551, filed on Feb. 19, 2013.

(51) Int. Cl.
  *H02J 13/00* (2006.01)
  *H04L 12/26* (2006.01)
  *G05B 13/02* (2006.01)
  *G01R 29/18* (2006.01)
  *G06Q 50/06* (2012.01)
  *H04L 1/00* (2006.01)
  *H04L 1/18* (2006.01)

(52) U.S. Cl.
  CPC ............ *H04B 3/542* (2013.01); *H04B 3/546* (2013.01); *H04L 41/0803* (2013.01); *H04L 41/083* (2013.01); *H04L 41/12* (2013.01); *H04L 43/0847* (2013.01); *G06Q 50/06* (2013.01); *H04B 2203/5433* (2013.01); *H04B 2203/5466* (2013.01); *H04L 1/0009* (2013.01); *H04L 1/188* (2013.01); *Y02E 60/723* (2013.01); *Y02E 60/7815* (2013.01); *Y02E 60/7892* (2013.01); *Y04S 10/16* (2013.01); *Y04S 40/121* (2013.01); *Y04S 40/146* (2013.01); *Y04S 40/162* (2013.01); *Y04S 40/168* (2013.01)

(58) Field of Classification Search
  CPC ..... G05B 13/02; H04L 1/001; H04L 41/0803; H04L 41/083; H04L 41/12; H04L 43/0847
  See application file for complete search history.

(56) References Cited

U.S. PATENT DOCUMENTS

| | | | |
|---|---|---|---|
| 3,942,170 A | 3/1976 | Whyte | |
| 3,944,723 A | 3/1976 | Fong | |
| 4,200,770 A | 4/1980 | Hellman et al. | |
| 4,361,766 A | 11/1982 | de Montgolfier et al. | |
| 4,371,867 A | 2/1983 | Gander | |
| 4,568,934 A | 2/1986 | Allgood | |
| 4,580,276 A | 4/1986 | Andruzzi, Jr. et al. | |
| 4,633,463 A | 12/1986 | Mack | |
| 4,668,934 A | 5/1987 | Shuey | |
| 4,918,422 A | 4/1990 | Mak | |
| 5,463,624 A | 10/1995 | Hogg et al. | |
| 5,812,557 A | 9/1998 | Stewart et al. | |
| 5,818,725 A | 10/1998 | McNamara et al. | |
| 5,987,305 A | 11/1999 | Reitberger | |
| 6,144,292 A | 11/2000 | Brown | |
| 6,212,560 B1 | 4/2001 | Fairchild | |
| 6,366,062 B2 | 4/2002 | Baretich et al. | |
| 6,373,399 B1 * | 4/2002 | Johnson | G01D 4/004 340/870.02 |
| 6,535,797 B1 | 3/2003 | Bowles et al. | |
| 6,650,249 B2 | 11/2003 | Meyer et al. | |
| 6,687,110 B2 | 2/2004 | Murray | |
| 6,690,655 B1 | 2/2004 | Miner et al. | |
| 6,747,994 B2 | 6/2004 | Oses et al. | |
| 6,788,702 B1 | 9/2004 | Garcia-Luna-Aceves et al. | |
| 6,961,641 B1 | 11/2005 | Forth et al. | |
| 7,053,756 B2 | 5/2006 | Mollenkopf et al. | |
| 7,058,524 B2 | 6/2006 | Hayes et al. | |
| 7,069,117 B2 | 6/2006 | Wilson et al. | |
| 7,076,378 B1 | 7/2006 | Huebner | |
| 7,188,003 B2 | 3/2007 | Ransom et al. | |
| 7,194,528 B1 * | 3/2007 | Davidow | H04L 12/2836 340/12.32 |
| 7,236,765 B2 | 6/2007 | Bonicatto et al. | |
| 7,251,570 B2 | 7/2007 | Hancock et al. | |
| 7,280,931 B1 | 10/2007 | Kim et al. | |
| 7,319,280 B1 | 1/2008 | Landry et al. | |
| 7,323,968 B2 | 1/2008 | Iwamura | |
| 7,369,579 B2 | 5/2008 | Logvinov et al. | |
| 7,412,338 B2 | 8/2008 | Wynans et al. | |
| 7,552,437 B2 | 6/2009 | Di Luoffo et al. | |
| 7,571,028 B2 | 8/2009 | Lapinski et al. | |
| 7,598,844 B2 | 10/2009 | Corcoran et al. | |
| 7,701,330 B2 | 4/2010 | Iwamura | |
| 7,808,128 B1 | 10/2010 | Weber, Jr. et al. | |
| 7,826,538 B1 | 11/2010 | Weber, Jr. | |
| 7,870,600 B2 | 1/2011 | Huotari et al. | |
| 7,873,077 B2 | 1/2011 | Downey et al. | |
| 7,876,717 B2 | 1/2011 | Iwamura | |
| 7,948,255 B2 | 5/2011 | Shim et al. | |
| 8,013,570 B2 | 9/2011 | Baxter et al. | |
| 8,019,483 B2 | 9/2011 | Keefe | |
| 8,050,879 B2 | 11/2011 | Koste et al. | |
| 8,055,896 B2 | 11/2011 | Jin et al. | |
| 8,065,099 B2 | 11/2011 | Gibala et al. | |
| 8,099,479 B2 | 1/2012 | Saint-Hilaire | |
| 8,207,726 B2 | 6/2012 | Vaswani et al. | |
| 8,519,832 B2 | 8/2013 | Loporto et al. | |
| 8,521,337 B1 | 8/2013 | Johnson | |
| 8,626,462 B2 | 1/2014 | Kolwalkar et al. | |
| 8,639,922 B2 | 1/2014 | Phatak | |
| 8,639,992 B2 | 1/2014 | Haufe et al. | |
| 8,711,995 B2 | 4/2014 | Glende | |
| 8,737,555 B2 | 5/2014 | Haug et al. | |
| 8,818,742 B2 | 8/2014 | Ansari | |
| 8,872,667 B2 | 10/2014 | Bhageria et al. | |
| 9,059,842 B2 | 6/2015 | Bernheim et al. | |
| 9,287,933 B2 | 3/2016 | Yu | |
| 9,380,545 B2 | 6/2016 | Martin et al. | |
| 9,438,312 B2 | 9/2016 | Bernheim et al. | |
| 9,641,026 B2 | 5/2017 | Boardman et al. | |
| 9,654,287 B2 | 5/2017 | Zhao et al. | |
| 9,768,613 B2 | 9/2017 | Taft | |
| 9,847,641 B2 | 12/2017 | Capp et al. | |
| 9,859,712 B2 | 1/2018 | Nishibayashi et al. | |
| 9,866,012 B2 | 1/2018 | Hosny et al. | |
| 9,881,470 B2 | 1/2018 | Baynes et al. | |
| 9,917,442 B2 | 3/2018 | Beauregard et al. | |
| 9,922,293 B2 | 3/2018 | Brooks et al. | |
| 9,958,925 B2 | 5/2018 | Chapel et al. | |
| 10,330,812 B1 | 6/2019 | Barnett et al. | |
| 10,439,432 B2 | 10/2019 | Eckhardt et al. | |
| 2001/0018561 A1 | 8/2001 | Tanida | |
| 2001/0037378 A1 | 11/2001 | Hirayama | |
| 2001/0055272 A1 | 12/2001 | Matsuno et al. | |
| 2002/0009155 A1 | 1/2002 | Tzannes | |
| 2002/0069299 A1 | 6/2002 | Rosener et al. | |
| 2002/0089927 A1 | 7/2002 | Fischer et al. | |
| 2003/0098671 A1 | 5/2003 | Hochgraf | |
| 2003/0151491 A1 | 8/2003 | Martin et al. | |
| 2004/0062267 A1 | 4/2004 | Minami et al. | |
| 2004/0110044 A1 | 6/2004 | McArthur et al. | |

(56) References Cited

U.S. PATENT DOCUMENTS

| | | |
|---|---|---|
| 2004/0160990 A1* | 8/2004 | Logvinov .............. H04B 3/542 370/509 |
| 2004/0184406 A1 | 9/2004 | Iwamura |
| 2004/0218688 A1 | 11/2004 | Santhoff et al. |
| 2004/0226621 A1 | 11/2004 | Phillips et al. |
| 2004/0227621 A1 | 11/2004 | Cope et al. |
| 2005/0005150 A1 | 1/2005 | Ballard |
| 2005/0017848 A1* | 1/2005 | Flen ....................... H04B 3/542 340/870.02 |
| 2005/0018766 A1 | 1/2005 | Iwamura |
| 2005/0043860 A1 | 2/2005 | Petite |
| 2005/0047379 A1 | 3/2005 | Boyden et al. |
| 2005/0063422 A1 | 3/2005 | Lazar et al. |
| 2005/0144437 A1 | 6/2005 | Ransom et al. |
| 2005/0155033 A1 | 7/2005 | Luoffo et al. |
| 2005/0207079 A1* | 9/2005 | Tiller ..................... H04B 3/542 361/64 |
| 2005/0253690 A1 | 11/2005 | Crenshaw et al. |
| 2005/0281326 A1 | 12/2005 | Yu |
| 2006/0071757 A1 | 4/2006 | Burghard et al. |
| 2006/0078044 A1 | 4/2006 | Norrell et al. |
| 2006/0091877 A1 | 5/2006 | Robinson et al. |
| 2006/0097573 A1 | 5/2006 | Gidge et al. |
| 2006/0152344 A1 | 7/2006 | Mowery, Jr. |
| 2006/0259199 A1 | 11/2006 | Gjerde et al. |
| 2006/0291575 A1* | 12/2006 | Berkman ................. H04B 3/54 375/257 |
| 2007/0047573 A1 | 3/2007 | Logvinov et al. |
| 2007/0076650 A1 | 4/2007 | Manjeshwar et al. |
| 2007/0100506 A1 | 5/2007 | Teichmann |
| 2007/0101438 A1 | 5/2007 | Govindarajan |
| 2007/0114987 A1 | 5/2007 | Kagan |
| 2007/0162550 A1 | 7/2007 | Rosenberg |
| 2007/0208521 A1 | 9/2007 | Petite et al. |
| 2007/0211401 A1 | 9/2007 | Mak |
| 2007/0237181 A1 | 10/2007 | Cho et al. |
| 2007/0247331 A1 | 10/2007 | Angelis et al. |
| 2007/0271383 A1 | 11/2007 | Kim et al. |
| 2007/0297425 A1 | 12/2007 | Chirco |
| 2008/0040479 A1 | 2/2008 | Bridge et al. |
| 2008/0057866 A1 | 3/2008 | Schwager et al. |
| 2008/0077336 A1 | 3/2008 | Fernandes |
| 2008/0109387 A1 | 5/2008 | Deaver et al. |
| 2008/0187116 A1 | 8/2008 | Reeves et al. |
| 2008/0209481 A1 | 8/2008 | Barrett |
| 2008/0219239 A1 | 9/2008 | Bell et al. |
| 2008/0273521 A1 | 11/2008 | Shao et al. |
| 2008/0312851 A1* | 12/2008 | Kagan .................... G01D 4/002 702/60 |
| 2009/0027061 A1 | 1/2009 | Curt et al. |
| 2009/0060060 A1 | 3/2009 | Stadelmeier et al. |
| 2009/0088907 A1 | 4/2009 | Lewis et al. |
| 2009/0096416 A1 | 4/2009 | Tonewaga et al. |
| 2009/0125351 A1 | 5/2009 | Davis, Jr. et al. |
| 2009/0134699 A1 | 5/2009 | Choi et al. |
| 2009/0187344 A1 | 7/2009 | Brancaccio et al. |
| 2009/0210197 A1 | 8/2009 | Cleary |
| 2009/0219932 A1 | 9/2009 | Kobayashi |
| 2009/0238252 A1 | 9/2009 | Shah et al. |
| 2009/0240504 A1 | 9/2009 | Pang et al. |
| 2009/0243838 A1 | 10/2009 | Jones |
| 2009/0256686 A1 | 10/2009 | Abbot et al. |
| 2009/0304101 A1 | 12/2009 | LoPorto et al. |
| 2010/0005273 A1 | 1/2010 | Lee et al. |
| 2010/0007219 A1 | 1/2010 | de Buda et al. |
| 2010/0007336 A1 | 1/2010 | de Buda |
| 2010/0010857 A1 | 1/2010 | Fadell |
| 2010/0040068 A1 | 2/2010 | Wimmer |
| 2010/0054349 A1 | 3/2010 | Spencer |
| 2010/0061433 A1 | 3/2010 | Stadelmeier et al. |
| 2010/0134089 A1 | 6/2010 | Uram et al. |
| 2010/0141392 A1 | 6/2010 | Jo et al. |
| 2010/0180144 A1 | 7/2010 | Groseclose, Jr. et al. |
| 2010/0188260 A1 | 7/2010 | Cornwall et al. |
| 2010/0202471 A1 | 8/2010 | Maki |
| 2010/0217549 A1 | 8/2010 | Galvin et al. |
| 2010/0217550 A1 | 8/2010 | Crabtree et al. |
| 2010/0262313 A1 | 10/2010 | Chambers et al. |
| 2010/0262393 A1 | 10/2010 | Sharma et al. |
| 2010/0286840 A1 | 11/2010 | Powell et al. |
| 2010/0296560 A1 | 11/2010 | Sadan et al. |
| 2010/0296590 A1 | 11/2010 | Takasu |
| 2010/0306533 A1 | 12/2010 | Phatak |
| 2011/0026621 A1* | 2/2011 | Kim ........................ H04B 3/56 375/260 |
| 2011/0035073 A1 | 2/2011 | Ozog |
| 2011/0040419 A1 | 2/2011 | Kogler et al. |
| 2011/0040803 A1 | 2/2011 | Pasquero et al. |
| 2011/0043340 A1 | 2/2011 | Kim et al. |
| 2011/0103429 A1 | 5/2011 | Tanaka et al. |
| 2011/0106321 A1 | 5/2011 | Cherian et al. |
| 2011/0109320 A1 | 5/2011 | Curt et al. |
| 2011/0118888 A1 | 5/2011 | White, II |
| 2011/0121654 A1 | 5/2011 | Recker et al. |
| 2011/0122798 A1 | 5/2011 | Hughes et al. |
| 2011/0130991 A1 | 6/2011 | Koste et al. |
| 2011/0130992 A1 | 6/2011 | Kolwalkar et al. |
| 2011/0133655 A1 | 6/2011 | Recker et al. |
| 2011/0140911 A1 | 6/2011 | Pant et al. |
| 2011/0196546 A1 | 8/2011 | Muller et al. |
| 2011/0208468 A1 | 8/2011 | Yamamoto et al. |
| 2011/0212700 A1 | 9/2011 | Petite |
| 2011/0216747 A1 | 9/2011 | Shao et al. |
| 2011/0224935 A1 | 9/2011 | Hampel et al. |
| 2011/0267202 A1 | 11/2011 | Efthymiou et al. |
| 2011/0282508 A1 | 11/2011 | Goutard et al. |
| 2011/0285382 A1 | 11/2011 | Kolwalkar et al. |
| 2012/0020395 A1 | 1/2012 | Domanovitz et al. |
| 2012/0026908 A1 | 2/2012 | Tzannes et al. |
| 2012/0036250 A1 | 2/2012 | Vaswani et al. |
| 2012/0041696 A1 | 2/2012 | Sanderford, Jr. et al. |
| 2012/0052870 A1 | 3/2012 | Habicher |
| 2012/0062210 A1 | 3/2012 | Veillette |
| 2012/0062390 A1 | 3/2012 | Solomon |
| 2012/0068784 A1* | 3/2012 | Varadarajan ............. H04B 3/56 333/101 |
| 2012/0075099 A1 | 3/2012 | Brown |
| 2012/0086459 A1 | 4/2012 | Kim |
| 2012/0123606 A1 | 5/2012 | Mollenkopf et al. |
| 2012/0128080 A1 | 5/2012 | Woo et al. |
| 2012/0136500 A1 | 5/2012 | Hughes |
| 2012/0137126 A1 | 5/2012 | Matsuoka et al. |
| 2012/0139554 A1 | 6/2012 | Parsons |
| 2012/0155557 A1 | 6/2012 | Bush et al. |
| 2012/0158329 A1 | 6/2012 | Hurri et al. |
| 2012/0185838 A1 | 7/2012 | Schwartzman et al. |
| 2012/0195355 A1 | 8/2012 | El-Essawy et al. |
| 2012/0201145 A1 | 8/2012 | Ree et al. |
| 2012/0201155 A1 | 8/2012 | Du et al. |
| 2012/0223840 A1 | 9/2012 | Guymon et al. |
| 2012/0232915 A1 | 9/2012 | Bromberger |
| 2012/0236879 A1 | 9/2012 | Oksman et al. |
| 2012/0242499 A1 | 9/2012 | Ree |
| 2012/0245869 A1 | 9/2012 | Ansari |
| 2012/0250864 A1 | 10/2012 | Nishibayashi et al. |
| 2012/0262355 A1 | 10/2012 | He et al. |
| 2012/0265355 A1* | 10/2012 | Bernheim ............... G05B 15/02 700/286 |
| 2012/0266209 A1 | 10/2012 | Gooding et al. |
| 2012/0275084 A1 | 11/2012 | Familiant et al. |
| 2012/0275526 A1 | 11/2012 | Hughes |
| 2012/0280565 A1 | 11/2012 | Logvinov |
| 2012/0294342 A1 | 11/2012 | Schneider et al. |
| 2012/0307646 A1 | 12/2012 | Xia et al. |
| 2012/0310424 A1* | 12/2012 | Taft ........................... H02J 3/00 700/286 |
| 2012/0310558 A1 | 12/2012 | Taft |
| 2012/0313620 A1 | 12/2012 | Swarztrauber et al. |
| 2012/0314782 A1* | 12/2012 | Boivin .................. H04B 3/544 375/257 |
| 2012/0314868 A1 | 12/2012 | Bernheim et al. |
| 2012/0316696 A1 | 12/2012 | Boardman et al. |
| 2012/0323388 A1 | 12/2012 | Littrell et al. |

(56) References Cited

U.S. PATENT DOCUMENTS

| | | |
|---|---|---|
| 2012/0327989 A1 | 12/2012 | Zhang et al. |
| 2013/0013232 A1 | 1/2013 | Parwal et al. |
| 2013/0031201 A1 | 1/2013 | Kagan et al. |
| 2013/0034086 A1* | 2/2013 | Martin .................. H04W 56/00 370/336 |
| 2013/0063273 A1 | 3/2013 | Bhageria et al. |
| 2013/0067253 A1 | 3/2013 | Tsuda |
| 2013/0121157 A1 | 5/2013 | Logvinov et al. |
| 2013/0132555 A1 | 5/2013 | Wang et al. |
| 2013/0151177 A1 | 6/2013 | Hughes |
| 2013/0193767 A1 | 8/2013 | Carralero et al. |
| 2013/0194975 A1 | 8/2013 | Vedantham et al. |
| 2013/0204450 A1 | 8/2013 | Kagan et al. |
| 2013/0257452 A1 | 10/2013 | DeLeo et al. |
| 2014/0035372 A1 | 2/2014 | Normoyle et al. |
| 2014/0062719 A1 | 3/2014 | Rowitch |
| 2014/0105313 A1 | 4/2014 | Kim et al. |
| 2014/0118163 A1 | 5/2014 | Li et al. |
| 2014/0125125 A1 | 5/2014 | Wyatt |
| 2014/0140358 A1* | 5/2014 | Kim ........................ H04L 69/22 370/474 |
| 2014/0167735 A1 | 6/2014 | Beroset |
| 2014/0172723 A1 | 6/2014 | Borisov et al. |
| 2014/0191568 A1 | 7/2014 | Partovi |
| 2014/0233620 A1 | 8/2014 | Bernheim et al. |
| 2014/0233662 A1 | 8/2014 | Hansell et al. |
| 2014/0236365 A1 | 8/2014 | Martin et al. |
| 2014/0236366 A1 | 8/2014 | Livadaras et al. |
| 2014/0236506 A1 | 8/2014 | Nikovski et al. |
| 2014/0300210 A1 | 10/2014 | Abi-Ackel et al. |
| 2014/0359595 A1 | 12/2014 | Sehgal et al. |
| 2014/0361907 A1 | 12/2014 | Bernheim et al. |
| 2014/0368189 A1 | 12/2014 | Bernheim et al. |
| 2015/0010093 A1 | 1/2015 | Hansell et al. |
| 2015/0241488 A1 | 8/2015 | Sonderegger |
| 2015/0316620 A1 | 11/2015 | Luan et al. |
| 2015/0323582 A1 | 11/2015 | Pigeon |
| 2016/0112378 A1 | 4/2016 | Bernheim et al. |
| 2016/0124421 A1 | 5/2016 | Hansell et al. |
| 2016/0127242 A1 | 5/2016 | Bernheim et al. |
| 2016/0164287 A1 | 6/2016 | Bernheim |
| 2016/0204991 A1 | 7/2016 | Martin et al. |
| 2016/0302238 A1 | 10/2016 | Martin et al. |
| 2017/0344047 A1 | 11/2017 | Cioraca et al. |

FOREIGN PATENT DOCUMENTS

| | | |
|---|---|---|
| EP | 0629098 A2 | 12/1994 |
| EP | 1901145 A2 | 3/2008 |
| EP | 233043 A1 | 6/2011 |
| EP | 2566125 A1 | 3/2013 |
| EP | 3116084 A1 | 1/2017 |
| JP | H01106652 A | 4/1989 |
| JP | H09501766 A | 2/1997 |
| JP | 2003258689 A | 9/2003 |
| JP | 2003259696 A | 9/2003 |
| JP | 2003339120 A | 11/2003 |
| JP | 2004015840 A | 1/2004 |
| JP | 2004147063 A | 5/2004 |
| JP | 2005252671 A | 9/2005 |
| JP | 2006262570 A | 9/2006 |
| JP | 2007185083 A | 7/2007 |
| JP | 2008508781 A1 | 3/2008 |
| JP | 2008098812 A | 4/2008 |
| JP | 2008124859 A | 5/2008 |
| JP | 2010156694 A | 7/2010 |
| JP | 2010161923 A | 7/2010 |
| JP | 2010533843 A | 10/2010 |
| JP | 2010268121 A | 11/2010 |
| JP | 2011525787 A | 9/2011 |
| JP | 2012227928 A | 11/2012 |
| JP | 2012235457 A | 11/2012 |
| JP | 2013005718 A1 | 1/2013 |
| JP | 2013106255 A | 5/2013 |
| WO | 9501030 A1 | 1/1995 |
| WO | 9806187 A1 | 2/1998 |
| WO | 2009067250 A1 | 5/2009 |
| WO | 2010027421 A2 | 3/2010 |
| WO | 2010141859 A1 | 12/2010 |
| WO | 2013006273 A2 | 1/2013 |
| WO | 2013013162 A2 | 1/2013 |
| WO | 2013030937 A1 | 3/2013 |
| WO | 2014006662 A1 | 1/2014 |
| WO | 2014062967 A1 | 4/2014 |
| WO | 2014096911 A1 | 6/2014 |

OTHER PUBLICATIONS

Author Unknown, "Prime Alliance Official Website," Web, Date Accessed: Nov. 4, 2015, 3 pages, http://www.prime-alliance.org/.

Author Unknown, "The G3 PLC Alliance Unveils its Interoperability process," The G3-PLC Alliance, Oct. 8, 2012, Paris, France, http://www.g3-plc.com/content/press-releases, p. 1.

Author Unknown, "TWACS Low Frequency Power Line Communication Signals Problematic to Public Health," dated May 3, 2013, 20 pages, http://www.eiwellspring.org/smartmeter/TWACS.pdf.

Author Unknown, "Universal Powerline Bus Communication Technology Overview," Powerline Control Services, Jan. 8, 2002, 13 pages, http://pulseworx.com/downloads/upb/UpbOverview.pdf.

Baggini, Angelo "Handbook of Power Quality" John Wiley & Sons, Ltd., 2008, 65 pages.

Bates, Michael, "CVR has Potential Beyond Pushing Efficiencies on Feeders." renewGRID, Mar. 26, 2012, 2 pages, http://www.renew-grid.com/e107plugins/contenl/contenl.php?contenl.8215.

Bresesti, Paola et al., "SDNO: Smart Distribution Network Operation Project", Power Engineering Society General Meeting, IEEE, 2007, 4 pages.

Choi, Moonsuk et al., "Design of Integrated Meter Reading System based on Power-Line Communication", Power Line Communications and Its Applications, IEEE, International Symposium, 2008, pp. 280-284.

Collins, Dermot et al., "Transmission on Power Line Cables," Telektronikk, vol. 95, No. 2/3, 1999, pp. 134-137.

Dilek, M., "Integrated Design of Electrical Distribution Systems: Phase Balancing and Phase Prediction Case Studies," Dissertation, 2001, 150 pages, http://scholar.lib.vt.edu/theses/available/etd-11132001-222401/.

Goh, Chong Hock K., "A Current Study of Automatic Meter Reading Solutions via Power Line Communications," 19 pages, http://wpweb2k.gsia.cmu.edu/ceic/publicatons.htm. (Published 2003 or later as evidenced by the bibliography).

Ha, K. A., "Power Line Communication Technology," Presentation at Hong Kong Institute of Engineers Seminar on Last Mile Technology, Jun. 20, 2003, 24 pages.

Hooijen, Olaf G. "A Channel Model for the Residential Power Circuit Used as a Digital Communications Medium," IEEE Transactions on Electromagnetic Compatibility, vol. 40, No. 4, Nov. 1998, pp. 331-336.

McGhee, Jim et al., "Smart High Voltage Substation based on IEC 61850 Process Bus and IEEE 1588 Time Synchronization" 2010 First IEEE International Conference on Smart Grid Communications, IEEE, Oct. 4-6, 2010, pp. 489-494.

Mitchell, Travis, "Dominion Conservation Voltage Reduction software reduces energy use by 2.8%," Fierce Energy Daily, Sep. 27, 2011, 3 pages, http://www.fierceenergy.com/story/dominion-conservation-voltage-eduction-soflware-reduces-energy-use-28/2011-09-27.

Montoya, Luis F.,"Power Line Communications Performance Overview of the Physical Layer of Available Protocols," Thesis of Research, University of Florida, Gainesville, Florida, Date Unknown, pp. 1-15.

Moreno-Munoz A., et al., "Integrating Power Quality to Automated Meter Reading", IEEE Industrial Electronics Magazine, IEEE, US, vol. 2, No. 2, Jun. 17, 2008, pp. 10-18.

Newbury, John, "Efficient Communication Services Using the Low Voltage Distribution Line," Proceedings of 2002 PES Winter Meeting, IEEE, 2002, pp. 579-591.

(56) References Cited

OTHER PUBLICATIONS

Nyack, Cuthbert A., "Convolution and Autocorrelation," Web, Date Accessed: Nov. 4, 2015, 3 pages, http://cnyack.homestead.com/files/aconv/convau1.htm.
Pallares-Lopez et al., "Embedding synchronism in SmartGrid with IEEE1588-based for Intelligent Electronics," 2010 First IEEE International Conference on Smart Grid Communications, published/presented Oct. 4-6, 2010, Gaithersburg, Maryland, 7 pages.
Pavlidou, Niovi et al., "Power Line Communications: State of the Art and Future Trends," IEEE Communications Magazine, IEEE, vol. 41, No. 4, Apr. 2003, pp. 34-40.
Rye, Dave, "The X-10 Powerhouse Power Line Interface Model #PL513 and Two-Way Power Line Interface Model #TW523," X-10 Inc., X-10.RTM. Powerhouse (TM) Technical Note, Revision 2.4, 1991, 12 pages.
Schickhuber, Gerald et al., "Control Using Power Lines—A European View," Computing & Control Engineering Journal, vol. 8, No. 4, Aug. 1997, pp. 180-184.
Sherman et al, "Location Authentication through Power Line Communication: Design, Protocol, and Analysis of a New Out of Band Strategy," Cyber Defense Lab, Department of CSEE, University of Maryland, Baltimore County, IEEE, 2010, pp. 279-284.
Van Rensburg, Petrus A. Hanse et al., "Design of a Bidirectional Impedance-Adapting Transformer Coupling Circuit for Low-Voltage Power-Line Communications," IEEE Transactions on Power Delivery, IEEE, vol. 20, No. 1, Jan. 2005, pp. 64-70.
International Search Report for PCT/US2014/016538, dated Jun. 16, 2014, 3 pages.
International Preliminary Report on Patentability for PCT/US2014/016538, dated Sep. 3, 2015, 10 pages.
International Search Report for PCT/US2014/016540, dated Jun. 17, 2014, 3 pages.
International Preliminary Report on Patentability for PCT/US2014/016540, dated Sep. 3, 2015, 9 pages.
International Search Report for PCT/US2014/016535, dated Jun. 3, 2014, 2 pages.
International Preliminary Report on Patentability for PCT/US2014/016535, dated Sep. 3, 2015, 8 pages.
International Search Report and Written Opinion for PCT/US2014/041396, dated Oct. 29, 2014, 12 pages.
International Search Report and Written Opinion for PCT/US2014/042300, dated Oct. 20, 2014, 16 pages.
International Search Report and Written Opinion for PCT/US2014/042393, dated Oct. 20, 2014, 15 pages.
International Search Report for PCT/US2009/046644, dated Mar. 2, 2010, 7 pages.
International Preliminary Report on Patentability for PCT/US2009/046644, dated Dec. 6, 2010, 10 pages.
International Search Report for PCT/US2012/033789, dated Sep. 6, 2012, 4 pages.
International Search Report for PCT/US2012/041971, dated Dec. 7, 2012, 5 pages.
International Search Report for PCT/US2012/049524, dated Jan. 3, 2013, 3 pages.
Non-Final Office Action for U.S. Appl. No. 13/566,481, dated Aug. 7, 2015, 27 pages.
Non-Final Office Action for U.S. Appl. No. 13/493,983, dated Feb. 5, 2014, 11 pages.
Final Office Action for U.S. Appl. No. 13/493,983, dated Oct. 31, 2014, 12 pages.
Non-Final Office Action for U.S. Appl. No. 13/448,005, dated Sep. 11, 2014, 20 pages.
Non-Final Office Action for U.S. Appl. No. 13/448,005, dated Apr. 15, 2015, 22 pages.
Non-Final Office Action for U.S. Appl. No. 12/480,493, dated Jul. 16, 2012, 24 pages.
Notice of Allowance and Examiner-Initiated Interview Summary for U.S. Appl. No. 12/480,493, dated Jun. 20, 2013, 13 pages.
Non-Final Office Action for U.S. Appl. No. 13/896,029, dated Sep. 18, 2015, 16 pages.
Non-Final Office Action for U.S. Appl. No. 13/871,944, dated Oct. 16, 2015, 13 pages.
Non-Final Office Action for U.S. Appl. No. 13/888,102, dated Jul. 9, 2015, 18 pages.
Search Report for Japanese Patent Application No. 2011-512749, search date Aug. 14, 2013, 29 pages.
Office Action for Japanese Patent Application No. 2011-512749, drafting date Sep. 4, 2013, 7 pages.
International Preliminary Report on Patentability for PCT/US2014/041396, dated Dec. 17, 2015, 8 pages.
International Preliminary Report on Patentability for PCT/US2014/042300, dated Dec. 23, 2015, 9 pages.
International Preliminary Report on Patentability for PCT/US2014/042393, dated Dec. 23, 2015, 11 pages.
Office Action for Canadian Patent Application No. 2,727,034, dated Nov. 26, 2015, 4 pages.
Decision of Final Rejection for Japanese Patent Application No. 2014-119504, dated Nov. 10, 2015, 5 pages.
Translation of Decision to Grant for Japanese Patent Application No. 2014-119505, dated Dec. 15, 2015, 3 pages.
Office Action for Cuban Patent Application No. 2015-0088, dated Oct. 30, 2015, 3 pages.
Final Office Action for U.S. Appl. No. 13/888,102, dated Dec. 24, 2015, 18 pages.
Non-Final Office Action for U.S. Appl. No. 13/911,849, dated Nov. 24, 2015, 15 pages.
Sendin, Alberto, et al., "Enhanced Operation of Electricity Distribution Grids Through Smart Metering PLC Network Monitoring, Analysis and Grid Conditioning," Energies, vol. 6, Issue 1, Jan. 21, 2013, www.mdpi.com/journal/energies, pp. 539-556.
Colson, C.M., "Algorithms for Distributed Decision-Making for Multi-agent Microgrid Power Management," IEEE Power and Energy Society General Meeting, Jul. 24-29, 2011, San Diego, California, IEEE, pp. 1-8.
Wetula, Andrzej, "A Hilbert Transform Based Algorithm for Detection of a Complex Envelope of a Power Grid Signals—an Implementation," Journal of Electrical Power Quality and Utilisation, vol. 14, Issue 2, 2008, EPQU Journal, pp. 13-18.
Partial Supplementary European Search Report for European Patent Application No. 14754343.3, dated Feb. 8, 2016, 5 pages.
Extended European Search Report for European Patent Application No. 14754343.3, dated May 24, 2016, 12 pages.
Examination Report for European Patent Application No. 09759619.1, dated May 13, 2016, 7 pages.
Notice of Allowance and Examiner Initiated Interview Summary for U.S. Appl. No. 13/911,849, dated Apr. 5, 2016, 10 pages.
Corrected Notice of Allowance for U.S. Appl. No. 13/911,849, dated May 31, 2016, 4 pages.
Non-Final Office Action for U.S. Appl. No. 14/304,035, dated Feb. 25, 2016, 22 pages.
Final Office Action for U.S. Appl. No. 13/448,005, dated Jun. 6, 2016, 11 pages.
Non-Final Office Action for U.S. Appl. No. 14/720,780, dated Feb. 26, 2016, 7 pages.
Notice of Allowance for U.S. Appl. No. 13/566,481, dated Feb. 26, 2016, 7 pages.
International Search Report and Written Opinion for International Patent Application No. PCT/US2015/058423, dated Jan. 19, 2016, 12 pages.
International Search Report and Written Opinion for International Patent Application No. PCT/US2015/058492, dated Feb. 26, 2016, 18 pages.
International Search Report and Written Opinion for International Patent Application No. PCT/US2015/063752, dated Mar. 24, 2016, 16 pages.
International Preliminary Report on Patentability for International Patent Application No. PCT/US2012/33789, dated Oct. 24, 2013, 10 pages.
International Preliminary Report on Patentability for PCT/US2012/041971, dated Dec. 10, 2013, 6 pages.
International Preliminary Report on Patentability for PCT/US2012/049524, dated Feb. 4, 2014, 7 pages.

(56) References Cited

OTHER PUBLICATIONS

Final Office Action for U.S. Appl. No. 13/896,029, dated Jun. 22, 2016, 22 pages.
Final Office Action for U.S. Appl. No. 14/304,035, dated Aug. 26, 2016, 18 pages.
Final Office Action for U.S. Appl. No. 14/720,780, dated Sep. 1, 2016, 9 pages.
Partial Supplementary European Search Report for European Patent Application No. 14754339.1, dated Oct. 1, 2016, 6 pages.
European Search Report for European Patent Application No. 147543433, dated Jun. 10, 2016, 1 page.
Partial Supplementary European Search Report for European Patent Application No. 14754714.5, dated Oct. 5, 2016, 6 pages.
Non-Final Office Action for U.S. Appl. No. 13/896,029, dated Nov. 10, 2016, 18 pages.
Notice of Allowance for U.S. Appl. No. 13/871,944, dated Oct. 4, 2016, 9 pages.
Non-Final Office Action for U.S. Appl. No. 14/304,648, dated Sep. 7, 2016, 4 pages.
Notice of Allowance for U.S. Appl. No. 14/720,780, dated Nov. 4, 2016, 5 pages.
First Office Action for Chilean Patent Application No. 2325-2015, dated Jan. 26, 2017, 11 pages.
Extended European Search Report for European Patent Application No. 14754339.1, dated Jan. 16, 2017, 10 pages.
First Office Action for Chilean Patent Application No. 2323-2015, dated Jan. 26, 2017, 13 pages.
Office Action No. 13556 for Colombian Patent Application No. 15-222367, dated Nov. 28, 2016, 13 pages.
Examination Report No. 1 for Australian Patent Application No. 2014219244, dated Dec. 21, 2016, 4 pages.
First Office Action for Chilean Patent Application No. 2322-2015, dated Jan. 26, 2017, 13 pages.
Extended European Search Report for European Patent Application No. 14754714.5, dated Jan. 16, 2017, 10 pages.
Extended European Search Report for European Patent Application No. 14808081.5, dated Jan. 30, 2017, 7 pages.
Extended European Search Report for European Patent Application No. 14810273.4, dated Feb. 1, 2017, 12 pages.
Extended European Search Report for European Patent Application No. 14811042.2, dated Jan. 2, 2017, 7 pages.
Examination Report No. 1 for Australian Patent Application No. 2014219246, dated Dec. 22, 2016, 3 pages.
Advisory Action for U.S. Appl. No. 14/304,035, dated Nov. 30, 2016, 3 pages.
Office Action No. 11851, Colombian Patent Application No. 15-222367, dated Mar. 17, 2017, 19 pages.
First Office Action for Chinese Patent Application No. 201480032631.X, dated Feb. 27, 2017, 5 pages.
First Office Action for Chinese Patent Application No. 201480034010.5, dated Feb. 17, 2017, 7 pages.
Final Office Action for U.S. Appl. No. 14/304,648, dated Mar. 9, 2017, 7 pages.
Non-Final Office Action for U.S. Appl. No. 15/184,642, dated Mar. 9, 2017, 5 pages.
Yan, Ping et al., "Study of Linear Models in Steady State Load Flow Analysis of Power Systems," IEEE Power Engineering Society Winter Meeting, vol. 1, Jan. 27-31, 2002, New York, NY, IEEE, pp. 666-671.
Translated Summary of Office Action No. 4963 for Columbian Patent Application No. 15-222371, dated Apr. 5, 2017, 3 pages.
International Preliminary Report on Patentability for International Patent Application No. PCT/US2015/058423, dated May 11, 2017, 8 pages.
International Preliminary Report on Patentability for International Patent Application No. PCT/US2015/058492, dated May 11, 2017, 10 pages.
Non-Final Office Action for U.S. Appl. No. 14/304,035, dated May 17, 2017, 22 pages.
Final Office Action for U.S. Appl. No. 14/304,648, dated May 19, 2017, 7 pages.
Advisory Action for U.S. Appl. No. 14/304,648, dated May 24, 2017, 3 pages.
Non-Final Office Action for U.S. Appl. No. 14/928,783, dated May 8, 2017, 16 pages.
Examination Report No. 1 for Australian Patent Application No. 2014219247, dated Apr. 26, 2017, 4 pages.
Second Office Action for Chilean Patent Application No. 2323-2015, dated May 17, 2017, 14 pages.
Second Office Action for Chilean Patent Application No. 2322-2015, dated May 17, 2017, 13 pages.
First Office Action for Chinese Patent Application No. 201480009549.5, dated May 31, 2017, 9 pages.
Examination Report No. 1 for Australian Patent Application No. 2014277951, dated Jun. 8, 2017, 4 pages.
Office Action Summary for Columbian Patent Application No. 7058, dated Jun. 16, 2017, 2 pages.
International Preliminary Report on Patentability for International Patent Application No. PCT/US2015/063752, dated Jun. 15, 2017, 12 pages.
Non-Final Office Action for U.S. Appl. No. 13/871,944, dated Jun. 15, 2017, 14 pages.
First Office Action for Chinese Patent Application No. 201480009551.2, dated Jun. 19, 2017, 9 pages.
Extended European Search Report for European Patent Application No. 17173049.2, dated Aug. 11, 2017, 8 pages.
Examination report No. 1 for Australian Patent Application No. 2014277983, dated Jun. 16, 2017, 4 pages.
Non-Final Office Action for U.S. Appl. No. 13/896,029, dated Jul. 20, 2017, 17 pages.
Advisory Action for U.S. Appl. No. 14/304,648, dated Aug. 17, 2017, 3 pages.
Notice of Allowance for U.S. Appl. No. 15/184,642, dated Jul. 13, 2017, 8 pages.
Notice of Allowance for U.S. Appl. No. 15/184,642, dated Jul. 27, 2017, 4 pages.
Notice of Allowance for U.S. Appl. No. 14/929,087, dated Aug. 15, 2017, 9 pages.
Second Office Action for Chinese Patent Application No. 201480032631.X, dated Sep. 4, 2017, 5 pages.
Second Office Action for Chinese Patent Application No. 201480034010.5, dated Aug. 2, 2017, 5 pages.
Final Office Action for U.S. Appl. No. 14/304,035, dated Oct. 5, 2017, 16 pages.
Final Office Action for U.S. Appl. No. 13/896,029, dated Jan. 24, 2018, 22 pages.
Notice of Allowance for U.S. Appl. No. 13/871,944, dated Feb. 23, 2018, 18 pages.
Notice of Allowance for U.S. Appl. No. 14/304,035, dated Feb. 7, 2018, 9 pages.
Corrected Notice of Allowance for U.S. Appl. No. 14/928,783, dated Jan. 23, 2018, 6 pages.
Corrected Notice of Allowance for U.S. Appl. No. 14/928,783, dated Feb. 15, 2018, 6 pages.
Notice of Allowance for U.S. Appl. No. 15/852,496, dated Mar. 8, 2018, 9 pages.
Non-Final Office Action for U.S. Appl. No. 14/958,385, dated Jan. 12, 2018, 33 pages.
Notice of Allowance for U.S. Appl. No. 14/928,783, dated Nov. 6, 2017, 9 pages.
Advisory Action for U.S. Appl. No. 14/304,035, dated Dec. 29, 2017, 3 pages.
Supplemental Notice of Allowability for U.S. Appl. No. 14/304,035, dated Apr. 18, 2018, 6 pages.
Non-Final Office Action for U.S. Appl. No. 15/934,499, dated May 7, 2018, 30 pages.
Non-Final Office Action for U.S. Appl. No. 15/257,191, dated Apr. 4, 2018, 10 pages.
Non-Final Office Action for U.S. Appl. No. 15/450,153, dated Apr. 19, 2018, 10 pages.
Notice of Allowance for U.S. Appl. No. 14/928,783, dated May 9, 2018, 9 pages.

(56) References Cited

OTHER PUBLICATIONS

Interview Summary fo rU.S. Appl. No. 14/958,385, dated Apr. 6, 2018, 3 pages.
International Telecommunications Union, "ITU-T G.9960, Series G: Transmission Systems and Media, Digital Systems and Networks," Dec. 1, 2011, 160 pages.
International Telecommunications Union, "Updated draft text for ITU-T G.9961, Series G: Transmission Systems and Media, Digital Systems and Networks—Amendment 1 Corrigendum 1," ITU-T: Telecommunication Standardization Sector, Study Group 15, Amendment approved Sep. 21, 2012, 82 pages.
International Telecommunications Union, "ITU-T G.9961, Series G: Transmission Systems and Media, Digital Systems and Networks," Apr. 1, 2014, 306 pages.
First Office Action for Chinese Patent Application No. 201480009550.8, dated Jan. 26, 2018, 4 pages.
Decision to Grant a Patent for Japanese Patent Application No. 2015-558888, dated Jan. 30, 2018, 4 pages.
Notice of Reasons for Rejection for Japanese Patent Application No. 2015-558889, dated Jan. 23, 2018, 7 pages.
Extended European Search Report for European Patent Application No. 17203296.3, dated Feb. 15, 2018, 8 pages.
Second Office Action for Chinese Patent Application No. 201480009549.5, dated Jan. 23, 2018, 4 pages.
Notice of Reasons for Rejection for Japanese Patent Application No. 2015-558887, dated Jan. 23, 2018, 7 pages.
Notice of Reasons for Rejection for Japanese Patent Application No. 2016-518052, dated Feb. 20, 2018, 8 pages.
Third Office Action for Chinese Patent Application No. 201480034010.5, dated Jan. 17, 2018, 4 pages.
Notice of Reasons for Rejection for Japanese Patent Application No. 2016-519694, dated Feb. 27, 2018, 11 pages.
First Examination Report for Indian Patent Application No. 13/CHENP/2011, dated Jan. 11, 2018, 6 pages.
Office Action for Canadian Patent Application No. 2,870,452, dated Dec. 28, 2017, 4 pages.
Office Action for Canadian Patent Application No. 2,874,132, dated Jan. 25, 2018, 3 pages.
Extended European Search Report for European Patent Application No. 15853935.3, dated Feb. 15, 2018, 10 pages.
Extended European Search Report for European Patent Application No. 15855864.3, dated Feb. 21, 2018, 9 pages.
Extended European Search Report for European Patent Application No. 18152637.7, dated Apr. 26, 2018, 8 pages.
Notice of Acceptance for Australian Patent Application No. 2014219247, dated Apr. 11, 2018, 3 pages.
Second Examination Report for Australian Patent Application No. 2014277983, dated Mar. 15, 2018, 4 pages.
Second Official Action for Mexican Patent Application No. MX/a/2015/017231, dated Feb. 28, 2018, 5 pages.
Notice of Acceptance for Australian Patent Application No. 2014277951, dated Mar. 28, 2018, 3 pages.
Extended European Search Report for European Patent Application No. 15865305.5, dated May 3, 2018, 8 pages.
Office Action for Colombian Patent Application No. 15222371, dated Oct. 15, 2017, 9 pages.
First Office Action for Chinese Patent Application No. 201480034011.X, dated Oct. 30, 2017, 16 pages.
Notice of Acceptance for Australian Patent Application No. 2014219246, dated Dec. 5, 2017, 3 pages.
Office Action for Mexican Patent Application No. MX/a/2015/017231, dated Oct. 20, 2017, 13 pages.
Berger, L T., et al., "Power Line Communications for Smart Grid Applications," Journal of Electrical and Computer Engineering, vol. 2013, Article ID 712376, Accepted Dec. 29, 2012, 16 pages.
Hauser, C. H., et al., "A Failure to Communicate: Next Generation Communication Requirements, Technologies, and Architecture for the Electric Power Grid," IEEE Power and Energy Magazine, vol. 3, Issue 2, Mar.-Apr. 2005, pp. 47-55.
Kang, J.-M., et al., "Design and Implementation of Network Management System for Power Line Communication Network," 2007 IEEE International Symposium on Power Line Communications and Its Adaptations, Mar. 26-28, 2007, Pisa, Italy, pp. 23-28.
Kim, Y., et al., "PLC technology of KEPCO," 2005 International Symposium on Power Line Communications and Its Applications, Apr. 6-8, 2005, Vancouver, British Columbia, Canada, pp. 390-393.
Papadopoulos, T. A., et al., Low-Voltage Distribution Line Performance Evaluation for PLC Signal Transmission, IEEE Transactions on Power Delivery, vol. 23, Issue 4, Oct. 2008, pp. 1903-1910.
Non-Final Office Action for U.S. Appl. No. 15/078,646, dated Jun. 15, 2018, 33 pages.
Supplemental Notice of Allowability for U.S. Appl. No. 14/304,035, dated May 24, 2018, 6 pages.
Non-Final Office Action for U.S. Appl. No. 14/304,648, dated Jun. 13, 2018, 13 pages.
Corrected Notice of Allowance for U.S. Appl. No. 14/928,783, dated Jun. 8, 2018, 6 pages.
Corrected Notice of Allowability for U.S. Appl. No. 14/928,783, dated Jul. 30, 2018, 6 pages.
Final Office Action for U.S. Appl. No. 14/958,385, dated Jul. 26, 2018, 21 pages.
Corrected Notice of Allowability for U.S. Appl. No. 14/928,783, dated Aug. 10, 2018, 6 pages.
First Substantive Report for Chilean Patent Application No. 201701036, dated Jul. 20, 2018, 17 pages.
Second Substantive Report for Chilean Patent Application No. 201701038, dated Sep. 3, 2018, 28 pages.
Second Substantive Report for Chilean Patent Application No. 201701394, dated Sep. 12, 2018, 10 pages.
Examination Report No. 1 for Australian Patent Application No. 2017279752, dated Sep. 18, 2018, 6 pages.
Advisory Action for U.S. Appl. No. 14/958,385, dated Sep. 26, 2018, 3 pages.
Non-Final Office Action for U.S. Appl. No. 13/896,029, dated Oct. 2, 2018, 19 pages.
First Official Action for Mexican Patent Application No. MX/a/2017/005506, dated Jun. 8, 2018, 6 pages.
First Official Action for Mexican Patent Application No. MX/a/2017/005005, dated May 30, 2018, 4 pages.
First Official Action for Mexican Patent Application No. MX/a/2017/006836, dated Jun. 1, 2018, 6 pages.
Official Action No. 5493 for Colombian Patent Application No. NC2017/0010584, dated May 4, 2018, 35 pages.
First Official Action for Mexican Patent Application No. MX/a/2015/017227, dated Apr. 11, 2018, 6 pages.
Notice of Acceptance for Australian Patent Application No. 2014277983, dated Jun. 25, 2018, 3 pages.
Notification of Reasons for Refusal for Japanese Patent Application No. 2016-519676, dated Jun. 12, 2018, 7 pages.
Final Office Action for U.S. Appl. No. 15/450,153, dated Nov. 28, 2018, 7 pages.
Final Office Action for U.S. Appl. No. 15/934,499, dated Nov. 19, 2018, 34 pages.
Final Office Action for U.S. Appl. No. 14/304,648, dated Nov. 29, 2018, 12 pages.
Final Office Action for U.S. Appl. No. 15/257,191, dated Nov. 2, 2018, 10 pages.
Office Action for Canadian Patent Application No. 2,874,132, dated Jan. 3, 2019, 3 pages.
Second Official Action for Mexican Patent Application No. MX/a/2017/006836, dated Dec. 6, 2018, 8 pages.
Official Action for Mexican Patent Application No. MX/a/2015/016809, dated Jan. 14, 2019, 4 pages.
Notice of Not Fully Responsive Reply for Applications Under Accelerated Examination for U.S. Appl. No. 15/078,646, dated Jan. 24, 2019, 8 pages.
Advisory Action and AFCP 2.0 Decision for U.S. Appl. No. 15/934,499, dated Jan. 30, 2019, 4 pages.
Decision to Grant for Japanese Patent Application No. 2016-519676, dated Apr. 16, 2019, 4 pages.
Examination Report No. 1 for Australian Patent Application No. 2015358448, dated May 6, 2019, 3 pages.

(56) References Cited

OTHER PUBLICATIONS

Third Official Action for Mexican Patent Application No. MX/a/2017/006836, dated Jun. 4, 2019, 7 pages.
Examiner's Report for Canadian Patent Application No. 2,870,452, dated Oct. 2, 2018, 4 pages.
Examination Report for European Patent Application No. 15853935.3, dated Oct. 22, 2018, 5 pages.
Official Action for Mexican Patent Application No. Mx/a/2015/010689, dated Jan. 25, 2019, 6 pages.
Official Action for Mexican Patent Application No. MX/a/2015/010688, dated Jan. 25, 2019, 8 pages.
Examination Report for Australian Patent Application No. 2014274664, dated Feb. 15, 2019, 2 pages.
Examination Report for European Patent Application No. 14810273.4, dated Mar. 21, 2019, 11 pages.
First Office Action for Chinese Patent Application No. 201580059331.5, dated Mar. 5, 2019, 11 pages.
Notice of Acceptance for Australian Patent Application No. 2017279752, dated Apr. 12, 2019, 3 pages.
Examination Report for Australian Patent Application No. 2015338943, dated Apr. 5, 2019, 3 pages.
Non-Final Office Action for U.S. Appl. No. 14/958,385, dated Mar. 18, 2019, 24 pages.
Final Office Action for U.S. Appl. No. 13/896,029, dated Jun. 14, 2019, 21 pages.
Non-Final Office Action for U.S. Appl. No. 14/304,648, dated Apr. 29, 2019, 14 pages.
Applicant-Initiated Interview Summary for U.S. Appl. No. 14/958,385, dated Jun. 11, 2019, 6 pages.
Applicant-Initiated Interview Summary for U.S. Appl. No. 14/958,385, dated Jun. 12, 2019, 5 pages.
Karl, M. et al., "Selection of an Optimal Modulation Scheme for Digital Communications over Low Voltage Power Lines," Proceedings of ISSSTA'95, International Symposium on Spread Spectrum Techniques and Applications, Sep. 1996, Mainz, Germany, IEEE, pp. 1087-1091.
Pimentel, P.R.S. et al., "Revolution in the Distribution (Use of the technology Power Line Communication in the transmission of Data, Voice, and Images," 2004 IEEE/PES Transmission & Distribution Conference & Exposition: Latin America, Nov. 8-11, 2004, Sao Paulo, Brazil, IEEE, pp. 314-320.
Notice of Acceptance for Australian Patent Application No. 2014274664, dated Sep. 2, 2019, 8 pages.
Examination Report No. 1 for Australian Patent Application No. 2018203997, dated Aug. 2, 2019, 4 pages.
Summons to Attend Oral Proceedings for European Patent Application No. 09759619.1, mailed Jun. 26, 2019, 8 pages.
Notice of Allowance for U.S. Appl. No. 15/078,646, dated Jul. 17, 2019, 11 pages.
Final Office Action for U.S. Appl. No. 14/958,385, dated Aug. 23, 2019, 30 pages.
Feng, Yang, "Solving for the Low-Voltage/Large-Angle Power-Flow Solutions by Using the Holomorphic Embedding Method," Doctoral Dissertation, Arizona State University, Aug. 2015, 220 pages.
Xu, Dan, et al., "Project 32: Optimal Topology Discovery for Automatic Meter Reading Using Powerline Carrier," Part 4 Project Final Report, Department of Electrical and Electronic Engineering, University of Auckland, New Zealand, 2003, 53 pages.
Non-Final Office Action for U.S. Appl. No. 15/395,656, dated Sep. 16, 2019, 14 pages.
Notice of Allowance for U.S. Appl. No. 15/934,499, dated Sep. 25, 2019, 12 pages.
Notice of Acceptance for Australian Patent Application No. 2015338943, dated Aug. 29, 2019, 9 pages.
Notice of Acceptance for Australian Patent Application No. 2015358448, dated Sep. 19, 2019, 10 pages.
Supplemental Notice of Allowability for U.S. Appl. No. 15/934,499, dated Oct. 23, 2019, 6 pages.
Final Office Action for U.S. Appl. No. 14/304,648, dated Oct. 2, 2019, 15 pages.
Office Action for Canadian Patent Application No. 2,909,483, dated Nov. 22, 2019, 6 pages.
Office Action for Canadian Patent Application No. 2,901,607, dated Nov. 19, 2019, 4 pages.
First Office Action for Chinese Patent Application No. 201580064834.1, dated Nov. 4, 2019, 11 pages.
Fourth Official Action for Mexican Patent Application No. MX/a/2017/006836, dated Nov. 8, 2019, 9 pages.

\* cited by examiner (background)

(background)

(background)

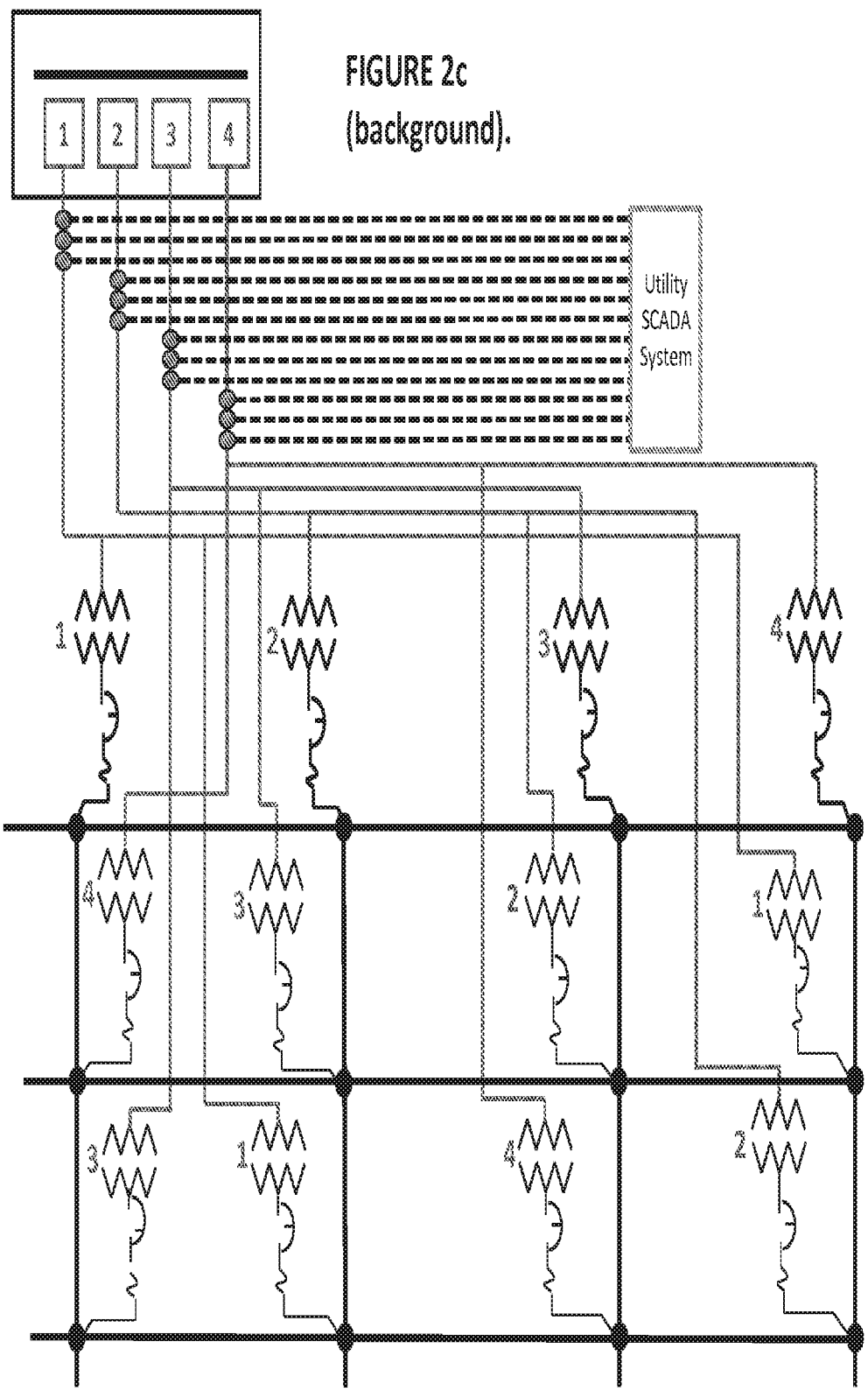
FIGURE 2c (background).

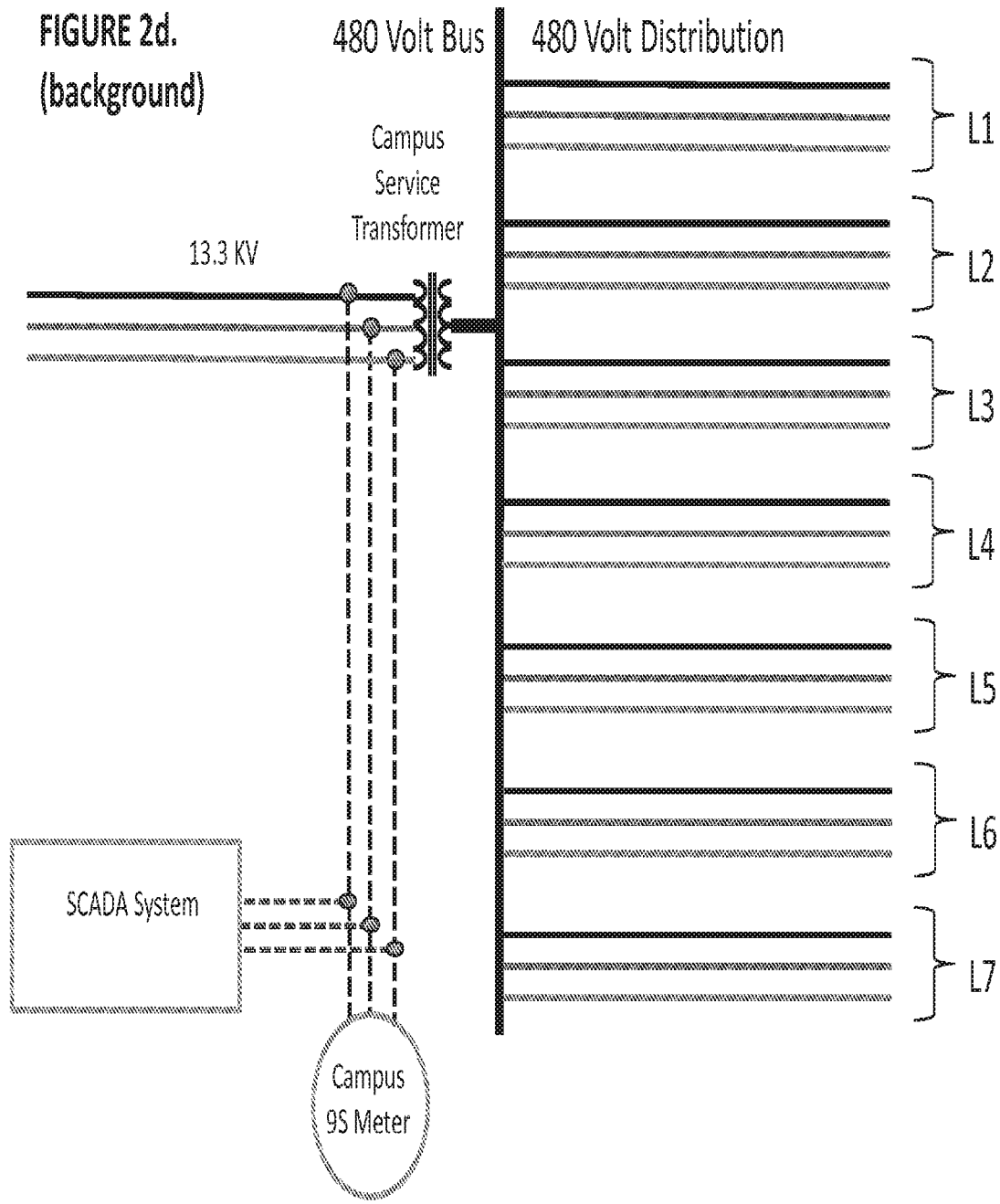

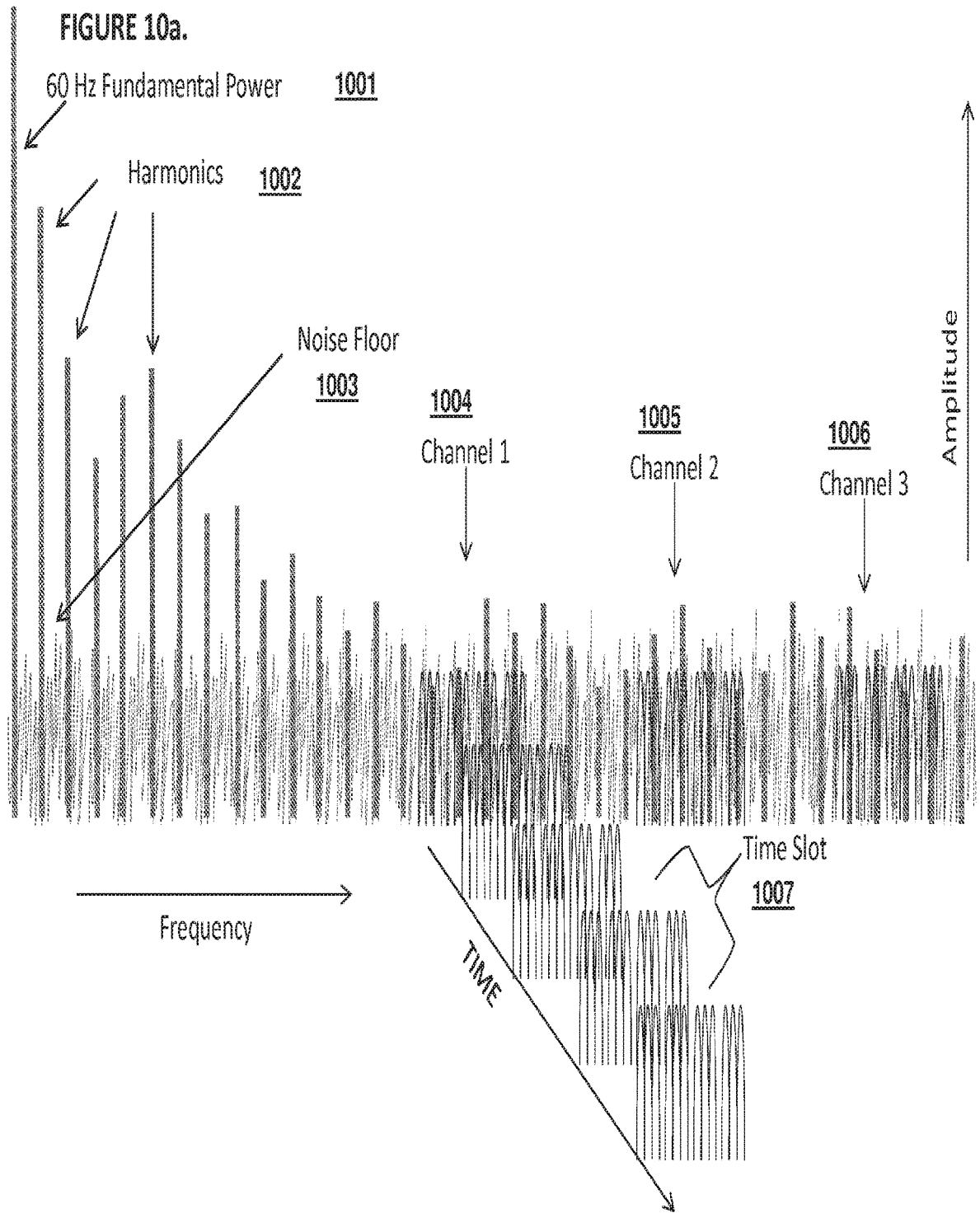

HR n = Message from Remote Hub "n"

Not to scale. Field lengths and interleaving of Data and FEC bits are not precise and intended for illustrative purposes.

Not to scale. Field lengths and interleaving of Data and FEC bits are not precise and intended for illustrative purposes.

Avoiding collision on Alert channel using Multiple Chips
HR n = Message from Remote Hub "n"

SYSTEM AND METHOD FOR INFERRING SCHEMATIC AND TOPOLOGICAL PROPERTIES OF AN ELECTRICAL DISTRIBUTION GRID

RELATED APPLICATIONS

This application is a continuation of co-pending U.S. patent application Ser. No. 13/871,944, filed on Apr. 26, 2013, entitled "SYSTEM AND METHOD FOR INFERRING SCHEMATIC AND TOPOLOGICAL PROPERTIES OF AN ELECTRICAL DISTRIBUTION GRID," which claims the benefit of U.S. Provisional Application No. 61/779,222, filed on Mar. 13, 2013, entitled "SYSTEM AND METHOD FOR INFERRING SCHEMATIC AND TOPOLOGICAL PROPERTIES OF AN ELECTRICAL DISTRIBUTION GRID" and U.S. Provisional Application No. 61/766,551, filed on Feb. 19, 2013, entitled "SYSTEM AND METHOD FOR INFERRING SCHEMATIC AND TOPOLOGICAL PROPERTIES OF AN ELECTRICAL DISTRIBUTION GRID," the disclosures of each of which are hereby incorporated herein by reference in their entireties.

FIELD OF THE INVENTION

The present invention is directed toward employing the electrical distribution grid as a short and long-range transmission medium and data-bearing network, and further toward the use of signals and messages on the network for the purpose of inferring schematic and topological properties of the distribution grid, which vary over time.

BACKGROUND OF THE INVENTION

The power grid is generally considered to be composed of two logical regions, the Transmission Grid(s) and the Distribution Grid(s). The Transmission Grid originates at large generation points such as hydroelectric dams, nuclear reactors, wind farms, and coal-fired or gas-fired power plants. Power from the generation point is transmitted as high-voltage alternating current (AC) over a loosely connected network of long, high-voltage lines to points where demand for power exists, such as factories, farms, and population centers. At the edges of the Transmission Grid there is a collection of Distribution Substations. Distribution Substations contain one or more Substation Transformers, which step down the voltage from high transmission line levels (typically 130 kV to 700 kV) to the medium voltage levels (typically from 4 kV to about 35 kV) at which power is distributed to consumers within a distribution service area. At the edge of the Distribution Grid are a number of Service Transformers, which transform the medium voltage of the distribution grid to the low voltages (in the US, typically 120V, 208V, 240V, 277V, or 480V). Other voltages in addition to some of these can be used elsewhere in the world. In some cases, a tier of one or more transformers, called step-down transformers, lying schematically between the Substation Transformers and the Service Transformers, create intermediate voltage reductions between the Substation and the Service Transformers. Each Service Transformer powers one or more metered loads. A load can be a dwelling, a commercial or industrial building, an element of municipal infrastructure such as a series of street lamps, or agricultural apparatus such as irrigation systems. A typical distribution grid includes other elements used to balance and regulate the flow of power. Examples of such elements are capacitor banks, voltage regulators, switches, and reclosers. FIG. 1 illustrates a typical segment of the power grid.

Distribution grids have been designed and deployed in a variety of topological configurations. In the United States, distribution grid types are typically characterized as radial, loop, or networked. Other emerging cases are the campus grid and the microgrid. Additional topologies, not described, are used elsewhere in the world.

FIG. 2a is a topological schematic of a typical radial grid. In a radial grid, a substation has one or more substation transformers. Each substation transformer has one or more substation busses. One or more three-phase feeders "radiate" outward from each substation bus, with single-phase, double-phase, or three-phase lateral lines branching off from the feeders, and tap-off points (or simply "taps") in turn branching from the laterals. Radial grids are inexpensive to design and build because they are simple, but they are most vulnerable to outages because they lack redundant power paths, so that any break causes at least one load to lose power.

FIG. 2b is a topological schematic of a typical loop distribution grid. In a loop grid, each end of select feeders is attached to a power source such as a bus of a substation transformer. If the loop is undamaged, then power is available at all loads if either substation transformer is operational. If there is a break in the loop, then power is available at all loads assuming that both transformers are operational. In normal circumstances, a system of switches is used to ensure that only one substation transformer at a time is delivering power to each segment of the grid.

FIG. 2c is a topological schematic of a typical networked grid. This topology has maximum redundancy. In addition to employing multiple power sources, all the service transformers are linked to one another on the secondary side in a mesh arrangement. Multiple breaks in connectivity are required to cause a power outage at any point. Networked grids are most expensive to build and maintain, and are typically used in major urban areas such as Manhattan or Washington, D.C. where high-value, high-criticality loads are concentrated together.

FIG. 2d shows a microgrid or campus network. Microgrids are not traditional in electrical distribution technology, but are emerging as a response to increased focus on energy conservation and on distributed generation of energy from renewable sources. Many variations are possible. This type of grid is typically attached to, but severable from, a wider distribution grid, and may contain its own power sources such as windmills, solar panels, or rechargeable storage batteries as well as loads. The entire network may employ low-voltage lines.

A distribution substation receives high-voltage power from the transmission grid into one or more large power transformers. A distribution transformer may incorporate a type of regulator called a load-tap changer, which alters the voltage the transformer delivers to a power distribution bus (the substation bus) by including or excluding some turns of the secondary winding circuit of the transformer, thereby changing the ratio of input to output voltage. One or more feeders depend from the substation bus. If too many feeders are required, additional transformers and busses are used.

In order to monitor and control the components of the grid, current transformers (CTs) or other current sensors such as Hall-effect sensors are attached to power-bearing conductors within the substation. The CTs output a low current on a looped conductor which is accurately proportional to the current delivered at the high voltage conductor being monitored. These low-current outputs are suitable for connecting to data acquisition subsystems associated with Supervisory Control and Data Acquisition (SCADA) systems in the substation. Primary monitoring CTs are designed and built into the substation, because changing or adding CTs to the high-voltage components is impossible or dangerous while current is flowing. On the other hand, additional CTs may be safely added to the low-current SCADA loops as needed without impacting power delivery.

In addition to the power lines themselves, the distribution grid contains numerous other devices intended to regulate, isolate, stabilize, and divert the flow of power. These devices include switches, reclosers, capacitor banks (usually for power factor correction), and secondary voltage regulators. All these devices affect the behavior of the distribution grid when considered as a data-bearing network, as do the various loads and secondary power sources on the grid. Devices that have abrupt state changes will introduce impulse noise on the grid, as can loads turning on and off. Some devices, such as transformers and capacitor banks, filter and attenuate signals at certain frequencies.

Other than the wires connecting a consumer load and the associated meter to a service transformer, the service transformer is the outermost element of the distribution grid before the power is actually delivered to a consumer. The meter is attached at the point where the power from the service transformer is delivered to the consumer. Service transformers can be three-phase, dual-phase, or single phase, as can meters.

Traditionally, reading meters was one of the largest operational costs incurred by electrical utilities. Original electric meters were analog devices with an optical read-out that had to be manually examined monthly to drive the utility billing process. Beginning in the 1970s, mechanisms for digitizing meter data and automating its collection began to be deployed. These mechanisms evolved from walk-by or drive-by systems where the meter would broadcast its current reading using a short-range radio signal, which was received by a device carried by the meter reader. These early systems were known as Automated Meter Reading systems or AMRs. Later, a variety of purpose-built data collection networks, employing a combination of short-range RF repeaters in a mesh configuration with collection points equipped with broadband backhaul means for transporting aggregated readings began to be deployed.

These networks were capable of two-way communication between the "metering head-end" at a utility service center and the meters at the edge of this data collection network, which is generally called the Advanced Metering Infrastructure or AMI. AMIs can collect and store readings frequently, typically as often as every 15 minutes, and can report them nearly that often. They can read any meter on demand provided that this feature is used sparingly, and can connect or disconnect any meter on demand as well. AMI meters can pass signals to consumer devices for the purpose of energy conservation, demand management, and variable-rate billing. Because the AMI network is separate from the power distribution grid, AMI meters are neither aware of nor sensitive to changes in the grid topology or certain conditions on the grid. Nonetheless, the introduction of AMI is generally considered to be the beginning of the Smart Grid.

Many characteristics of the electrical distribution infrastructure have limited the success of efforts to use the grid itself as a communications medium. First, the grid is a noisy environment. As already noted, state changes in loads on the grid as well as control and regulation artifacts on the grid itself cause impulse noise on the power line. Normal operation of loads like electrical motors, simple variations in the overall load, and ambient RF noise (chiefly from lightening and other weather-related causes) add up to significant Gaussian noise. The measured noise floor at a typical substation in the United States sits at about 80-90 dB below the maximum amplitude of the 60 Hz fundamental. The complex impedance of the grid varies across both the frequency and time domains. This may lead to loss of signal at a receiver sited at a higher voltage point on the grid when impedance increases, or alternately force the transmitter to use more energy than would be necessary on the average. Capacitor banks sited at points along the grid for the purpose of optimizing the power factor can cause signal attenuation. Most significantly, transformers act as low-pass filters, dramatically attenuating signals above a certain frequency. The threshold frequency is not the same on every distribution grid, because different arrangements and types of transformers are employed and because the transformers themselves are not deliberately tuned to filter at a specified frequency. All these variables impact the frequency response of the medium.

Additionally, injecting modulated current signals on the grid may cause interference between the injected signals themselves. One problematic phenomenon is crosstalk, where a signal injected on one power line is detectable on another line. When crosstalk occurs on two or more phases of the same feeder, it can be caused by inductive and capacitive coupling, as the phase lines run alongside one another for most of the length of the feeder. Crosstalk may also be due to multiple phase windings on the same transformer core. Feeder-to-feeder crosstalk has also been measured, and may be caused by reflection of the injected signal off the power bus at the substation. Given the complexity, diversity, and age of the distribution grids in the United States and the world, less is known about these phenomena than might be expected.

Finally, using the distribution grid as a communications medium often has side effects which interfere with the primary purpose of the grid, which of course is delivering clean, reliable power to consumers. If devices under power resonate with an injected current, a phenomenon called flicker results. LED, CFL, incandescent and fluorescent lighting visibly flickers in response to certain frequencies. This is annoying and sometimes dangerous, as visual flicker has been demonstrated to cause both seizures and vertigo. Other types of devices, such as fans and speakers, also resonate at certain frequencies, causing an audible hum. ANSI/IEEE standard 519 requires any device (whether intended as a communication device or not) that injects current on the grid to avoid doing so at certain frequencies and amplitudes to avoid causing flicker. Specifically, ANSI/IEEE standard 519 requires that no noise be added to the odd harmonics of the fundamental at or below the eleventh harmonic.

Despite the many engineering difficulties inherent in using the power grid as a communications medium, it has remained attractive to electrical utilities because the utility already owns the infrastructure, and it is present at all the points where the utility needs to collect data. Further, the regulatory and cost structure of publicly owned utilities (POUs) strongly favors them using owned assets (which can be profitably purchased and maintained via service rate increases) as opposed to paying operating expenses to a third-party communications provider such as a telephone or cable provider.

High-frequency transmissions (above 1 MHz) are attractive because theoretically high data rates can be achieved. Such schemes, called BPL for Broadband over Power Lines, offer a potential theoretical bandwidth sufficient to deliver internet access to consumers via a gateway located in their electrical meter. In the early years of the twenty-first century, the Federal Communications Commission (FCC) in the U.S. actively promoted the concept of "Access BPL" as a means of delivering high-speed Internet access to rural American families. Long-range transmission of BPL signals, however, is impractical and expensive, because every transformer between the transmitter and the receiver must be fitted with a bypass or repeater mechanism, or the low-pass filtering characteristics of the transformer will block the signal. In the United States, where the number of consumers per service transformer tends to be very small—in rural areas often only one—the cost to implement BPL becomes prohibitive. Additionally, RF interference caused by BPL transmission has created opposition from aviation, commercial radio, amateur radio, and other sectors. The FCC has attempted to be supportive of BPL technology, but new compromise rules requiring BPL installations to be capable of notching out (avoiding) frequencies where interference is reported have increased the complexity of managing a BPL service. Several attempts at deploying BPL consumer services have been abandoned.

Under the umbrella name Power Line Communication or PLC, some medium-frequency power line protocols have been used with success for Smart Grid applications, especially in Europe (and other locales with European-style grid architectures), where the number of consumers per service transformer is much larger than in the United States. The two most commonly used medium-frequency PLC initiatives are PRIME and G3, both promoted by commercial alliances based in Europe. PRIME uses orthogonal frequency-division multiplexing (OFDM) at the physical layer, with 512 differential phase-shift keyed channels (DPSK). PRIME achieves data rates as high as 128.6 kbps, but is most reliable at 21.4 kbps. Its frequency range is 42-89 kHz. G3 uses a similar physical-layer combination of OFDM and DPSK, offering 256 channels between 35 and 91 k Hz with a data rate of 33.4 kbps. Both G3 and PRIME are still sharply attenuated by transformers, though in most cases a receiver located on the medium-voltage side of a service transformer can successfully read meter transmissions from low-voltage sites served by that transformer, provided that the receiver is sited close enough to the service transformer. For these reasons, Smart Grid technologies based on these protocols are common in Europe and Asia. PLC protocols are also well-adapted to short-range power-line applications such as arbitrating the charging of electric vehicles.

At the other end of the spectrum are ultra-low frequency systems, chiefly used for control systems because they have little data-bearing capacity. Audio Frequency Ripple Control (AFRC) systems are used mostly in rural areas for load management: to turn off high-consumption devices such as electric heaters and air conditioners during peak load times, or to control use of other constrained resources, such as automated farm irrigation systems. An AFRC transmitter sits on the high-voltage side of a substation or transmission transformer and may service multiple substations. AFRC data rates vary from 2 to 10 bits per second, and the maximum message length is about 100 bits. After such a transmission, the transmitter requires a long idle period before it can transmit again, with a maximum duty cycle on the order of 10%. AFRC systems cause obvious flicker, but not at a dangerous frequency. Because they are typically used in areas of low population density and transmissions are infrequent, the side effects are tolerated. AFRC is a broadcast technology operable from high voltage to low voltage and thus cannot be used for collecting meter data or other data about edge conditions, because that requires transmitting from low voltage to higher voltage.

Aclara®'s TWACS® technology operates by injecting pulses onto the power line when the fundamental power carrier crosses the zero point—twice per 50 Hz or 60 Hz cycle. This method operates either from substation to edge or edge to substation, and uses a polling protocol to avoid having one edge transmission interfere with another. It is slow because it is tied to the fundamental, and because of the polling architecture. It has been criticized by consumer groups for the amount of impulse and broadband noise it introduces onto the grid.

Landis+Gyr employs a low-cost, low-frequency edge transmitter originally developed by Hunt technologies, intended to operate in conjunction with AFRC to provide two-way communication over long distances on the grid. The data transmission method using this transmitter is cheap and reliable, but limited. It induces sympathetic current oscillations by connecting variable impedance to the power line. The data rate is low because the transmitter is dependent on a voltage relative to the power carrier, so that only a few pulses can be injected per 50 Hz or 60 Hz cycle. To achieve enough redundancy for detection at the receiver, the same signal must be repeated for several cycles, resulting in a data rate measurable in cycles per bit rather than bits per cycle. The method is also very noisy, in that each pulse resonates across a broad frequency band.

Despite their limitations, low-frequency systems such as those from Aclara and Landis+Gyr have achieved market penetration in rural areas where wireless systems are cost-prohibitive.

The problems with, and limitations of, the high, medium, and low-frequency PLC methods as discussed above have led in the $21^{st}$ century to rapid development of custom built wireless networks for AMI data collection in the U.S. High-frequency on-grid methods have proven to be too expensive, not sufficiently reliable, and too fraught with error and uncertainty to be commercially viable. Low-frequency methods can be implemented with low-cost edge-to-substation transmitters, but these lack the data-bearing capacity required by modern AMI, and on-grid low-frequency substation-to-edge transmitters like AFRC are large, expensive, and have undesirable side effects which limit their use in urban settings. One possible option would be to use high-frequency substation-to-edge transmitters in conjunction with low-frequency edge-to-substation transmitters. However, in the U.S. market forces have led to the rapid penetration of wireless AMI systems, especially in urban and suburban areas.

Cost constraints and availability of unregulated spectrum have dictated the use of mesh architectures at the edge of the AMI networks, with neighborhood concentrators that collect data from the meters and use traditional infrastructure (fiber or cellular) for backhaul to data centers. Mesh architecture means that although the RF transceivers used have individually high data rates, the edge networks are easily saturated. Most of the available data bearing capacity in these networks is used just for reporting meter interval data, with limited capacity reserved for firmware updates and control packets for applications such as demand management.

Two major factors limit the utility of the existing AMI infrastructures. The first is, of course, the capacity limitations of the mesh. The second, and more significant, is the fact that the AMI network is not congruent with the electrical grid. It is capable of providing little information about the operational state of the grid. This is unnecessary for meter reading, but more sophisticated Smart Grid applications for energy conservation, asset protection, load balancing, fault isolation, and recovery management require accurate information about the schematic relationship of grid assets, load and conditions on the several segments of the grid, and the current state of bi-modal and multi-modal assets. This information, together with the geospatial locations of the same assets, is called the Grid Map.

Utilities typically maintain two maps or models of the Grid. A Physical Network Model (PNM) aggregates the geospatial location of the assets on the grid. PNMs, thanks to modern GPS technology, are reasonably accurate with respect to point assets such as substations, capacitor banks, transformers, and even individual meters. Inaccuracies stem from failure to update the maps when repairs or changes are made. For example, a service transformer may move from one side of a street to the other as a result of street widening. Longitudinal assets, especially buried cables, are less well represented in the PNM. The PNM can contain as-designed data, but since in many places the cable was laid before global positioning technology had matured, the designs were based on ground-level survey, and the original maps may or may not have been updated to reflect changes. Subsequent surface changes complicate the problem of verifying the geographic path taken by medium-voltage distribution lines.

The second model is the Logical Network Model, or LNM. LNMs describe how grid components are connected, without reference to their geospatial location. The LNM changes frequently. During the course of repairs, the way transformers attach to taps and laterals, and meters attach to transformers, may be altered. Such changes affect both the LNM and the PNM. In many utilities, such changes are recorded manually by field agents. The manual reports may or may not be updated in the LNM and PNM, and when updates are made the time lag between maintenance occurring and its being recorded is variable. Additionally, many grid components, especially regulators, switches and reclosers, change state automatically. Unless these components are instrumented with communications back to a data center rather than simply being subject to local control systems, such dynamic changes are not reflected in the LNM. They do, however, affect the power path, the load and environmental stress on other components of the distribution grid, and the service level to consumers.

Examples of significant but not reliably known aspects of the (actual) Grid Map are the feeder and phase by which each meter is currently powered, the relative load on each phase of each feeder, especially on subordinate branches (laterals) of the grid, the actual voltage supplied to each meter, the power factor along the edges of the grid, whether all the power drawn at a transformer is metered, and the state of switch sets, especially after a weather event that has caused outages. If this information were reliably known, utilities could conserve energy, much of the savings from which would pass on to consumers, save maintenance costs, prolong the life of equipment in the field, improve the efficiency and life of utility and consumer equipment, avoid outages, and reduce recovery times after unavoidable outages.

The problem of automated, dynamic grid mapping is not solved by wireless Smart Meters. Smart meters can measure and record current, voltage and power factor (or phase angle) at the meter, but because they have limitations on how much data they can store and how much data capacity is available for transmission, utilities may choose not to program the meters to report these data. The other data elements described cannot be detected by most modern AMI systems.

U.S. Pat. No. 7,948,255 to Coolidge, et al. discloses instruments for phase detection. However, the instruments in Coolidge are intended to be used by field engineers rather than incorporated into the Smart Grid.

The consensus among utilities is that the volatility of the LNM is such that using field engineers to measure and monitor changing attributes of the grid map is not a cost effective or workable solution. For example, conservation voltage regulation efforts were undertaken in the 1990s based on static measurements, and subsequently abandoned because the measurements became outdated too quickly. Today, utilities habitually oversupply consumers, delivering an average effective voltage of 122 vAC to a 15 or 20 amp-rated circuit in a residence to ensure that fluctuations in load, power losses in the home wiring, etc. do not result in some consumers' service falling below 101 vAC effective at individual outlets inside the building, which is generally the optimum for home appliances and the like. The goal of a well-instrumented fine-grained conservation voltage regulation system might be to reduce the typical effective voltage at a single-phase meter to 114 vAC as measured from one leg of the typical 240 vAC service to neutral. 114 vAC effective at the meter is as low as it is reasonable to go without risking under-powering some outlets in the building, (i.e. not less than 110 vAC at any outlet) due to additional losses which are typical inside the home or office.

Since electrical devices consume more energy when powered at the high end of their rated range, this practice of over-delivering impacts consumers' electric bills directly, as well as forcing generation-poor utilities to buy power, increasing their costs. Ultimately, the practice results in more fossil fuel being consumed than necessary.

Cost constraints also dictate that placing SCADA instrumentation at every medium-voltage field asset is impractical. The "touch points" on the distribution grid are, for better or worse, largely the meters at the edge and the instrumentation in the substations. This dictates that techniques for power line communication be revisited, because signals traveling on the power line can be used both to infer and to report grid mapping information not detectable by means of wireless AMI. The ubiquitous presence of wireless AMI for reporting meter data can be considered as a benefit in the search for effective grid-mapping technology, in that it frees the limited data-bearing capacity of low-frequency on-grid transmission methods to support grid mapping systems instead. It is, however, needful to identify a transmission method that is low cost at the edge, coexists with the AMR or AMI, and does not trigger any of the above-noted pitfalls of on-grid transmission: requirements for intermediate devices such as repeaters between the edge and the substation; unacceptable flicker; RF interference; impulse noise; etc. Finally, the transmission must require very little power, because the energy expended driving the transmitters reduces the energy conservation benefits obtained.

As discussed above, some existing PLC methods have adapted radio modulation techniques and channel access methods to the medium of the electrical distribution grid. For example, PRIME uses FDMA with DPSK.

In addition, Code Division Multiple Access (CDMA) is a channel access method most famously used in cellular telephony standards cdmaOne, WCDMA, and CDMA2000. CDMA spreads its signal across a range or band of frequencies, as do other similar technologies; hence the term broadband. Multiple access means that more than one transmitter can use the same channel (here, a power line) without the signal from one transmitter destructively interfering with the signal of another transmitter. In CDMA, each transmitter which uses the same band is assigned a distinct reference code or chip. The transmitted signal equals the exclusive OR (XOR) of the chip with the data signal. If the chips (treated as binary vectors) are mathematically orthogonal, then the receiver can separate out the several data signals from the additive received waveform. A requirement of standard CDMA as used in a wireless application is that there is a dynamic feedback loop from receiver to transmitter to ensure that the power of the several signals received from the different transmitters is the same or nearly the same at the receiver. The feedback loop permits the transmitters to rapidly and dynamically adjust their transmission power to maintain the balance.

Frequency Division Multiple Access (FDMA) means that multiple channels in a medium are created by having different transmitters use different frequencies (or different frequency bands). A signal injected on the power line creates harmonic signals of different amplitudes. If the frequency-division bands are incorrectly chosen, then the harmonics from different bands can coincide and create false signals that interfere destructively with the intended signals. The obvious means of eliminating this effect is to place the channels far apart on the frequency spectrum. This, however, reduces the overall data bearing capability of the medium by "wasting" spectrum.

A third channel access method is Time Division Multiple Access, or TDMA. In TDMA, the channel is divided cyclically over time, with each transmitter sharing the channel assigned a specific time slot in the cycle where that transmitter uniquely has permission to transmit. TDMA requires that all the transmitters have system clocks which are synchronized with one another within a close enough tolerance that one channel accessor does not overlap its transmission with that of another channel accessor.

SUMMARY OF THE INVENTION

The present invention includes a system comprising at least one intelligent edge transmitter called a Remote Hub Edge Transmitter, each small enough to reside inside a Smart Meter. A Smart Meter that contains a Remote Hub Edge Transmitter is called a Remote Hub GLA Smart Meter, or simply a Remote Hub. The Remote Hub transmits by injecting a modulated current into a power main that supplies an electric meter. The system also includes at least one receiver sited at at least one electrical distribution substation operable to receive transmissions from the intelligent transmitters. No additions or alterations to the distribution grid between the Smart Meters and the substation are required to allow the receiver to reliably detect and decode transmissions from the edge transmitters. The system further comprises one Computing Platform for each substation that contains at least one receiver, the Computing Platform having access to a conventional high speed network such as the Internet for transmitting data acquired from the at least one receivers to a data center at which the received data is used by a Concentrating Computer System, or Concentrator, to update other utility systems such as, but not limited to, the LNM and PNM. In some microgrid deployments the Computing Platform and the Concentrator may be the same server, with the data center sited inside the service area of the microgrid. The system may additionally comprise Smart Meters or other devices, such as field-deployed switches and voltage regulators, which are not Remote Hubs, augmented by intelligent platforms operable to employ short-range PLC transmissions using a well-known protocol such as G3 or PRIME to communicate with at least one Remote Hub. Such augmented devices which are not Remote Hubs are designated as Subordinate Remotes, and any augmented device, without regard for whether it is a Subordinate Remote or a Remote Hub, may be referred to generally as a Remote. Each Remote Hub manages only Remotes powered by the same service transformer as the Remote Hub. A short range on-grid network consisting of a collection of Remotes comprising at least one Remote Hub and zero or more Subordinate Remotes is called a Transformer Area Network or TAN.

Subordinate Remotes, Remote Hubs, the Substation Receiver, and the associated Computing Platform and Concentrator all contain stored programs on non-volatile computer-readable memory on which are stored instructions for operating a Grid Location Aware™ (GLA) network. The Subordinate Remotes, Remote Hubs, the Substation Receiver, and the associated Computing Platform and Concentrator also contain processing units (CPUs) which execute the stored instructions allowing each node in the network to implement methods for organizing the on-grid network and transmitting and receiving messages on the network in order to permit other methods embodied as stored programs and executing on the at least one Substation Receiver, Computing Platform and Concentrator to detect and infer schematic grid location attributes of the network and publish the detected and inferred attributes to other application systems including geospatial information systems maintaining the logical and physical network model.

One method implemented by the Remote Hubs and the Substation Receiver provides for channelizing and modulating current signals transmitted from the at least one Remote Hub in the service area of an electrical distribution substation such that the signals are received at the Substation Receiver and the Substation Receiver is able to infer the electrical phase of the specific feeder upon which the signal was transmitted. The signal is transmitted on a broad band of the frequency spectrum called a channel, but the frequency bands of channels are selected so that the frequency is lower than the low-pass threshold of the service transformer that powers the Edge Transmitter. Several modulation techniques have been used in this context, including frequency spread modulation, Binary Phase-Shift Keying (BPSK), and Quadrature Phase-Shift Keying (QPSK). Higher-order modes of phase-shift keying (mPSK) may be used. However, BPSK and QPSK may be preferred embodiments along with frequency spreading, because higher-order PSKs require more power at the transmitter in order to achieve the same signal strength at the receiver. According to some embodiments of the methods, an Edge Transmitter is capable of encoding at least 80 bits per second of post-FEC (forward error correction) data in a burst transmission at low but adequate current so that the signal is not so significantly attenuated by intermediate transformers, capacitors, long lines, underground wiring, and the like to prevent reception by the Substation Receiver. In other embodiments, an Edge Transmitter may be capable of encoding at lower bit rates. Encoding at lower bit rates improves reliability, but limits the amount of data transmitted. In order to obtain the same post-FEC message success rate while transmitting at at least 80 bps, different modulation types may require different Forward Error Correction rates. The method requires little power to inject the signal, so that the signals as modulated do not radiate energy in the RF spectrum or cause flicker or hum on devices in proximity to the transmissions or exhibit any of the other undesirable characteristics of prior art methods of on-grid messaging. The method works on all the grid topologies described herein above, and can support a sufficient number of Remote Hubs per substation transformer that even the largest substations can be fully covered by the resulting Grid Location Aware™ network.

The Substation Receiver may also implement a variety of methods of sampling the ambient waveforms at a multiplicity of frequency bands on the power lines, filtering out the high-energy harmonics of the fundamental power wave, detecting the signal on one or more of a plurality of power lines (comprising each of the three phase lines of each feeder emanating from each bus of a given substation transformer), inferring the phase and feeder combination on which the signal was transmitted based upon a comparative analysis of each of the power lines, ranking them based on the signal quality, error performance, and/or amplitude versus frequency at a multiplicity of points throughout the spectrum of interest. When the Substation Receiver has completely processed a transmission, it packages the decoded transmission together with any additional information about the message inferred by the receiver logic, such as the phase and feeder on which the message was transmitted, the channel on which the message was transmitted, and an indication of the parameters of the modulation method used for that transmission. The Substation Receiver forwards the entire message package to the substation Computing Platform using a normal TCP/IP-based protocol such as HTTP.

Another aspect of the invention is a method of identifying which frequency bands are the best data carriers at each substation transformer, defining at least one data-bearing channel on the candidate frequency bands, optionally defining a series of time slots on each channel in which edge devices may transmit, selecting a modulation technique, and, if frequency spreading is the chosen modulation technique, defining a set of at least one orthogonal codes or "chips" per channel to be used for modulating transmissions. The combined channelization model is then employed by the method to provision the collection of GLA Smart Meters, including both Remote Hubs and Subordinate Remotes, supplied with power by a substation to assign to each of the at least one Remote Hubs a policy describing on which frequency-based data-bearing channel(s) the Remote Hub may transmit, and under what circumstances the Remote Hub must transmit. The policy describes multiple aspects of the channels, including modulation method, frequency bands, chip selection algorithm if chips are used, and message preamble pattern. Frequency-based channels and chips must be assigned in such a way that transmissions are not destructive when segments of the grid are, for example, switched from one substation transformer to another. The provisioning scheme anticipates and minimizes the problem of crosstalk, and provides means for logic on the Substation Receivers, the substation Computing Platforms and the Concentrator to hierarchically process the messages received from each Remote Hub and use them to infer the state of stateful non-edge features of the grid, such as switches, reclosers, and breaks in the power lines. Other properties of the transmission are determined dynamically by firmware and instrumentation on the Remote Hub. For example, the power used when transmitting may be related to the impedance of the line as measured immediately prior to transmitting.

In some embodiments of the invention, a number of techniques may be employed for managing channel quality, depending on the availability of Substation-to-Edge broadcast capability from adjacent networks, such as an AMI, AMR, and/or radio broadcast transmitter. Software on the Substation Receivers and Computing Platform may monitor aspects of the channel quality and take measures to ensure that messages from the Remote Hubs experience an acceptably high success rate. According to one aspect of the invention, an acceptably high success rate may be ensured by rotating the responsibilities of the several channels, except that at least one non-structured channel is not rotated but remains dedicated to provisioning and alerting. For example, if two data bearing channels have been identified, and one data bearing channel demonstrates a higher success rate than the other, then the network may be provisioned to have Remote Hubs alternate between transmitting on the better channel and the other channel. This reduces the overall probability of a given Remote Hub experiencing an unacceptably high message failure rate.

Other options for channel management may be to alter the definition of a channel so that the channel has a wider frequency spread, and/or uses more FEC bits per burst. Still another option is to move a channel to a different place in the spectrum, either permanently, or at different times of the day based on an observed cycle in impedance, impulse noise, or some other characteristic of the channel relevant to message success rate. None of these mechanisms require a fast feedback loop between the Edge Transmitters and the substations, as is the rule with some modulation techniques such as CDMA. Rather, the apparatus at the substation conducts a time-duration analysis of the behavior of the network, and then broadcasts new provisioning policy based on the analysis. Many characteristics of the network may be taken into account when making a policy change, such as observed patterns of crosstalk, variations in impedance, harmonic mixing, and the like. A policy change may impact multiple substations which may be interconnected by switching systems or other forms of redundancy.

Yet another aspect of the invention is a method employed by the stored programs at each of the at least one Remote Hubs to integrate the Edge-to-Substation GLA network with adjacent networks, such as the AMI (regardless of the AMI architecture) and the higher-frequency PLC based Transformer Area Network, as well as with the native intelligence of the Smart Meter platforms themselves. In this method, the Remote Hub, whose high-frequency PLC protocol stack (e.g. PRIME) enables it to act as the master node in the TAN, carries out the TAN-management activities. TAN management activities include, but are not limited to, polling the PLC protocol stack to detect newly discovered Subordinate Remotes. The Remote Hub also polls the local native Smart Meter intelligence to obtain local data such as current, voltage, and phase angle, and polls the reachable population of Subordinate Remotes to obtain similar data from the native Smart Meter intelligence at the Subordinate Remotes. The Remote Hub stores, compresses, and/or processes the gathered data according to the policies and application algorithms on the Remote Hub until the operable policy dictates that the gathered data and/or derived results of the gathered data may be transmitted to the Substation Receiver by the Edge Transmitter module of the Remote Hub. The Remote Hub is further responsible for using its provisioned policy and discovered TAN configuration data to determine when it is appropriate to format, encode, and transmit an alert message on an edge-to-substation channel. Such messages may include pairing messages, which report the discovery of a new Subordinate Remote, pairing alerts, which report the loss of communication with a known Subordinate Remote, other alerts which report changes in the TAN or at meters (such as power surges, sags, and spikes), and scheduled data reports which transmit the data collected from the native Smart Meter intelligence in the TAN to the apparatus at the substation. In some embodiments of the invention, channels are not time-slotted, and Remote Hubs may transmit only exception reports or computed data reports on a randomized posting schedule in which an adequate number of transmissions are performed to provide an acceptable probability of achieving at least one successful transmission at the desired rate.

If slotted channels and/or time-scheduled transmission policies are used, the Remote Hub may require a method of synchronizing its system clock to a known tolerance with other Remote Hubs in the same service area. Each Remote Hub may poll the local meter or AMI network to obtain the AMI network time, which the Remote Hub uses to determine when scheduled transmissions must occur, and to obtain data blocks received via the AMI which are intended for the Grid Location Aware™ intelligence on the Remote Hub or on the Subordinate Hubs. Such data blocks may include firmware updates and changes in network policy or provisioning which will affect the subsequent behavior of the Subordinate Remote. The Remote Hub distributes firmware updates and policy changes to the Subordinate Remotes as necessary via the local PLC channel of the TAN. Additionally, Remote Hubs may synchronize based on a wireless broadcast signal. If no synchronization method is available, channel access may not be based on time slots at all. This reduces the data-bearing capability of the network but does not impact the ability of the system to provide grid-location data. In some embodiments, Remote Hubs and/or Subordinate Remotes may contain a Global Positioning System (GPS) receiver. The GPS signal may be used for synchronizing the Remote Hubs in addition to providing means to associate the logical network model with the physical network model.

In still another aspect of the invention, the Computing Platforms and the Concentrator maintain two master data tables which can be initially extracted from the utility's PNM and/or LNM, or which can be entirely accumulated from reports from the Remote Hubs. These data tables are the Inventory, which is a table of all the Remote Hubs and Subordinate Remotes which have been detected, and the Grid Map, which is a schematic representation of the grid's topology and state, similar to an LNM. The Grid Map and Inventory at substation Computing Platforms may be partial, representing only the portion of the grid accessible to the substation at least at certain times. The Grid Map and Inventory at the Concentrator generally represent the entire utility service area, although gaps in the Grid Map may exist if instrumentation of the service area with Remote Hubs and Subordinate Remotes is incomplete. When the Computing Platform at a substation receives any message from a Subordinate Remote, it compares the data in the message and the message enhancements inferred by the Substation Receiver with the data in the Inventory and Grid Map. The logic and policy on the Computing Platform are used to determine if the local copy of the Grid Map and Inventory need to be updated, and whether the update must be sent on to the Concentrator to update the master Grid Map and Inventory. If the policy in effect at the Computing Platform so dictates, the data collected from the edge is also forwarded to the Concentrator. The Concentrator in turn carries out policies dictating which events and scheduled reports must be published out to other data center applications.

BRIEF DESCRIPTION OF THE DRAWINGS

The accompanying drawings, which are incorporated in and form a part of the specification, illustrate the embodiments of the present invention and, together with the description, serve to explain the principles of the invention.

FIG. 2c is a simplified fragment of a networked architecture distribution grid. The four feeders shown could originate at a single substation (typical) or at multiple substations. The rectangular grid connects service transformers peer-to-peer on the low-voltage side so that all feeders deliver power to the loads below the substations concurrently.

FIG. 2d is an exemplary simplified fragment of a campus network. A three-phase transformer powers a 480 Volt Bus from which depend a number of three-phase laterals which run through the campus powering individual electrical outlets. Adding low-voltage generation points to the bus and providing means to isolate the bus from the distribution line converts the campus network into a self-sufficient microgrid.

FIG. 10a is a graph (not to scale) of a snapshot of the AC waveforms on a distribution grid at a meter connection point. The power fundamental and its odd harmonics are highlighted, and three CDMA-like broadband frequency-divided Edge-to-Substation channels are shown, one extended over time to illustrate time divisions.

DETAILED DESCRIPTION OF THE INVENTION

The present invention comprises a system and methods for constructing and operating an on-grid data collection network in such a way as to integrate the network with other adjacent networks and devices present at the edge, substations, and features of an electrical distribution network, wherein the other networks and devices may include Smart Meters and the AMI and a conventional network such as the Internet. The system and methods further integrate the data collected by the on-grid data collection network at a data center and may publish the collected data to other applications. The system and methods may also employ the capabilities of the integrated networks to infer otherwise unknown static and transient attributes of the electrical distribution grid and report them via the integrated networks for the purpose of improving the physical and logical network models of the Smart Grid. This leads to the ability of the models to support Smart Grid applications such as conservation voltage reduction, volt/Var optimization, load balancing, fault isolation, and recovery management.

Figure 1:
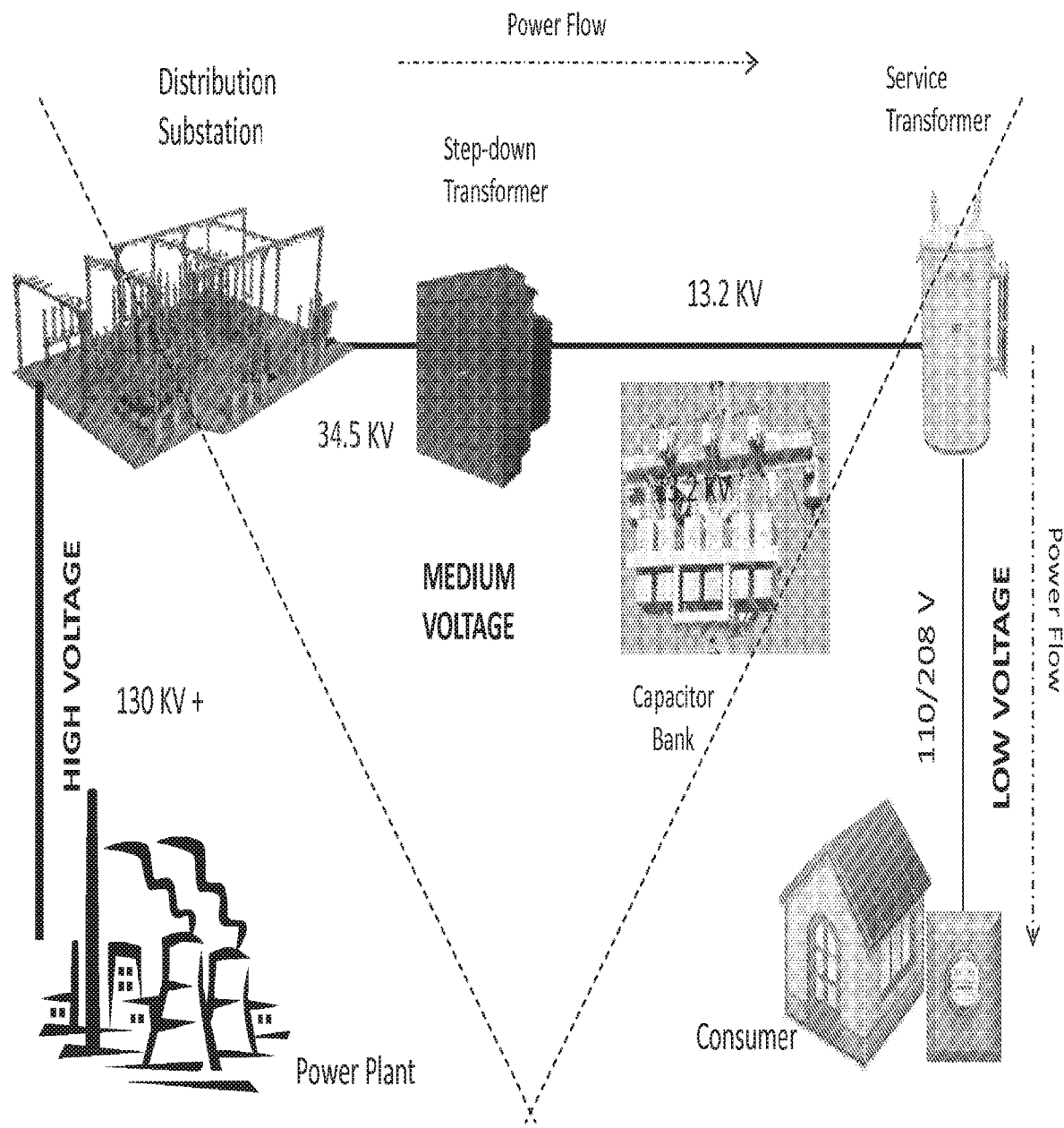
FIG. 1 is a simplified illustration of the power path from a generation point to a distribution substation to a consumer, showing the high voltage, medium voltage, and low voltage regions of the distribution grid and depicting some of the major features of an electrical distribution grid.
Figure 2A:
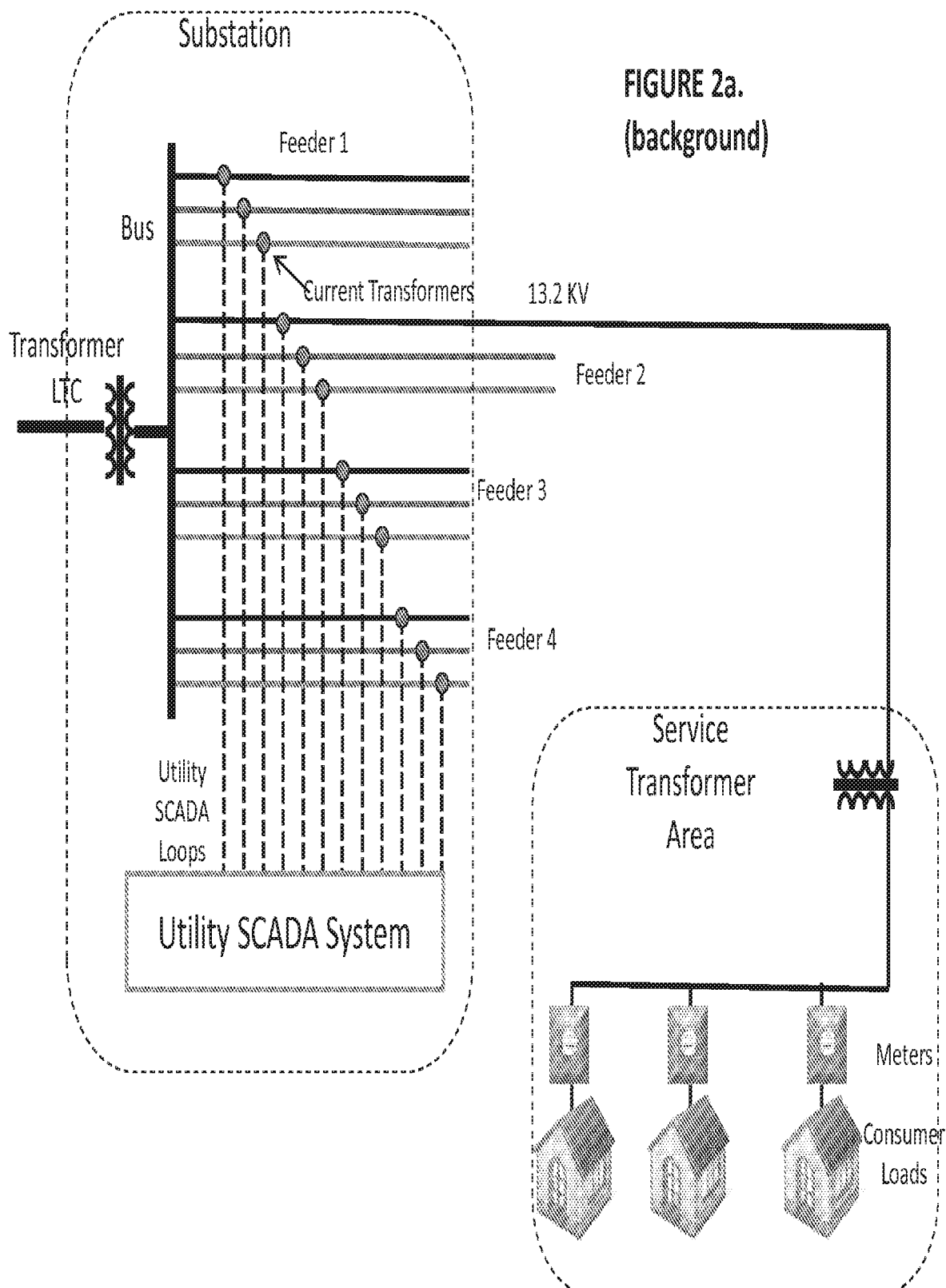
FIG. 2a is a simplified fragment of a radial-architecture distribution grid showing the lack of cycles in the grid topology.
Figure 2B:
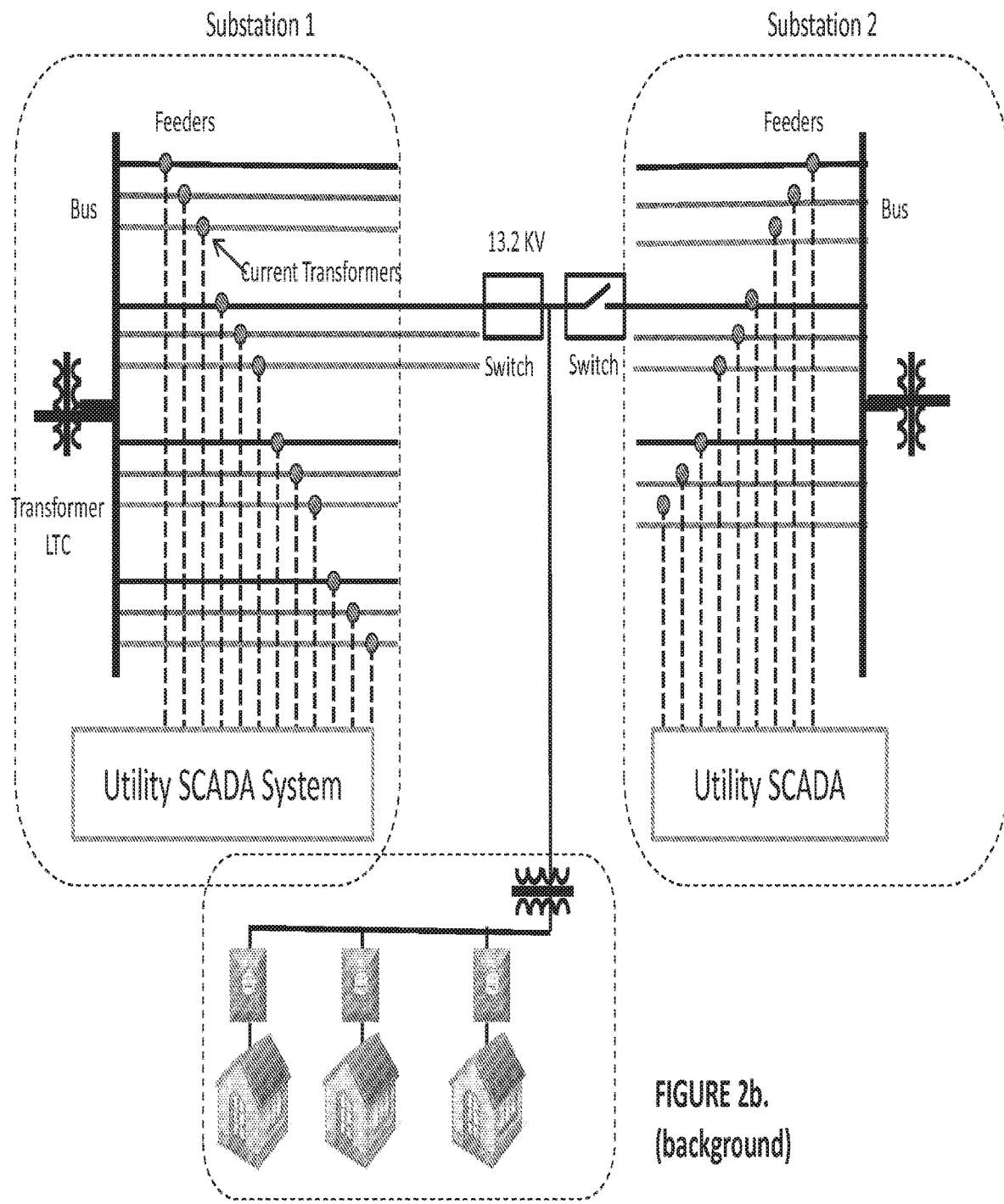
FIG. 2b is a simplified fragment of a looped-architecture distribution grid depicting two substations each able to deliver power to the service transformer delivering low-voltage power to the group of residences shown. The substation at left is currently powering the residential group.
Figure 3:
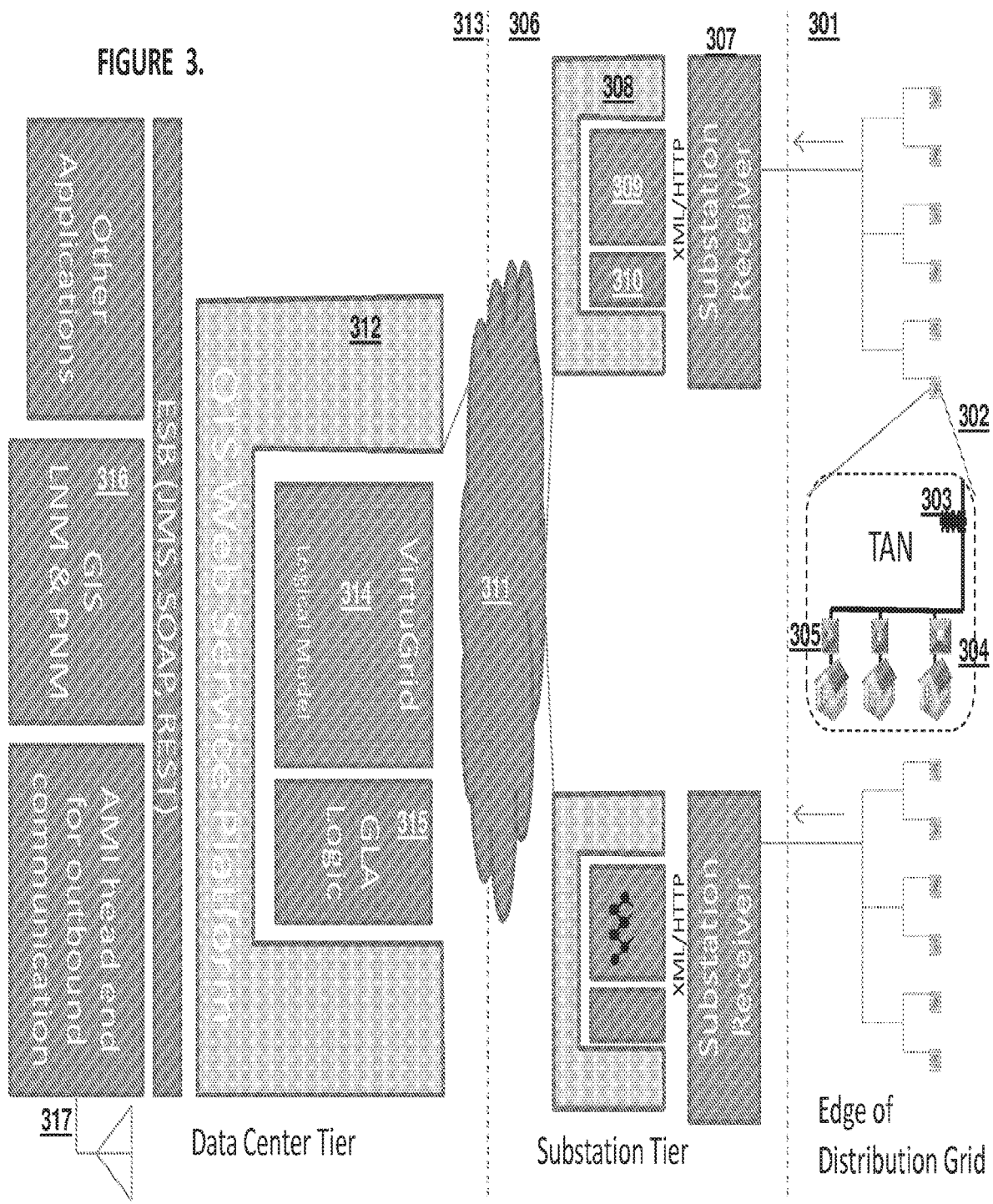
FIG. 3 is a high-level software deployment model of a Grid Location Aware™ network including back office features, substation apparatus, and transformer area networks (one expanded) including intelligence at remote hubs and subordinate remotes.

FIG. 3 is a logical block diagram of the intelligent platforms of one embodiment of the invention showing where the different intelligence resides with respect to a converged network comprising a conventional wide area network such as the Internet, an Advanced Metering Infrastructure, the medium voltage electrical distribution grid, and the at least one Transformer Area Network connected at the edge of the medium voltage electrical distribution grid via at least one service transformer. FIG. 3 shows that the system may be divided into three regions or tiers. The edge tier 301 comprises at least one Transformer Area Network (TAN) 302. Each TAN comprises a Service Transformer 303, at least one Remote Hub 304, and zero or more Subordinate Hubs 305. When Subordinate Hubs 305 are present, the Remote Hub communicates with the Subordinate Hubs via a standard short range, PLC protocol, such as PRIME. The Remote Hubs 305 may be operable to transmit current-modulated signals. To avoid having multiple Remote Hubs unintentionally installed on a TAN, the installation procedure may provide a mechanism to allow a newly installed Remote of either type to detect whether Remote Hub is already present on the local TAN. The invention does not require the installation of communication devices or other modifications between the edge tier and the substation tier. However, if it is desirable to collect data from a feature of the medium-voltage grid such as a capacitor bank, a variation of the Remote Hub device may be installed there. Such a Remote Hub is technically still at the Edge Tier, since it is powered by a low-voltage outlet located at the feature, and not directly from the medium-voltage line(s) upon which the grid feature is installed.

Still referring to FIG. 3, the substation tier 306 comprises at least one Substation Receiver 307 operable to receive transmissions from the Remote Hubs in the edge tier without recourse to any signal amplifiers, bypass mechanisms, or bridges installed on the medium voltage infrastructure of the electrical distribution grid. The Substation Receiver(s) connect via a local area network to a Computing Platform 308 containing non-volatile computer-readable memory and a CPU for storing and executing the software 309 which maintains the Inventory and Grid Map databases and carries out the tasks of provisioning and managing the converged data network. Additionally the Computing Platform stores and executes software 310 which processes the Inventory and Grid Map data in combination with messages received from the Substation Receiver 307 to infer information about the state of the Grid over and above what the Substation Receiver alone can detect based only on incoming transmissions. In some embodiments of the invention, the computer-based components of the Substation Receiver and the Computing Platform components are hosted on the same server. In such embodiments, the communications protocol (such as HTTP) used to transfer data between the Substation Receiver and the Computing Platform software components need not change, even though there is no physical local area network required. Computing Platform 308 connects to a conventional wide area network 311, such as the Internet, for the purpose of communicating with a Concentrator 312 in the data center tier 313. In some embodiments of the invention, and regardless of whether the Computing Platform and Substation Receiver are the same server or separate servers, the servers may be configured in a redundant cluster to ensure continuous operation of the system.

Referring again to FIG. 3, the Concentrator 312 hosts software with an analogous architecture to the software in the substation(s), comprising a network and data management component 314 providing software services to one or more applications 315 for Grid Location Awareness. The applications use conventional network-based messaging protocols such as but not limited to JMS, SOAP, and REST to publish information to subscriber applications such as a Geospatial Information System 316. The data and network management component 314 may integrate with AMI head-end 317 for the purpose of causing the AMI network to broadcast data blocks to the Remote Hubs in the edge tier 301. Data and network management component 314 may integrate with AMI head end 317 using a standard protocol and/or a proprietary interface defined by the AMI vendor.

Other embodiments of the invention may include the convergence of alternative ancillary network components. For example, Substation-to-Edge broadcast capability and/or time synchronization from the substations to the Remote Hubs may be provided by medium-voltage PLC transmitters attached to the feeders at the substation rather than using an AMI for this purpose. Likewise, a separate radio transmitter broadcasting messages originating at the substation may be employed. The radio transmitter does not need to be physically located at the substation as long as there is a lowlatency network connection from the Computing Platform at the substation to the transmitter. The same radio transmitter may serve as the Substation-to-Edge channel for a multiplicity of substations. When the Substation-to-Edge channel is not an AMI, synchronization of the Remote Hub clocks may be provided as described in U.S. patent application Ser. No. 13/566,481, titled System and Methods for Synchronizing Edge Devices on Channels without Carrier Sense, which is incorporated herein by reference. In embodiments of the invention where channels are not slotted, clock synchronization is unnecessary.

Figure 4:
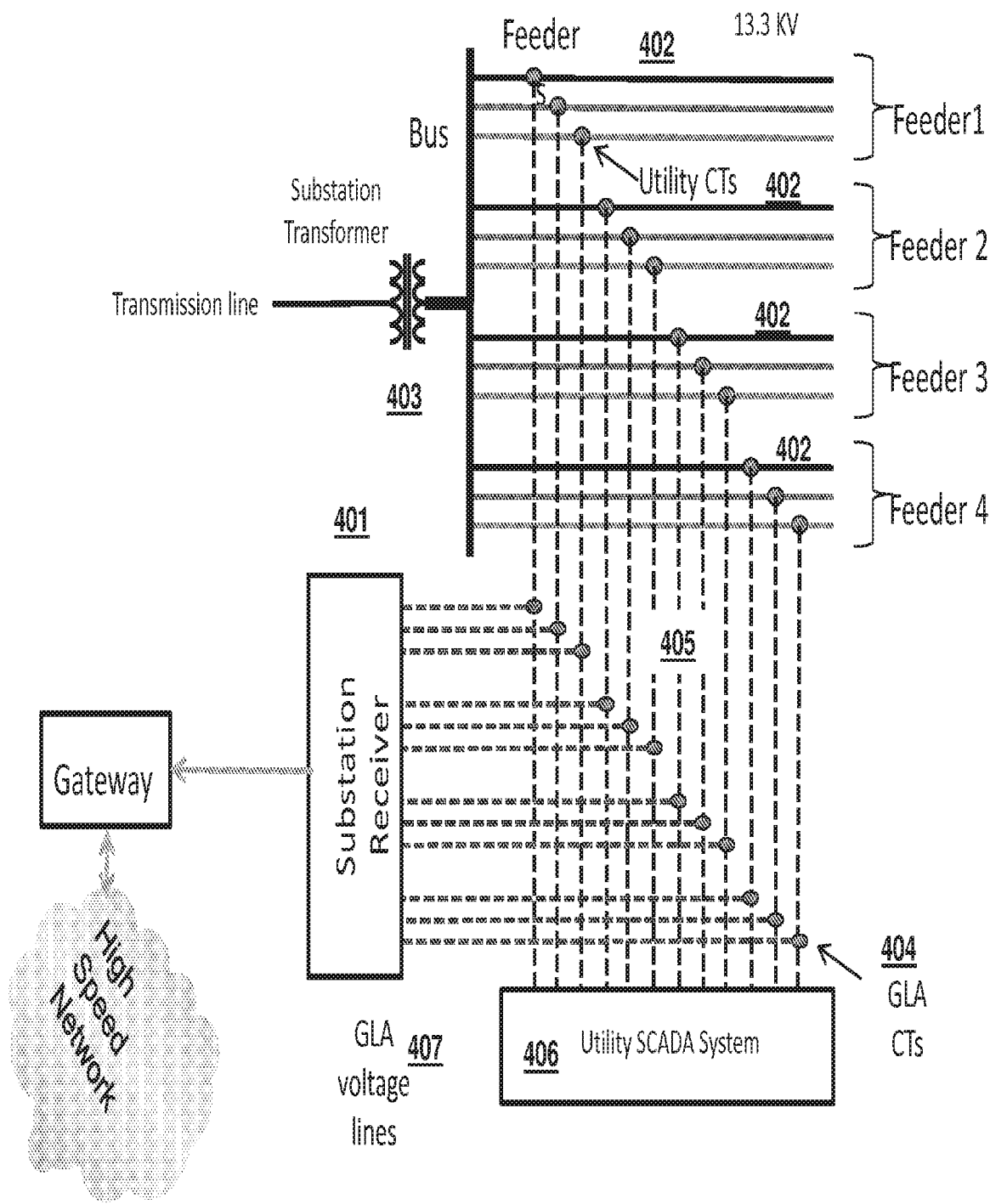
FIG. 4 is a simplified block diagram of the substation apparatus in a Grid Location Aware™ network, illustrating how the Grid Location Aware™ network apparatus couples to the existing SCADA lines in the substation and how the data from the Substation Receiver is backhauled to a data center.

FIG. 4 details how in one embodiment the Substation Receiver 401, here shown co-hosted on a single server with the other software components of the Computing Platform, monitors the feeder lines 402 on the low-voltage side of the substation transformer 403 by attaching secondary current sensors 404 to the SCADA loops 405 already in place. The secondary current sensors provide inputs to the Substation Receiver. This coupling method allows a Substation Receiver to be installed on a substation transformer without disrupting the operation of the substation. Other coupling methods such as hot-stick clamp-on current transformers are well known in the art, and may be equivalently employed in lieu of the secondary coupling to SCADA loops method described herein. Some substations may lack SCADA loops, or they may be inaccessible due to physical placement or due to utility regulations.

Figure 5:
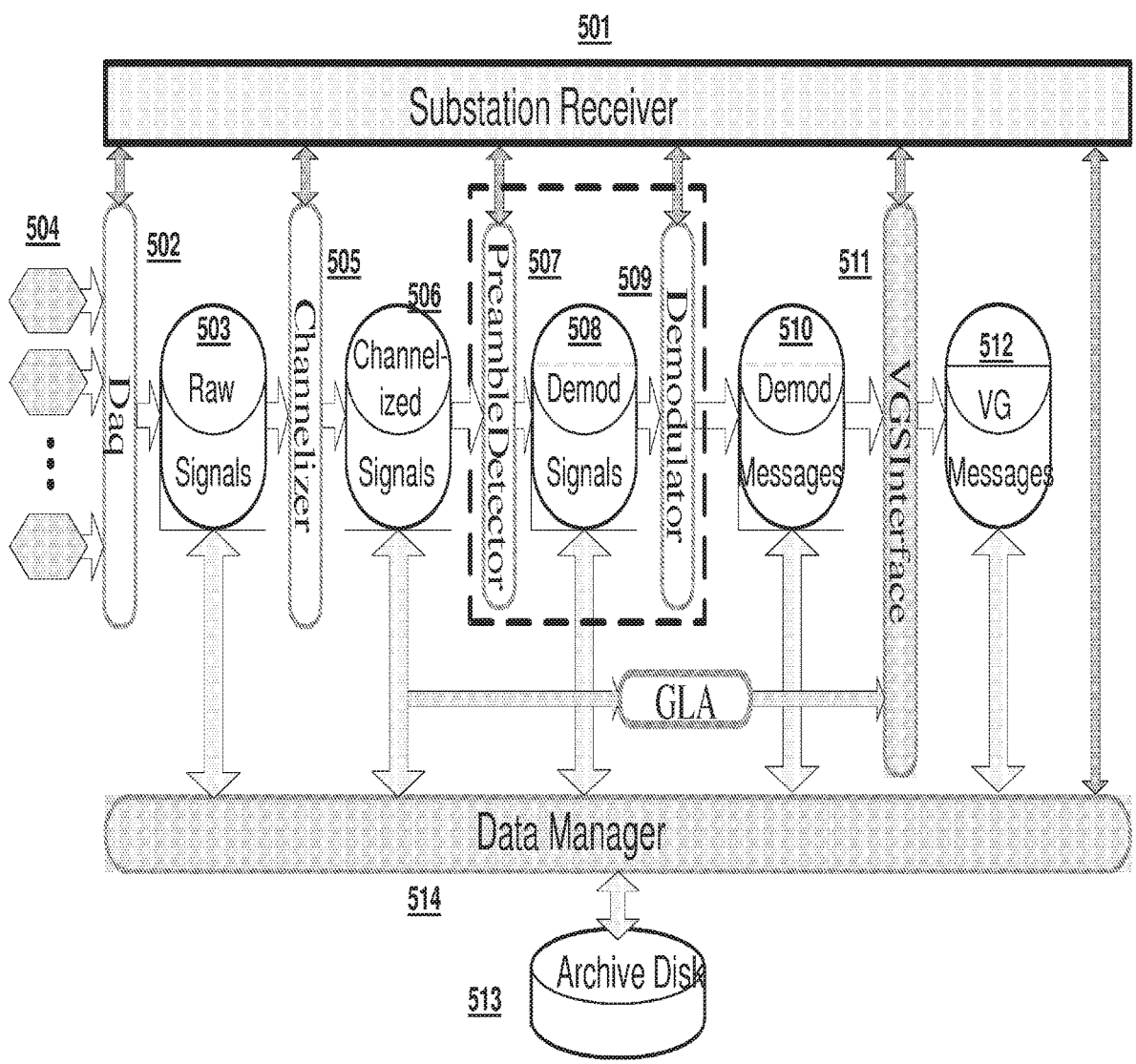
FIG. 5 is a block diagram of the multi-threaded software architecture in the Substation Receiver showing how Edge-to-Substation signals are acquired, channelized, detected, demodulated, decoded, and stored for processing and backhaul.

FIG. 5 details the software architecture and method used by one embodiment of Substation Receiver logic 501 to capture, detect, differentiate, and decode the multiplicity of signals being received from the Remote Hubs at the edge of the portion of the distribution grid supplied by the substation transformer associated with this Substation Receiver. Inputs from the GLA CT lines 504 arrive at data acquisition module (DAQ) 502 in real-time as raw digitized signals where they are then buffered and recorded on ramdisk 503. Operating in parallel with the DAQ process, Channelizer 505 reads the raw signals and reorganizes them by frequency band of interest into channelized signals stored on ramdisk 506. Operating in parallel with the Channelizer, Preamble Detector 507 samples the channelized signals received on every feeder-phase attempting to recognize the one or more preamble patterns which precede every transmission. In one embodiment, the Preamble Detector looks for all legitimate preambles, thereby allowing for the receipt of transmissions that are outside their allocated time slots or which were transmitted on a non-slotted channel. The Preamble Detector may also use its knowledge of the channel time slots in order to minimize the amount of channelized recordings it must sample. In one embodiment, when the Preamble Detector finds a preamble, it determines and marks the point or points in the data stream at which the Demodulator 509 should start processing. Multiple copies of the same message may be detected due to crosstalk. All copies are retained for demodulation. Preamble Detector 507 provides the marker information and Channelized signal data to the Demodulator through ramdisk 508. Operating in parallel with the Preamble Detector, Demodulator 509 reads all copies of the messages from ramdisk 506, uses the frequency bands and possibly time slots in which the messages were found and the known policies of the Remote Hubs to determine how to decode the message. Policy elements may include the modulation technique in use on the channel, the time based access policy in use, and, if frequency-spread modulation is used, which chips could have been used in modulation. Sometimes there may be more than one possible choice of chip. If the demodulator attempts to apply the wrong chip, this will be indicated by a demodulation error and/or FEC failure. This parallelized embodiment of the receiver logic permits multiple processor cores to operate on each message stream, with the modules early in the data flow operating on later transmissions, while modules late in the data flow operate on earlier transmissions.

Still referring to FIG. 5, Data Manager 514 may be responsible for synchronizing the several processes' access to the data stored on the ramdisks 503, 506, 508, and 510, so that each process at a given time is operating on completed data that was output by its predecessor process rather than attempting to access stale or volatile buffers. The Data Manager also can copy data from the ramdisks to a large archive disk 513 for later study and post-processing. By the time the messages have been demodulated and written to ramdisk 510, they have been enhanced with enough information to identify the transmitter and infer the feeder and phase on which the message was transmitted, as described in more detail below. The message bundle for each feeder-phase on which the message was received may include, but is not limited to, the signal amplitude at characteristic frequencies within the frequency band, the signal quality as determined by Demodulator figure of merit measurements, the time the signal was received, and the chip, if any, with which the message was encoded. These message bundles are passed to the Network Management and Grid Location Awareness software via interface 511. These software components, not shown in FIG. 5, but shown as 309 and 310 respectively in FIG. 3, use the provisioning policies of the edge transmitters together with the message properties and the message content to determine which Remote Hub edge transmitter sent the message, and compare the signal characteristics of the copies of the message received on each different feeder-phase input where it was detectable in order to establish on which feeder and phase the message was actually transmitted. This conclusion is compared with the information in the grid map to determine if a change in grid topology or state has occurred. This allows the Grid Location Awareness algorithm to infer not only the phase of a meter where the phase was previously unknown, but also changes in switch states in loop or networked configurations and schematic alterations in any type of grid resulting from repairs and maintenance.

Referring once again to FIG. 3, the software components 309 and 310 on the Computing Platform 308 decode the demodulated, error-corrected message received from the Substation Receiver at the semantic level. The semantic decoding may include decryption and a CRC check on the decrypted message. This helps preclude the introduction of false data, for example due to tampering with the firmware on the Remote Hubs, or installation of a meter from a different service area on the network for malicious purposes. Once the message has passed this level of decoding, the data payload in the message may yield additional grid awareness information. A pairing message indicates that a new meter has been installed successfully, or that a known meter is now connected to a different service transformer or a different phase of a multi-phase transformer. Scheduled data messages may provide information about voltage levels, demand, and power factor at the edge, as well as any other data or results computed from data available from the instruments at the Remotes, limited only by the data-bearing capacity of the channels. Even the failure of a scheduled message to arrive is informative, indicating that there may be an outage. Any copy of the message may be used to extract data, not only the copy from the feeder and phase on which the message was determined to have been transmitted. Sometimes the main copy may contain bit errors while crossover copies do not.

When all the information has been extracted from a message bundle at the substation, the software components on the Computing Platform apply a policy to determine what data to forward to the Concentrator 312 via conventional network 311 for further processing and publication. In addition to carrying out data management policies, Computing Platform 308 may analyze the archived raw and enhanced signal quality data in order to determine whether beneficial changes in channel management ought to be made. When such changes are identified, Computing Platform 308 may forward recommendations to the Concentrator to ensure that the impact of all contemplated policy changes is understood at every substation that may be affected before the policy is put into effect.

Figure 6:
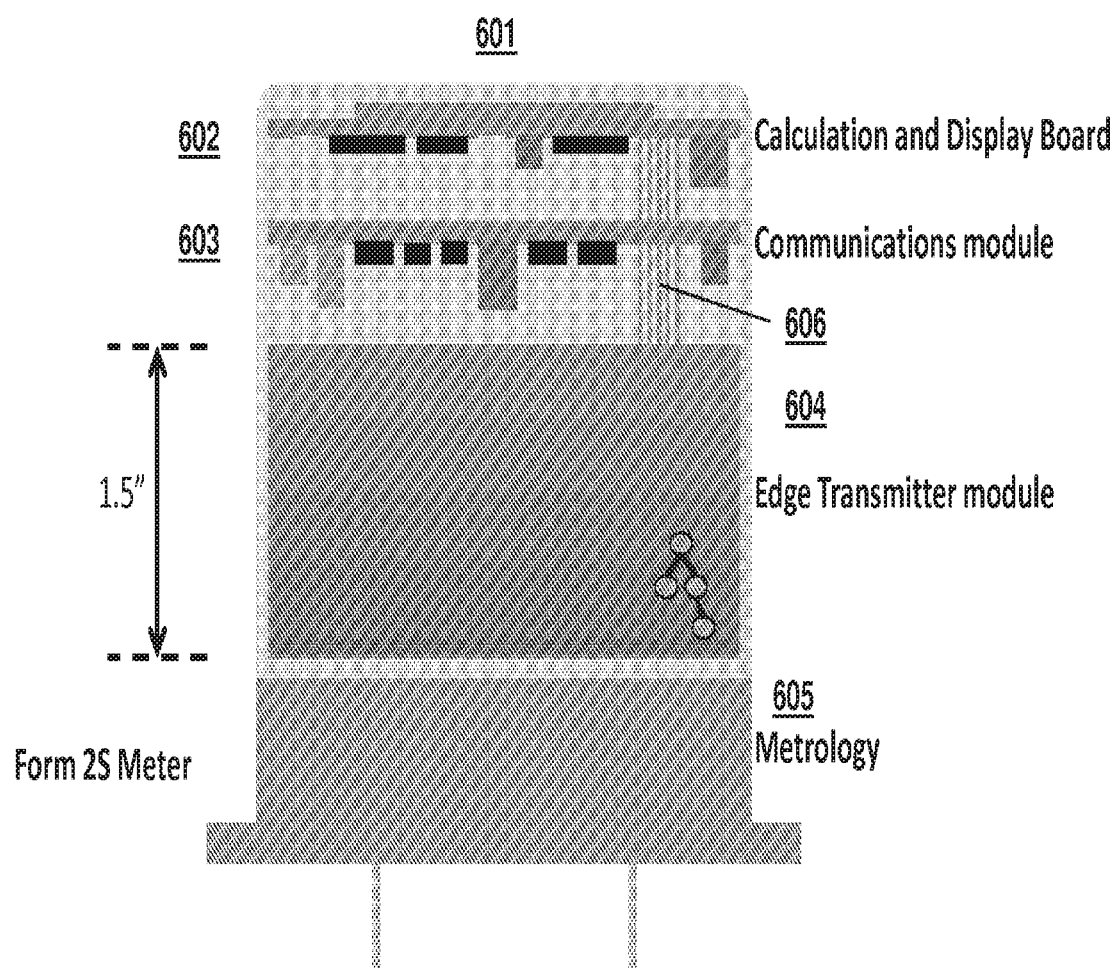
FIG. 6 is an elevation of a Remote Hub GLA Smart Meter.

Considering now the devices at the edge of the network. FIG. 6 shows an elevation of a single-phase form 2s GLA Smart Meter 601 which is operable to act as a Remote Hub in a Grid Location Aware network. Form 2s is standard format for a residential single-phase meter in the United States. Other embodiments of the Remote Hub device may integrate with three-phase meters, or not be associated with a meter at all, but plug into a 120V or 240V or other voltage outlet located at a building, especially in a microgrid setting where the edge of the network is defined with a higher resolution than in a typical utility service area. In still other embodiments, the Remote Hub device may be integrated with other devices and instruments on the distribution grid, such as voltage regulators, capacitor banks, step-down transformers, and the like.

A typical Smart Meter has a layered design of circuit boards conformal to the meter housing, such as a cylindrical transparent dome constructed of glass or Lucite. In the depicted embodiment, the dome may be approximately 1.5" taller than usual to accommodate the height of the Edge Transmitter module 604. However, the height of the meter housing varies from one manufacturer and model to another and does not place the meter in violation of the form standard. Nearest the top of the housing is the Calculation and Display Board 602, which is part of every Smart Meter. Typically, the display features on the Calculation and Display board such as indicator lights and a digital readout may be accessed by other components in the housing via interface 606. The Communications module 603 contains the AMI transceiver circuitry and intelligence. In some Smart Meters the components of the Communications module 603 are contained on the Calculation and Display Board, but other smart meters can accommodate multiple types of Communications Modules by placing the communication components on a separate board as shown. Both configurations are common. If on a separate board, Communications Module 603 communicates with logic on the Calculation and Display board 602 via an interface and cable 606. Other types of component-to-component interfaces are possible internal to the Smart Meter. The Edge Transmitter module 604 contains the long-range GLA edge transmitter and also the short-range PLC transceiver for the TAN communications. Module 604 also has a CPU/microcontroller with nonvolatile memory that hosts and executes the stored programs of the Remote Hub control logic, controlling the Edge Transmitter and the PLC transceiver, and the interface 606 to the other logic boards 602 and 603.

Figure 7A:
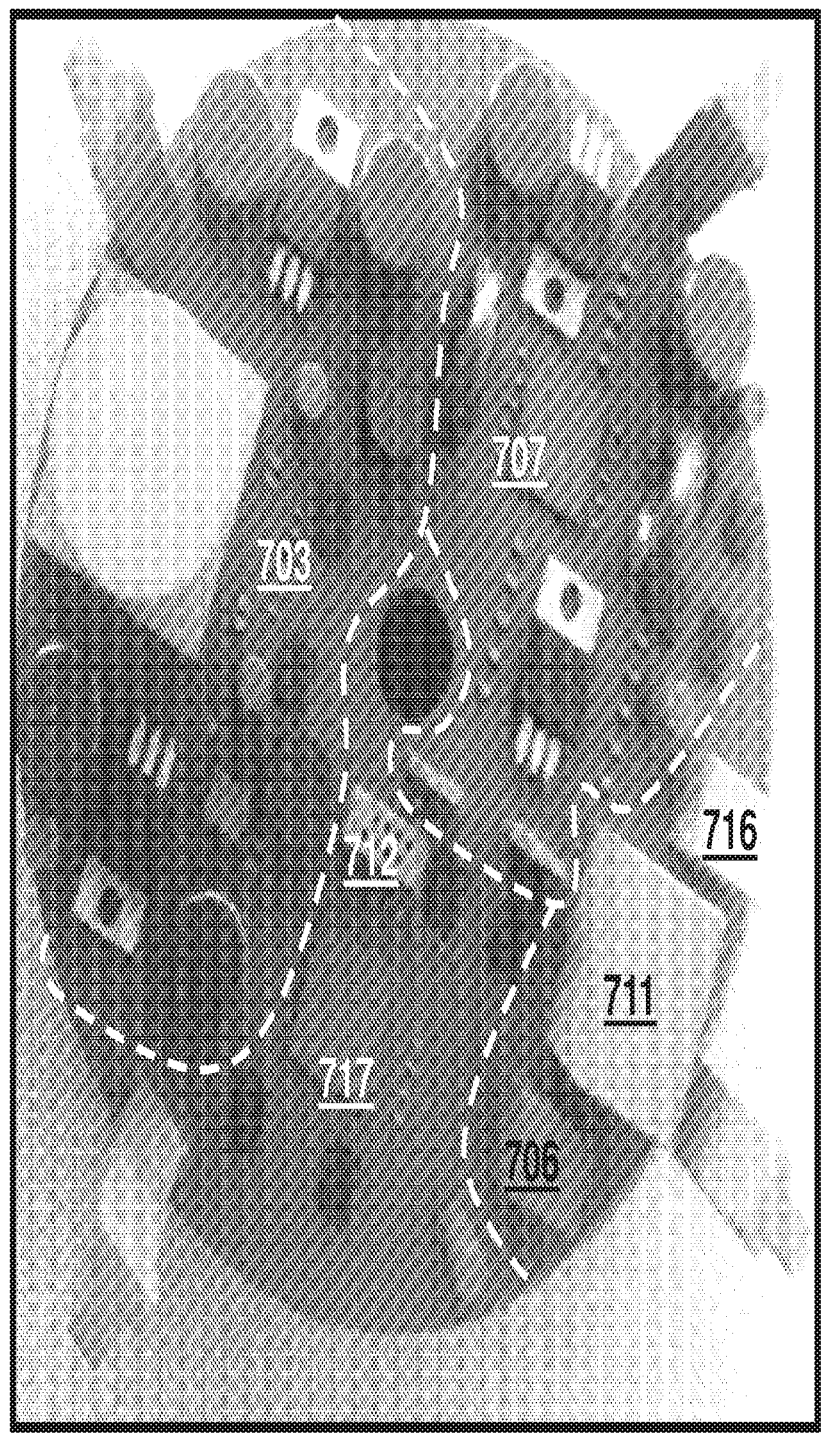
FIG. 7a is a top view of an accurate 3-dimensional model of one embodiment of the Edge Transmitter module of the Remote Hub GLA Smart Meter for a Form 2S residential meter.
Figure 7B:
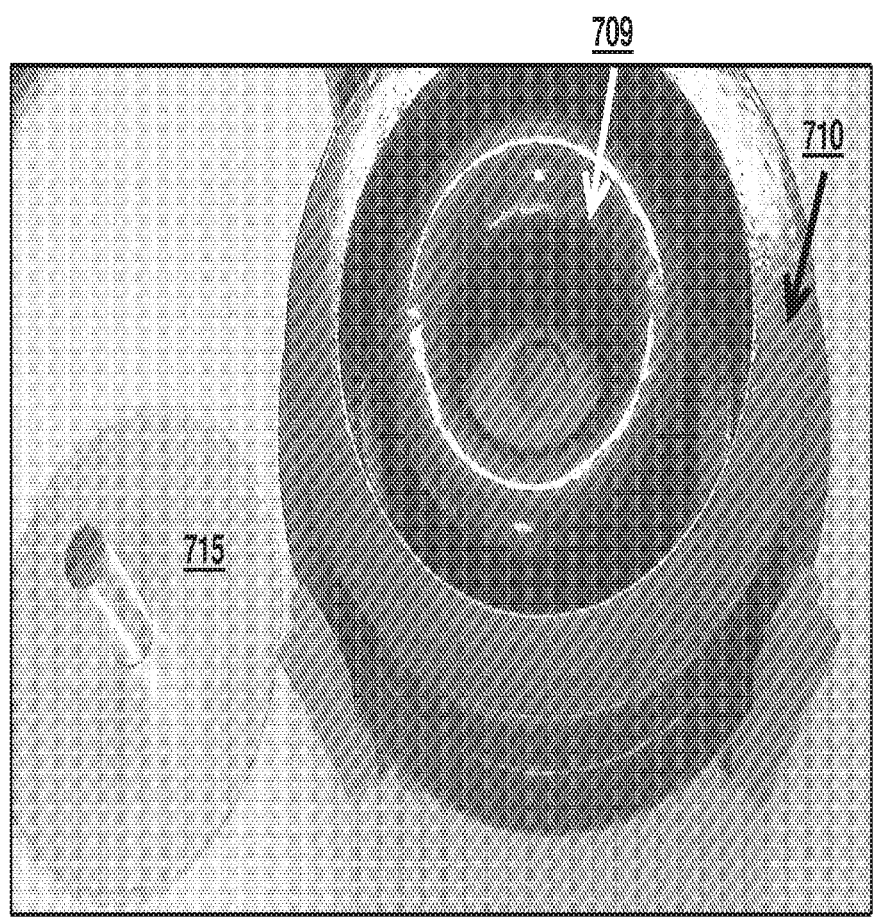
FIG. 7b is a bottom view of the same model of the Edge Transmitter module.
Figure 7C:
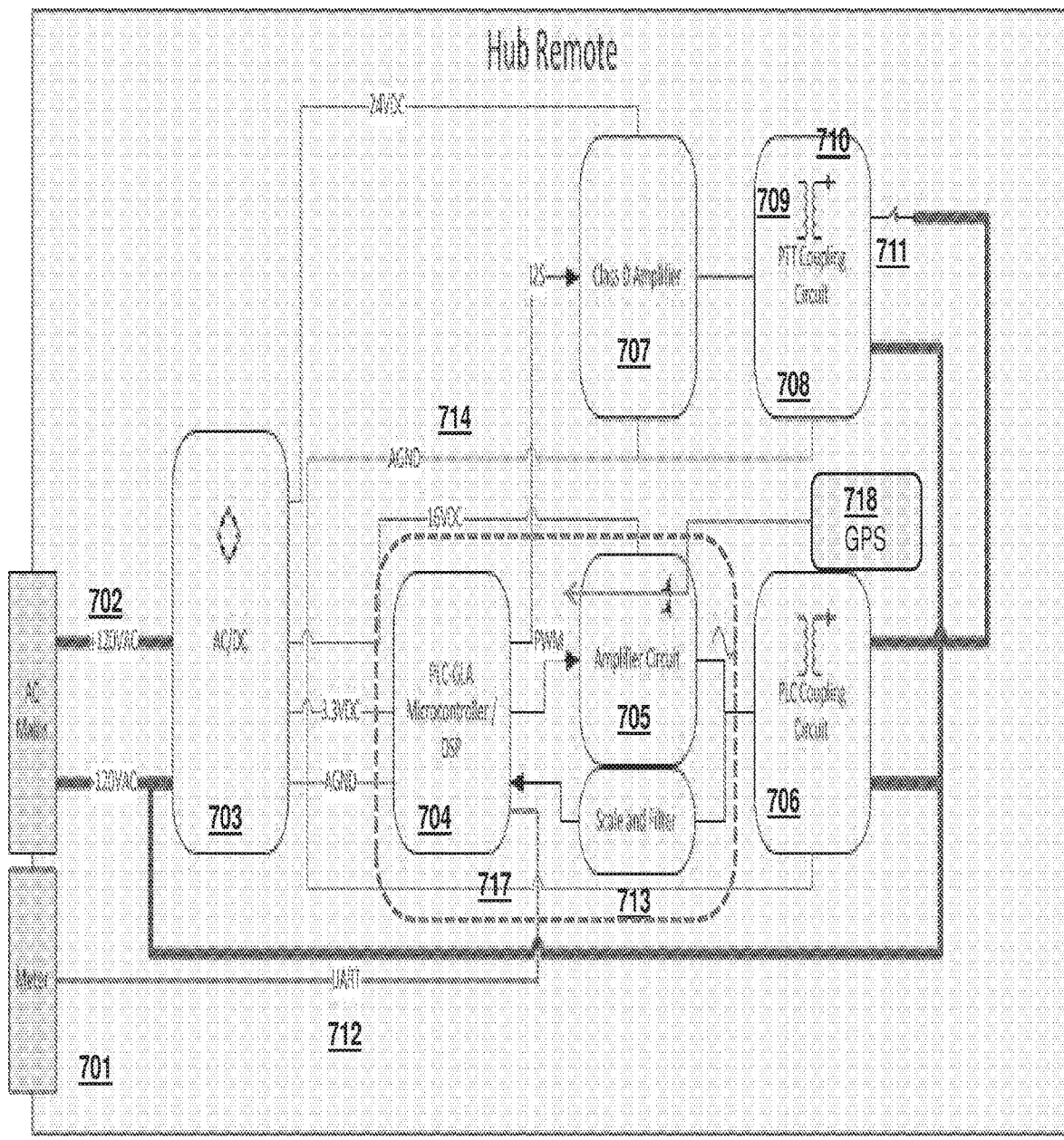
FIG. 7c is a schematic block diagram of the electronic components of the Edge Transmitter module of the Remote Hub GLA.

FIGS. 7a, 7b, and 7c show top, bottom, and schematic views of one embodiment of the Edge Transmitter module. Referring primarily to FIG. 7c, the Edge Transmitter Module communicates with other components of the meter 701 via UART (Universal Asynchronous Receiver/Transmitter) 712. Power is delivered to power supply 703 from AC mains 702. Power supply 703 provides appropriate low voltage DC power to computing unit 717, Amplifier Circuit 705, and Class D Amplifier 707. Computing unit 717 is a microcontroller processing unit with on-board volatile and nonvolatile memory, and is used for both short range and long range digital signal processing and protocols 704, scaling and filtering 713, and to drive amplifiers 707 and 705. PLC Amplifier Circuit 705 and PLC Coupling Circuit 706 are adjusted so that the medium-frequency signal emitted does not propagate outside the TAN, relying on the service transformer's filtering properties at this frequency, as described in more detail below. The coupling circuit 708 for long range transmissions is much more powerful, requiring a special isolation circuit 711 which prevents coupling circuit 708 from resonating with other long-range transmissions and grid noise at the frequencies to which it is sensitive, when the Remote Hub is not transmitting on a long-range channel. The main components of the coupling circuit 708 are transformer 709 and capacitor 710. According to some embodiments, the Edge Transmitter module may contain a GPS receiver, such as GPS receiver 718 shown in FIG. 7c. Alternately, the Edge Transmitter module may have access to the GPS signal from a GPS receiver located on another component of the Remote Hub, such as the Calculation and Display board, or on a mobile computing device used by an Installer. The Remote Hub may use the GPS signal to record its geospatial coordinates, and/or for synchronizing transmissions on a slotted channel so as not to collide with transmissions from other Remote Hubs. Additionally, a Remote Hub may be programmed to report its geospatial coordinates, or a function of its geospatial coordinates, on an Edge-to-Substation channel or to permit them to be read by a mobile computing device.

FIGS. 7a and 7b illustrate how the components of FIG. 7a may be arranged to conform to the shape of a form 2S electrical meter. As is apparent from FIG. 7b, transformer 709 and capacitor 710 may be large components. Shown here removed from the assembly to reveal the transformer, flux shield 715 normally covers transformer 709 to prevent magnetic flux from the large transformer from interfering with the metrology unit below it. Referring to FIG. 7a, the components of Power Supply 703 occupy a region of the Remote Hub module at the upper left, and the components of Class D amplifier 707 are shown at the upper right. In this embodiment, a single microcontroller 717 contains circuitry, a processor, and nonvolatile memory for firmware protocol stacks and network management logic 704, 705, and 713 (from FIG. 7c). The large components at the lower right are PLC coupling circuit 706, isolation circuit 711, and an amplifier capacitor 716 for the long-range edge transmitter. Connector 712 is the connector for interfacing with the other logic boards in the meter housing.

Figure 7D:
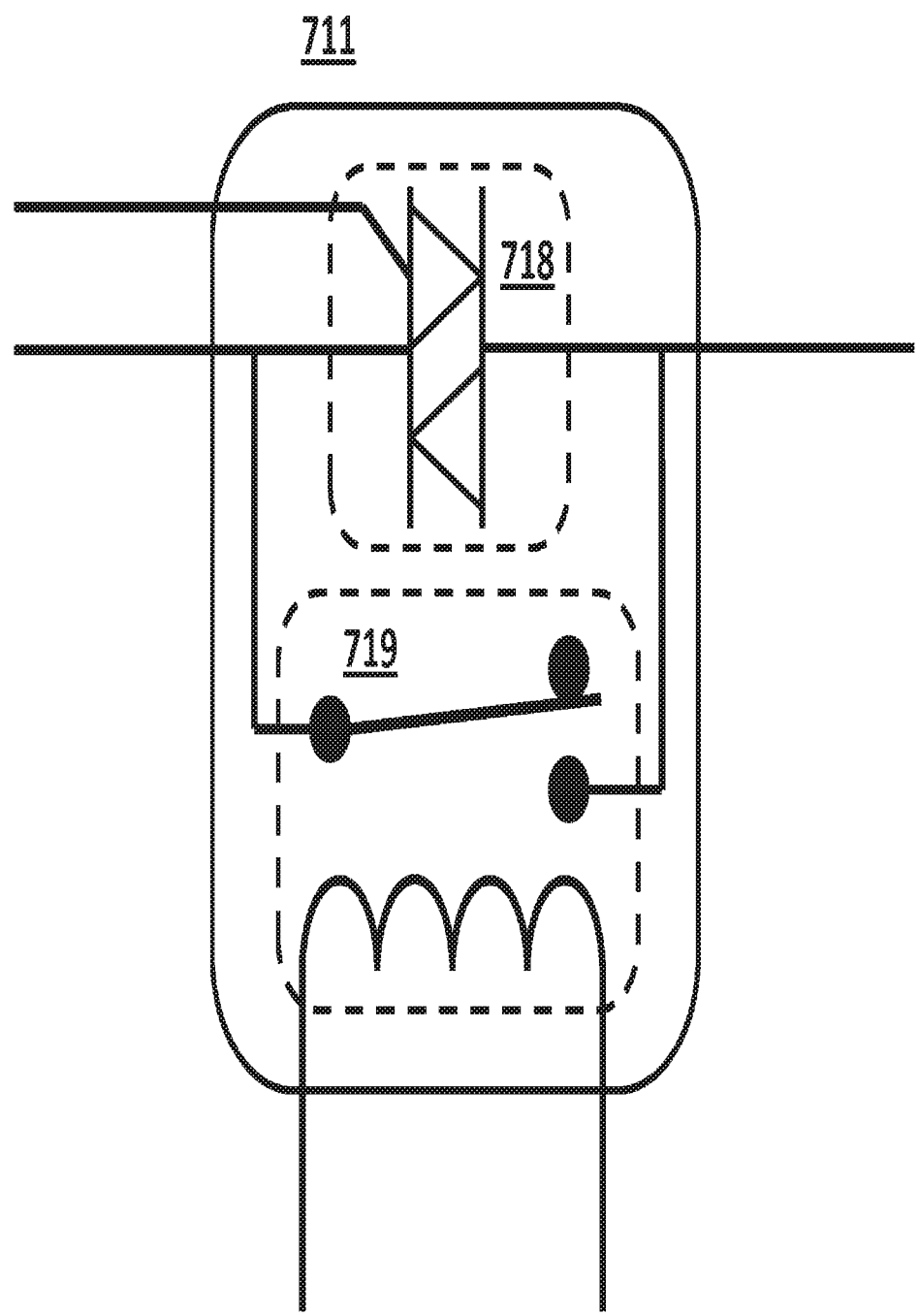
FIG. 7d is a detail of the isolation circuit of the Remote Hub.

FIG. 7d details the isolation circuit 711. This circuit provides the ability to disconnect the coupling circuit of the Edge-to-Substation transmitter from the power line. It is desirable that the Remote Hub be isolated from the power line except when it is transmitting. This is because the coupling circuit represents a substantial load when connected to the power line. The isolation circuit consists of a Triac 718 and a relay 719. The purpose of the Triac is to allow connecting to the power line at the time of a zero crossing of the line voltage. This prevents the generation of large transients that can damage components in the Remote Hub. Additionally, making the connection with the Triac removes the concern of arcing on the relay contacts that reduces the life of the relay. The sequence of events when a Remote Hub interacts with the power line is:

a. The Triac is closed at a zero crossing of the power line
b. The relay is closed
c. The desired action (generally a transmission) is performed
d. The relay is opened
e. The Triac is opened at a zero crossing of the power line.

Figure 8:
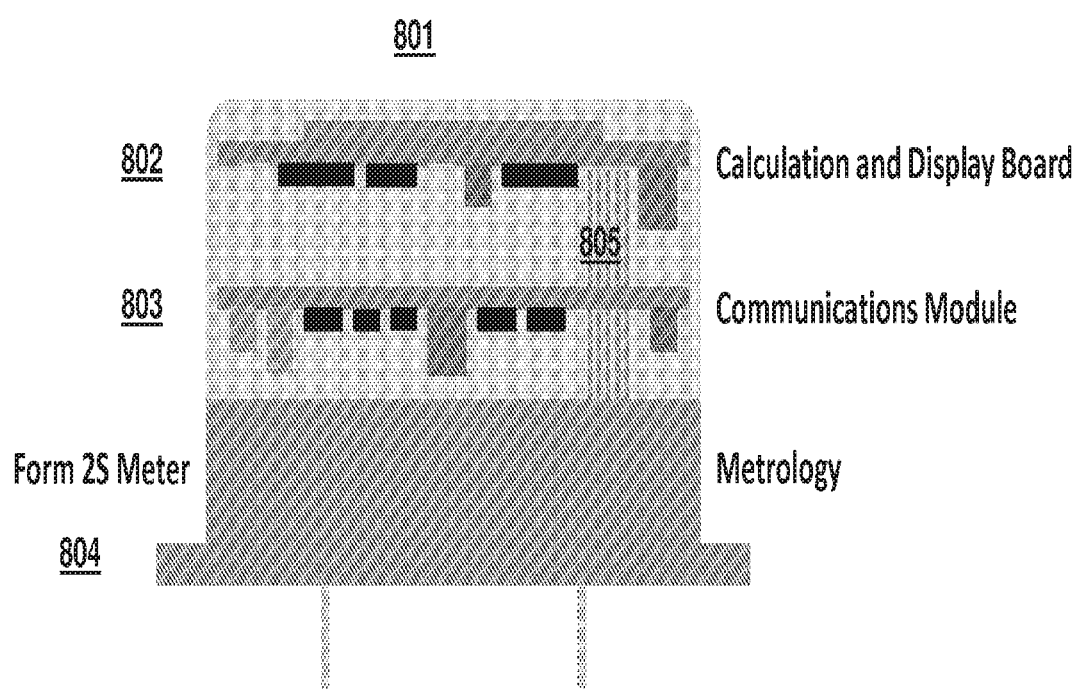
FIG. 8 is an elevation of a Subordinate Remote GLA Smart Meter.

FIG. 8 is an elevation of a standard Smart Meter 801 with a standard Calculation and Display Board 802 and a standard metrology unit 804. Meter 801 becomes a Subordinate Remote GLA Smart Meter with the addition of PLC communication capabilities on the Communications Module 803. The PLC communications components are small enough that they can share space on module 803 with the AMI communications circuitry if preferred. All three modules (if three are present) communicate via an interface, here, a serial interface or UART 805. Other embodiments may employ a different, functionally equivalent internal inter-component interface.

Figure 9:
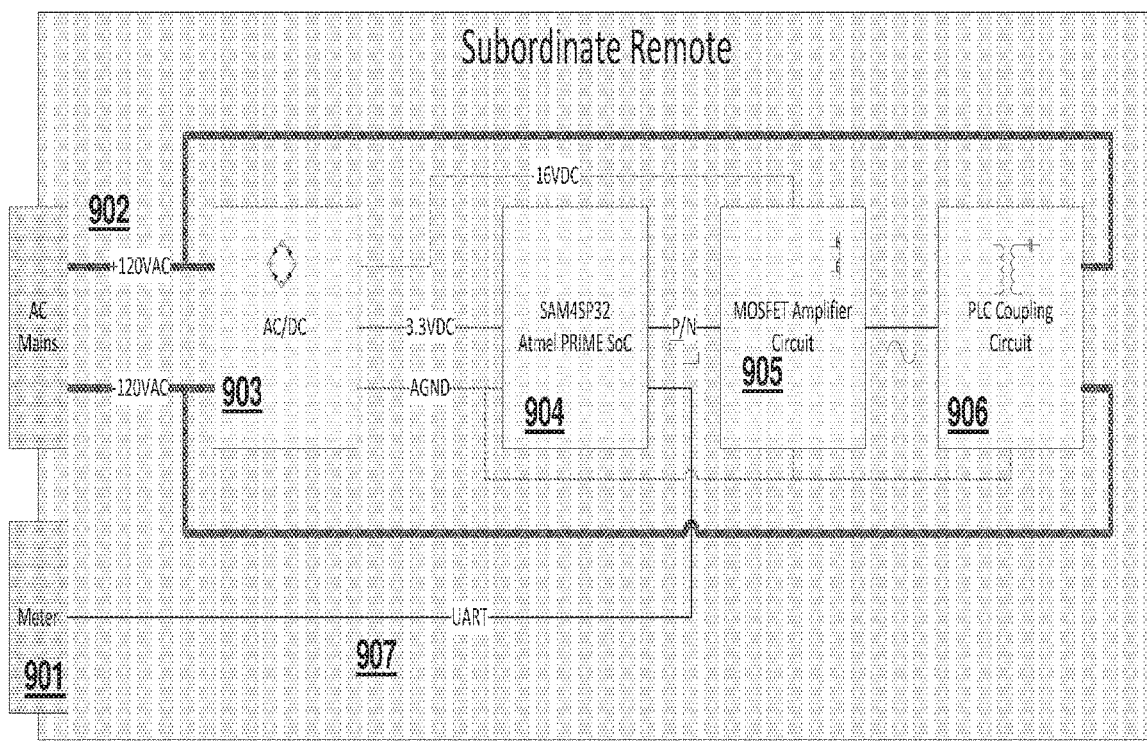
FIG. 9 is a schematic block diagram of the electronic components of the PLC communication module of a Subordinate Remote.

FIG. 9 is a schematic diagram of the PLC communications components on the Communications Module of one embodiment of a Subordinate Remote. By analogy with similar components on the Edge Transmitter Model in FIG. 7c, the communications module of a Subordinate Remote comprises the basic meter 901, power input from AC mains 902, interface to the basic meter 907, power supply 903, microcontroller unit 904, amplifier circuit 905, and PLC coupling circuit 906. The transmitter may be tuned to ensure that the signals are sufficiently attenuated by the service transformer not to be received above the service transformer or below adjacent service transformers. A Subordinate Remote may also contain a GPS receiver. Alternately, a Subordinate Remote may be programmed with its geospatial coordinates by means of a GPS receiver in a mobile device used by an Installer. A Subordinate Remote which knows its geospatial coordinates may report them over a Transformer Area Network to a Remote Hub. This allows the Remote Hub to compute extended geospatial information such as the area and extent of the TAN. The Remote Hub may report this extended geospatial information on an Edge-to-Substation channel, or the information may be read from the Remote Hub by a mobile device used by an Installer or other field engineer.

FIG. 10a illustrates both the characteristics of the low end of the frequency spectrum on a feeder-phase line of a typical distribution grid and the method employed by a Remote Hub's Edge Transmitter to inject current modulated signals onto the grid in such a way to allow all the TANs served by one substation transformer to be able to transmit scheduled Grid Location Awareness reports at least twice in each 24 hour period, and to additionally transmit alerts as necessary, without creating any of the difficulties described herein above which have been observed with prior art methods of on-grid transmissions. Important characteristics of the spectrum are the 50 Hz or 60 Hz power fundamental 1001, its harmonics 1002, and the noise floor 1003. It should be noted that from time to time a spike of impulse noise may exceed the usual noise floor. The defined channel or channels for modulated signals transmitted by an Edge Transmitter occupy a broad candidate spectrum lying between the 50 or 60 Hz power fundamental and the low-pass threshold of the service transmitters on the host power grid. The candidate spectrum for a particular substation is determined by measurement and set by policy and subject to regulatory constraints. Measurements determine which band or bands of the candidate spectrum are reliably received at each substation transformer. If a usable band is wider than the bandwidth needed for a reliable transmission, then the channel band may be defined to be variable. In such cases, the Remote Hub conducts measurements, described herein below, prior to transmitting to determine at present conditions which part of the wider channel is currently most favorable for transmitting. Conversely, at the Substation Receiver, the preamble detector samples the entire wide usable band, determining the actual band used by the transmitter based on where the preamble was detected.

FIG. 10a shows three frequency bands 1004, 1005, and 1006 which have been defined as channels for the long range Edge Transmitters The number of bands used as channels is not limited to three, nor are three channels always required. Transmissions on each channel are spread across a defined frequency band as shown using a broadband modulation technique such as the ones identified herein above. Additionally, transmission bursts may be constrained to occur in time slots such as 1007. Details of the slotting protocols are explained herein below.

Still referring to FIG. 10a, a typical frequency based channel of the present invention may span a wide enough area of the spectrum that several harmonics of the power fundamental occur within the channel. Because it is important to keep the amplitude of the injected, modulated current as near as possible to the noise floor and to minimize the amount of power used to transmit, in some embodiments of the present invention no signal is added to the spectrum at harmonics of the power fundamental. A shaping filter may be beneficially applied by the Edge Transmitter to avoid injecting current over the harmonics. This technique is also beneficial at the Substation Receiver, which may apply comb filtering so that the preamble detector and demodulator are not required to process the signal on the harmonics. This saves valuable processor capacity in the compute-intensive demodulation process.

When the modulation technique used is frequency spreading, each frequency band (such as 1004, 1005, and 1006) which is used as a channel is assigned at least one patterned code, or chip. The rate of frequency variation of the chip is much higher than the rate of variation of the data signal. The actual frequency-spread transmission injected as current on the channel is the exclusive or (XOR) of the channel's chip and the data signal. Adjacent and nearby channels are assigned mathematically orthogonal chips. The amplitude of the frequency spread current signals is as close as possible to the noise floor of the power line. This is beneficial in eliminating the problems associated with prior art PLC methods. For example, if a transmission on one channel is "folded over" into another channel due to crosstalk, the different encoding chips used causes the receiver to interpret the "stray" signal as noise, allowing the receiver to still extract the correct signal. Additionally, and regardless of the modulation technique, any harmonics from one channel which extend into adjacent channels will also be interpreted as noise. The result of this combination of channel access restrictions and modulation techniques is one or more low-frequency, high-quality current-modulated channels which can bear (in individual bursts) a raw data rate of 120 bits per second or more, or, by example, 80 bps after forward error correction, using interleaving techniques to distribute data bits and FEC bits to minimize the probability of loss of related bits due to impulse noise. Time-duration testing on a radial distribution grid, transmitting an average distance of 3.5 miles line of sight from the substation, yielded a frame error rate of 1.6e-6 using an FEC rate of ⅔ with frequency spread modulation. It is recognized that the method and apparatus described may additionally be operated at lower data rates than cited.

Figure 10B:
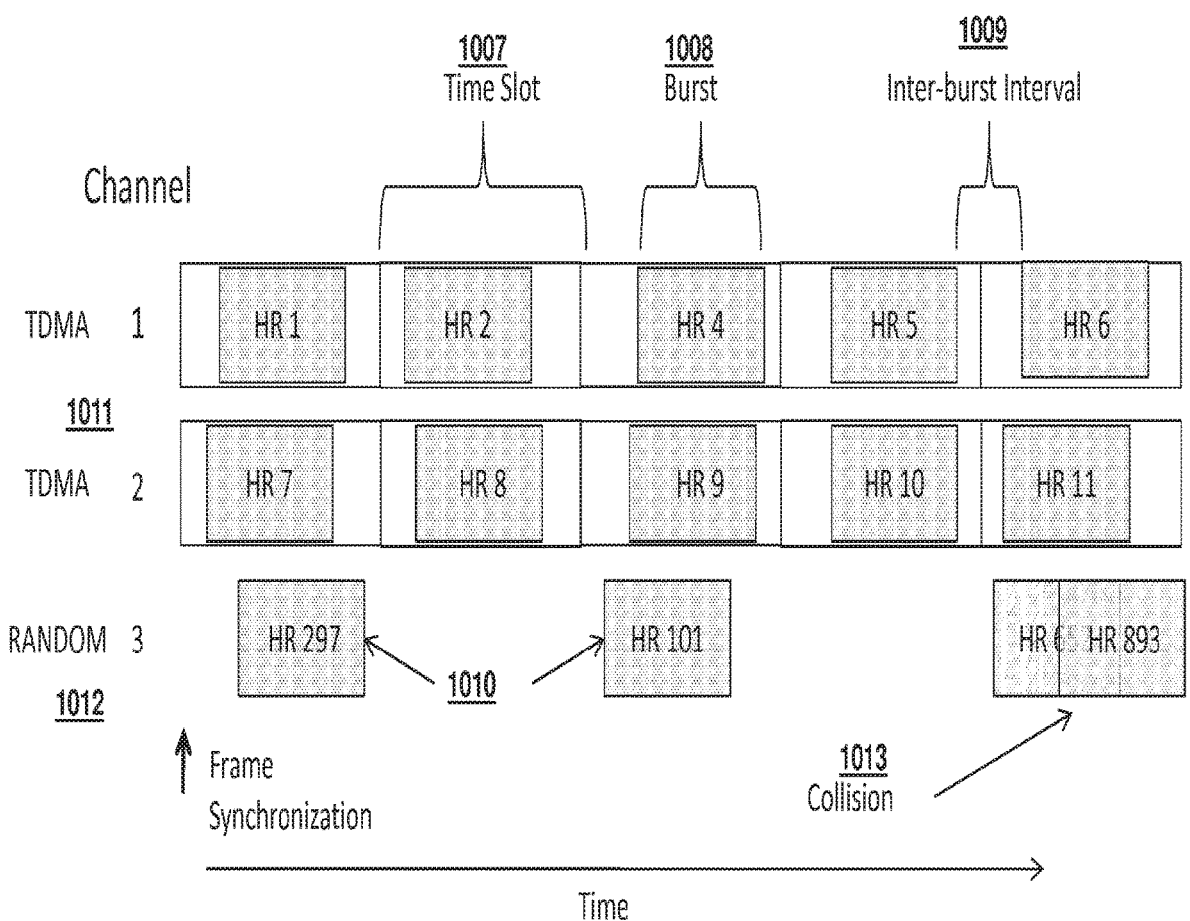
FIG. 10b provides a time-domain view of three Edge-to-Substation channels showing two scheduled and one unscheduled channel.

FIG. 10b illustrates one method of organizing a group of three reliable channels to support grid mapping. All three channels are organized into time slots 1007, within which Remote Hubs are provisioned to transmit around a 5-second burst 1008 with around 1 second of silence prior to the burst and around 1 second of silence after the burst. This yields an inter-burst interval 1009 averaging 2 seconds long. Different time intervals may also be used. The reason for the long inter-burst interval in the illustrated embodiment is that the mechanism for synchronizing the transmitter clocks may be an AMI network, and the AMI synchronization mechanism, being typically based on a mesh or cellular wireless architecture, is no more precise than plus or minus one second. Collisions (overlapping transmissions) on the same channel must be prevented because they will destructively interfere with one another if they were modulated using phase-shift keying or the same chip. In one embodiment of the invention, each data-bearing frequency-spread channel is assigned a plurality of chips instead of one. For example, if the number of chips per channel is two, then transmissions on even-numbered time slots use one chip, and transmissions on odd-numbered time slots use another, mathematically orthogonal chip. Using multiple chips may allow data-bearing capacity of the channel to be increased by reducing the inter-burst interval, as overlaps of adjacent transmissions may still be decoded. The ordinal number of a time slot is determined with respect to a Master Frame Origin, which may be defined as beginning at midnight local time of each day, or may be established by a variety of methods as described in U.S. patent application Ser. No. 13/566,481 already referenced and incorporated herein.

Two of the channels 1011 in FIG. 10b have a scheduled organization. This means that each Remote Hub is assigned specific time slots in which it may transmit on the channel. A third channel 1012 is still organized into slots, but any Remote Hub with an exceptional condition to report may attempt to transmit in any time slot, provided that it has not alerted recently. Specifically, channel 1012 is organized by the method known as slotted aloha. Alerts, when received at the substation, are typically acknowledged via a Substation-to-Edge channel such as a wireless AMI network. If available, other methods for acknowledging alerts may be employed. If no mechanism for acknowledging alerts is available, then each alert can simply be transmitted multiple times, with a randomly selected number of slots having elapsed between the transmissions. This, however, reduces the data bearing capacity of the alerting channel 1012, because in standard slotted aloha, alerts are retransmitted only if they are not acknowledged. The rate of message failure will be the frame error rate of the channel (already disclosed to be very low) plus the rate of collisions. The rate of collisions in turn depends on the offered load, which is based on the probability that more than one Remote Hub will attempt to transmit in a given slot. The optimum number of unacknowledged retransmissions to maximize message success rate is likely to be a small number such as two or three, because with higher transmission rates channel saturation may occur.

The organization of an unscheduled channel may also use an un-slotted protocol similar to pure aloha, wherein the channel is not divided into time slots, but wherein a transmitter may attempt to transmit at any time, given that it has not already transmitted within a predefined recent interval. In this organization, alerts may preferably be retransmitted only if not acknowledged within a predetermined period of elapsed time, or they may routinely be transmitted a multiplicity of times if acknowledging alerts is impossible or undesirable.

The number and organization of channels described is by example only. On some substations, only one reliable channel may be available. When only one channel is used, either because of conditions or by design, a plurality of time slots may be reserved for alerting, while other time slots are scheduled. On some substations, a plurality of reliable channels will be identifiable. The number of scheduled channels needed depends on the number of Remote Hubs and the number of scheduled messages each Remote Hub must send in a 24-hour period. In one embodiment, two channels are sufficient to permit 12,000 hubs to transmit twice daily. If (as is usual) the substation transformer supplies many fewer than 12,000 hubs, fewer channels than are available are required for scheduled messages, alert thresholds may be lowered, and more than one channel may be dedicated to alerts to accommodate the higher offered load. FIG. 10b shows four alerts transmitted in the time interval shown. Two of the alerts 1010 have a high probability of being detected at the substation receiver. The alerts 1013 have collided in FIG. 10b and will not be received correctly. FIG. 10e, conversely, illustrates how the use of chips selected by means of the modulus of the time slot prevents some collisions. Here, because of poor synchronization of clocks, message 1014, transmitted in an even-numbered slot of random slotted channel 1012, has overlapped with message 1015, transmitted on the same channel in the subsequent odd-numbered slot. Both messages are decipherable at the substation because they were encoded using orthogonal chips. This is in contrast with the situation in FIG. 10b, where the intent of the two transmitters of messages 1013 was clearly to attempt to transmit in the same slot. These messages would still collide even if multiple chips were in use. In yet another embodiment of the invention, an unscheduled, unslotted channel might use frequency spread modulation and be assigned a plurality of orthogonal chips. A transmitter offering a message would select a chip from the plurality of chips at random, thereby reducing the probability that the message would collide with another transmission on the same channel at an overlapping time.

Figure 10C:
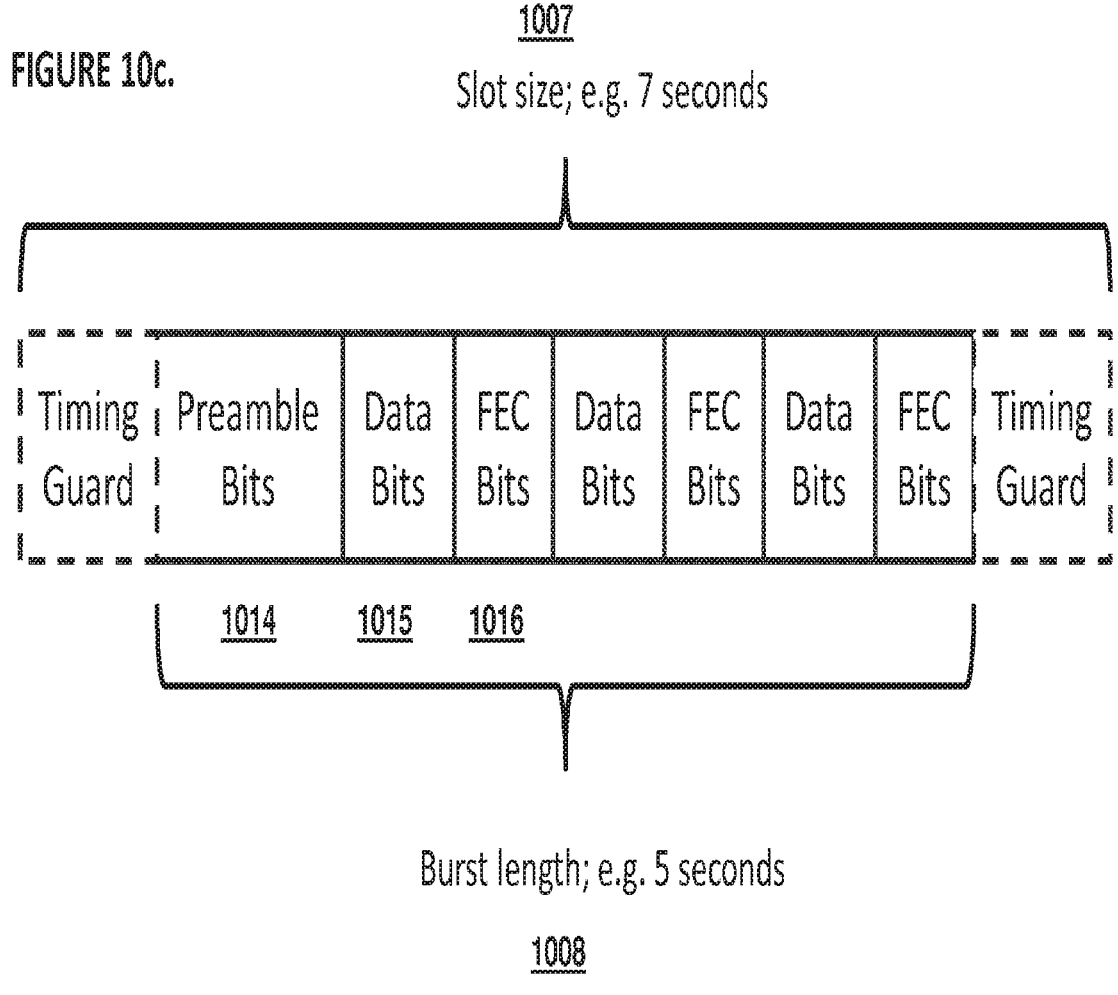
FIG. 10c illustrates a typical structure of a single Edge-to-Substation message burst in one embodiment of the invention.
Figure 10D:
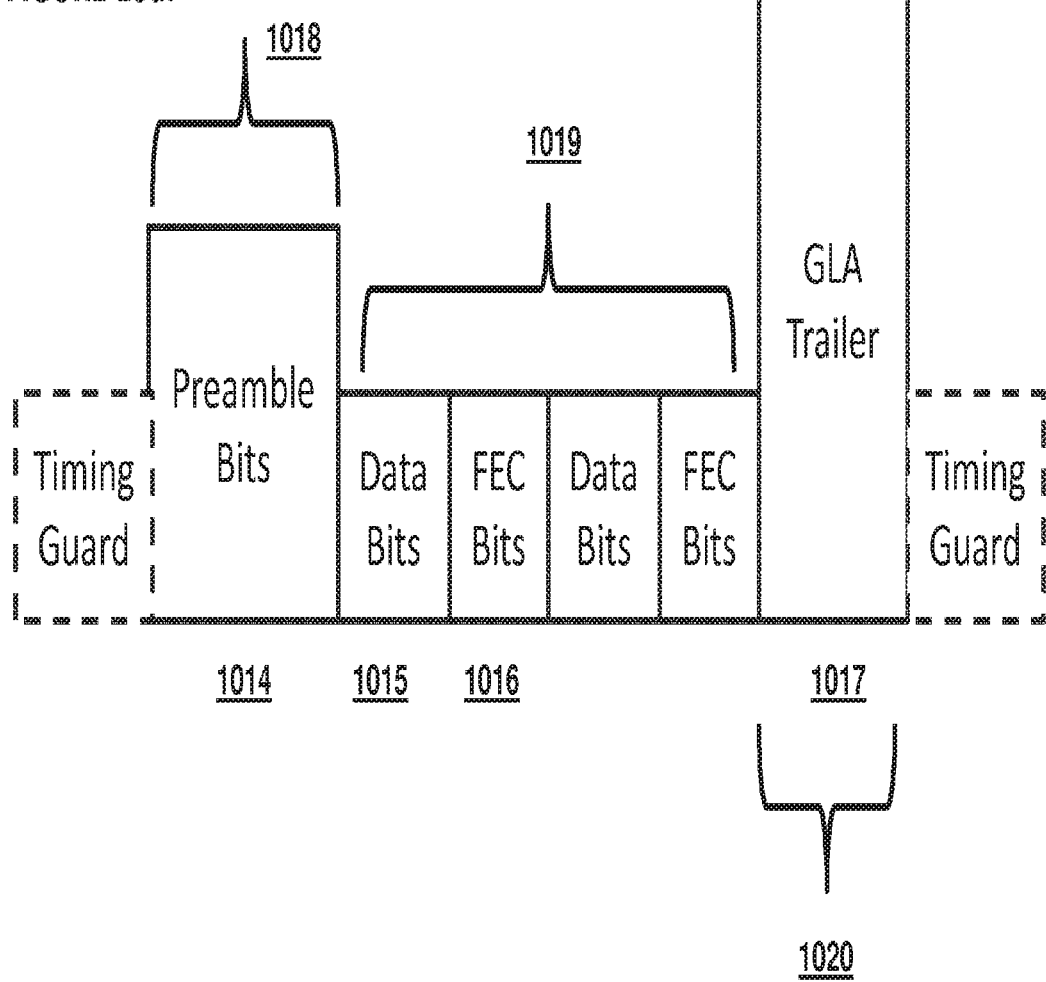
FIG. 10d illustrates an alternative structure of an Edge-to-Substation message burst in another embodiment of the invention.
Figure 10E:
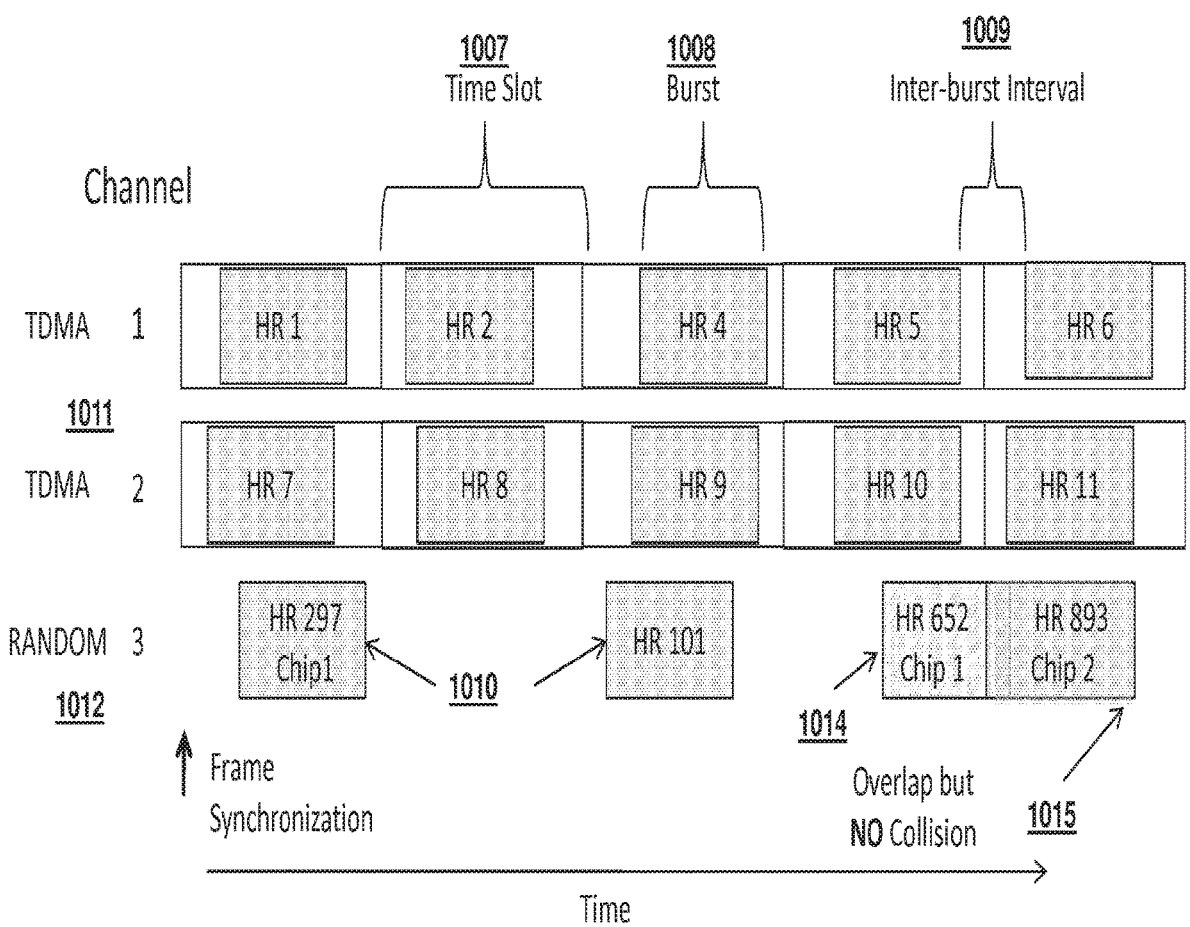
FIG. 10e illustrates how using multiple chips on the same frequency band may prevent collisions.

FIG. 10c illustrates the detailed organization of a typical single transmission burst, whether it occurs on a scheduled channel or a slotted alerting channel according to one embodiment. Within Time Slot 1007 and burst 1008, the message is comprised of preamble 1014, interleaved data bits 1015 and FEC bits 1016. The preamble is the same for all messages on the channel. The FEC rate is not drawn to scale, and may be varied as needed from substation to substation based on the quality of the available channels. In some grid locations and/or with some modulations, FEC may not be required. FIG. 10c without further elaboration may appear to imply that the bandwidth is the same for all transmissions in the same channel, and that the pattern used for preamble detection is also suitable for use by a Substation Receiver when sampling and comparing signals on several inputs representing different phases of different feeders to infer the line on which the signal was actually transmitted. Some embodiments of the invention may require greater bandwidth for preamble detection than the data-bearing segment of a message requires. Additionally, in some embodiments, the grid location of a Remote Hub transmitter may be better inferred from a special transmission, called a probe transmission, again measured at the substation on all phases of all feeders monitored by a Substation Receiver. The probe transmission may consist of known modulated signal, or it may consist of pure tones. The pure tones may be transmitted as a sequence of single tones, or one or more groups of pure tones may be transmitted simultaneously. The frequency range of the probe transmission may be different from that of the other message sections. FIG. 10d illustrates this bandwidth variation, showing one bandwidth for the preamble 1018, another bandwidth for data-bearing message 1019, and a third bandwidth for GLA trailer 1020. GLA trailer 1020 is not present in all embodiments of the invention, because the probe transmission may be present within preamble 1018. In another embodiment, the probe transmission may precede the preamble rather than following the message. Generally, the segments of a message may be transmitted in any order as long as the order is known by the receiver.

Figure 11:
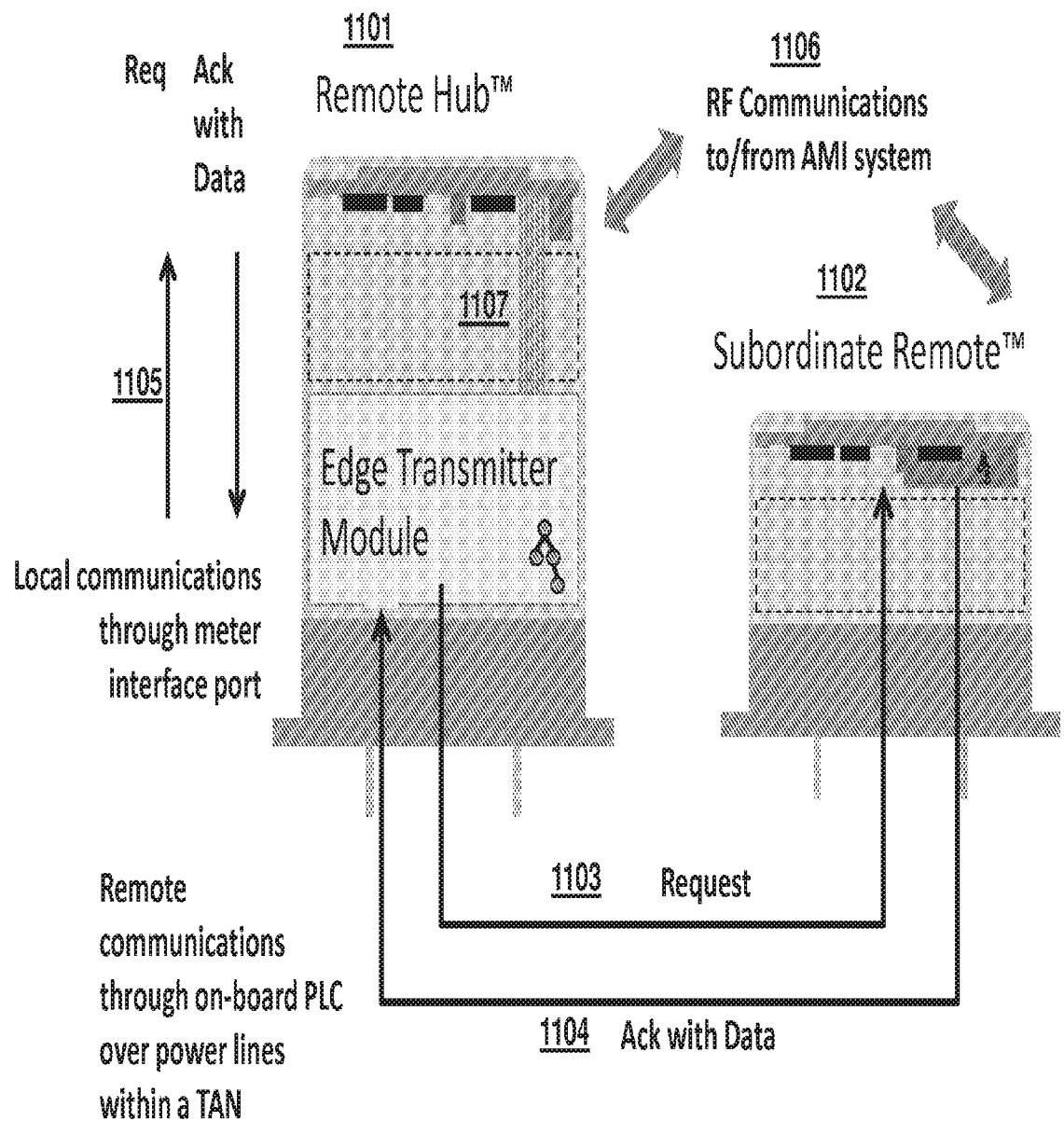
FIG. 11 illustrates communication paths local to the Transformer Area Network, both within a GLA Smart Meter and between the Remote Hub and a Subordinate Hub. Note that in FIG. 11 the elevations of the Remotes depict embodiments where a secondary communication module is not employed.

FIG. 11 shows a Remote Hub 1101 and a Subordinate Remote 1102 illustrating the local communication paths within a TAN according to one aspect of the invention. This figure shows an embodiment where the Communications Module is not separate from the Calculation and Display Module. The Remote Hub 1101 may poll each known Subordinate Remote, via a PLC protocol such as PRIME or G3 using request path 1103. (To allow for the use of different PLC protocols, the specific language of these standards is not used herein. By way of example, if the PLC protocol in an embodiment of the invention were PRIME, then the Remote Hub would be a PRIME base node and all other nodes would be service nodes.) A polled Subordinate Remote 1102 retrieves the requested data from the Smart Meter and formats it into a response which is transmitted as a response 1104. The Remote Hub's Edge Transmitter Module communicates with the Communications Module and Calculation and Display Board components via UART 1107, using a simple request/response protocol 1105 which may vary from one Smart Meter vendor to another. Data path 1106 illustrates that both the Remote Hub and the Subordinate Remote are members of the AMI and will be transmitting meter data to the AMI head end in addition to performing TAN-related activities. The Remote Hub, in its role as TAN manager, may make use of the AMI or other alternative, integrated channels in ways that Subordinate Remotes may not. Only the Remote Hub is capable of sending out messages on the Edge-to-Substation channel. A Remote Hub may also send messages on alternative, integrated outgoing channels such as the AMI. The Remote Hub may additionally receive data blocks from a Substation-to-Edge channel, whether the Substation-to-Edge channel is provided by the AMI or other means. Such data blocks may contain, but are not limited to, alert acknowledgements, firmware update broadcasts, and policy changes. Meter clock synchronization messages are part of the native AMI protocol, but the Remote Hub may obtain the synchronized clock time from the Calculation and Display module when an AMI is present.

Remote Hub 1101 has the capability to function in multiple operating modes. The Remote Hub may function as a Subordinate Remote. The Remote Hub may also function as a hybrid of Remote Hub and Subordinate Remote, called a Proxy Hub. When a Remote Hub 1101 is first installed, it monitors the PLC frequencies on the TAN for a period of time sufficient to determine whether another Remote Hub is already present. The wait time consists of a fixed period of time plus an additional period of time computed by a randomization function when the device is powered on. The fixed period of time is sufficient to ensure that a Remote Hub operating in the master mode would have executed its discovery algorithm, which would be detected by the newly installed Remote Hub if another Remote Hub is operating within range. Typically, "within range" means powered by the same service transformer, but exceptions occur. The means of handling the exceptions are described herein below.

If a first Remote Hub is already present, Remote Hub 1101 indicates by means of a light or digital display on the face of the Smart Meter that another Remote Hub is present. At this point, an installer may elect to leave redundant Remote Hub 1101 in place, or replace it with a Subordinate Remote unit. If left in place as a "spare," Remote Hub 1101 continues to function as a Subordinate Remote, and the first Remote Hub continues to act as the Remote Hub and master node in the TAN. If no other Remote Hub is present, Remote Hub 1101 begins to operate as a master PLC node on the TAN, discovering and storing a list of any Subordinate Remotes 1102 in the same TAN. A Remote Hub may also enter a third mode, Proxy Hub, as described below. As soon as it takes on the master or hub role, Remote Hub 1101 obtains the network system time if available, for example by querying the AMI logic in the Smart Meter, and formats, encodes, and transmits a provisioning request on an Edge-to-Substation channel reserved for provisioning requests and alerts. When a Substation Receiver detects the provisioning request, it may cause a provisioning response to be sent, either via the AMI, or via an available on-grid or wireless Substation-to-Edge channel. Provisioning data may also be supplied to a Remote Hub by means of a handheld device or drive-by transmitter employed by the installer. The handheld device uses a personal-area wired or wireless protocol, such as Bluetooth, infrared, USB, or RS232 to program the Remote Hub. In embodiments of the invention where the Substation-to-Edge channel is absent or very constrained, the Remote Hub may be provisioned via handheld without knowledge of the inferred grid location of the Remote Hub. The same short-range protocol, in a handheld or drive-by device, may be used to distribute firmware or policy updates to Remote Hubs that lack a permanent Substation-to-Edge channel. It is sometimes desirable to activate a policy or program change simultaneously on a collection of Remote Hubs. If the Remote Hubs must be updated by means of a personal-area protocol, the programming device converts the desired future activation time to a relative wait time as each Remote Hub is programmed, so that even though the Remote Hubs were programmed at different times, they will activate the updated programming at approximately the same future time. Remote Hubs may be manufactured with a default policy, or pre-loaded with a default policy after manufacturing but before installation, so that if no policy is provided at or subsequent to installation, the Remote Hub still has a rule for operating.

The provisioning data provides the Remote Hub with the information it needs to manage the TAN, including the location of, and organization of, other channels on the Edge-to-Substation network, and the ordinal or sequence number of slots on scheduled channels on which this Remote Hub has permission to transmit. When the Remote Hub discovers Subordinate Remotes, it transmits pairing messages on the Edge-to-Substation channel to inform the Computing Platform that it is in communication with the newly discovered Subordinate Remotes. Pairing messages may be transmitted on an alerting channel or on a scheduled channel depending on a policy established by the network. When a Remote Hub acting in the master role has discovered another Remote Hub on the same transformer and phase operating in the subordinate role, the resulting pairing message indicates this. Including the presence of "spare" Remote Hubs in the Grid Map may provide a cost savings and more rapid recovery, in that if the master Remote Hub should fail, the TAN may be reconstructed by allowing the spare Remote Hub to assume the master role. The master Remote Hub may cache its policy information on a spare Remote Hub, if present, in order to allow the failover to occur even without re-provisioning the TAN.

Hereinafter are disclosed methods for properly partitioning Remote devices into TAN groupings. PLC transmission power is controlled in order to keep the signal that gets through the Service Transformer low enough to avoid interference with other TANs. Specifically, unless special accommodations in configuration are made as described herein below, a Remote Hub must poll and collect data from only Subordinate Remotes on the same phase of the same service transformer as the Remote Hub. However, at certain sites on some grids, it may happen that at PLC standard power and frequencies, the PLC transceivers in the Remotes may be able to discover Subordinate Remotes and Remote Hubs on other phases of the same service transformer, or even on adjacent or nearby service transformers. In this aspect of the invention, the detectable remotes may be partitioned wherever possible so that each TAN comprises exactly one master Remote Hub and all Subordinate Remotes, or Remote Hubs acting as Subordinate Remotes, on the same phase of the same service transformer, and no Remotes of any type which are on a different phase or a different service transformer.

In one embodiment of the invention, a Remote Hub's PLC protocol stack executes its discovery process, which involves transmitting a beacon tone or message that causes other nodes in the vicinity to respond. The first time this is executed, a standard initial power level is used. The TAN management layer of the Remote Hub, operating above the PLC protocol stack, obtains the list of discovered Remotes of any type. The Edge Transmitter of the Remote Hub is then employed to send a pilot signal at sufficiently low amplitude and high frequency that the pilot signal will not be detectable on the high-voltage side of the service transformer. (This pilot tone is not the same as a PLC discovery beacon.) The pilot signal begins on a zero crossing of the power fundamental of the phase on which the transmitter resides. Other Remotes (of any type) which detect the pilot signal test to determine if the received signal began on the zero crossing of the phase on which the receiving Remote resides. If so, the receiving Remote sends a positive response on the PLC channel and records the identity of the Hub Remote that sent the pilot tone. Another Remote Hub on the same phase as the pilot transmitter enters Subordinate Remote mode and will be considered a spare. Subordinate Remotes on other phases do not respond to the pilot tone. A Remote Hub that detects the pilot tone but is on a different phase sends a negative response. The transmitting Remote Hub uses the responses to update its inventory of TAN devices discovered automatically by the PLC discovery process, recording the list of Subordinate Remotes and spares on its home phase, and the list of Remote Hubs on other phases of the same service transformer. Remote Hubs which sent neither a negative nor a positive response are presumed to be on another service transformer. If this case exists, the value of the "initial" power level (amplitude) for the PLC discovery beacon is reduced, so that next time the full discovery process is executed, it will be less likely that any Remotes on other service transformers will respond.

Next, the first Remote Hub that transmitted the pilot tone examines the list of negative responders, that is, of Remote Hubs on a different phase. It selects one such second Remote Hub and orders it via the PLC protocol to transmit a pilot tone of its own. The first Remote Hub, still the master node of at least all the nodes on the service transformer, collects the resulting positive and negative responses and updates its inventory and partitioning data. At this point, any spare Remote Hubs on the same phase as the second Remote Hub have also entered Subordinate Remote mode, and the first Remote Hub now has a complete partitioning of Remote Hubs according to phases, the Remote Hubs on the third phase, if present, being the intersection of the Remote Hubs sending negative responses to the first Remote Hub with the Remote Hubs sending negative responses to the second Remote Hub.

If a third phase is present, the first Remote Hub now selects a third Remote Hub from the third phase, and orders it via the PLC protocol to transmit a pilot tone and return the list of negative and positive responses it received. At this point, a positive response will have been received from every Subordinate Remote on the service transformer, the phase and mode of every device on the service transformer is known, and a potential master Remote Hub for each single-phase TAN has been identified. Additionally, any node which responded to the original PLC discovery process from outside the transformer area has been identified.

Now the first Remote Hub sets its PLC transmission amplitude to a very low level and polls each remote. This first amplitude should be so low that no remotes respond. The first Remote Hub increases its transmission amplitude until, ideally, all remotes on the same phase and no remotes on another phase respond. The first Remote Hub records this low threshold level and then continues to increase the amplitude until a remote on another phase responds. The first Remote Hub records this as its high threshold level.

Now the first Remote Hub commands the second Remote Hub via PLC to attempt to take on the role of PLC master node for its phase, sending in the command the low and high threshold amplitudes. This is called the partitioning command. The second Remote Hub sets the PLC transmission amplitude to the low threshold amplitude, and restarts its PLC stack as a master node, conducting a PLC discovery process of its own. If the second Remote Hub discovers all the Subordinate Remotes and spares on its own phase and no nodes on any other phase, then has become the master of a single-phase TAN and the partitioning step has succeeded. Otherwise, it raises its PLC transmission amplitude and repeats the process until the partitioning step succeeds. If the second Remote Hub reaches the High Threshold amplitude without having discovered all the Remotes on its phase, or if at any amplitude a Remote from a different phase is discovered when no lower amplitude discovers all the Remotes on the same phase, then the partitioning command has failed. The second Remote Hub signals the failure of the partitioning command to the first Remote Hub by using its Edge Transmitter to transmit a status beacon detectable by the First Remote Hub, since the first and second Remote Hubs can no longer communicate via PLC.

If the first Remote Hub detects no failure beacon from the second Remote Hub, and a third phase is present, the first Remote Hub sends a partitioning command to the third Remote Hub, which carries out the partitioning step as described.

Figure 12A:
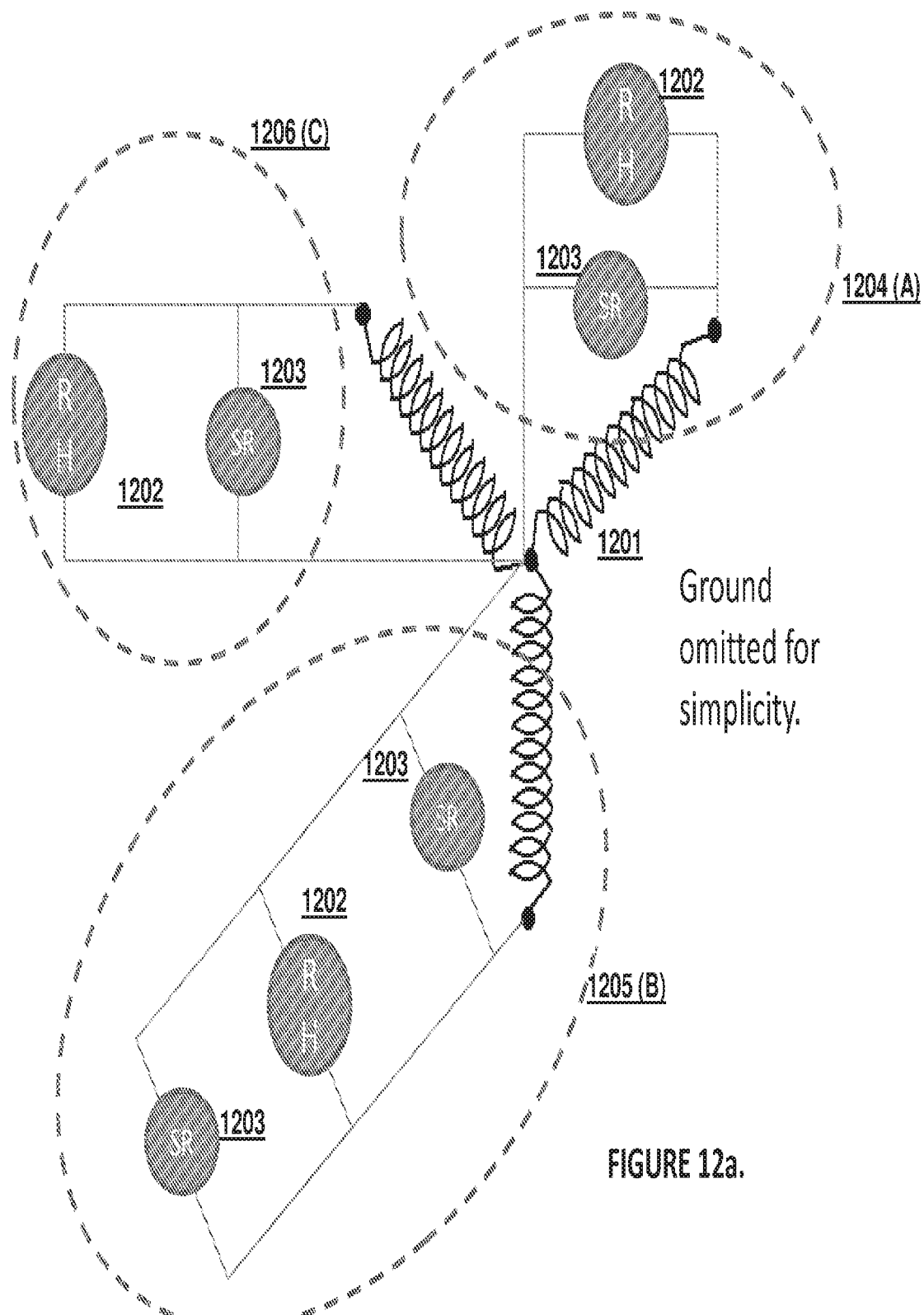
FIG. 12a illustrates a three-phase service transformer with three TANs.

When the first Remote Hub has partitioned the other phases present without having received a failure beacon, then it carries out the partitioning step itself. If the first Remote Hub's partitioning step succeeds, then the service transformer is successfully partitioned into three single-phase TANs, as shown in FIG. 12a. In another embodiment of the invention, the second and third Remote Hubs may employ a failure beacon and a success beacon. Use of the success beacon may shorten the time required to complete the partitioning steps.

Referring now to FIG. 12a, which is a simplified schematic drawing of a three-phase service transformer and the meters that it supplies with power. This service area contains three TANs 1204, 1205, and 1206, one for each phase of the service transformer. Each TAN contains a Remote Hub 1202 and zero or more Subordinate Remotes 1203. Any Subordinate Remote may actually be a spare Remote Hub. FIG. 12a illustrates a proper partitioning of the Remotes powered by a three-phase transformer following the discovery and partitioning algorithm described herein above.

Figure 12B:
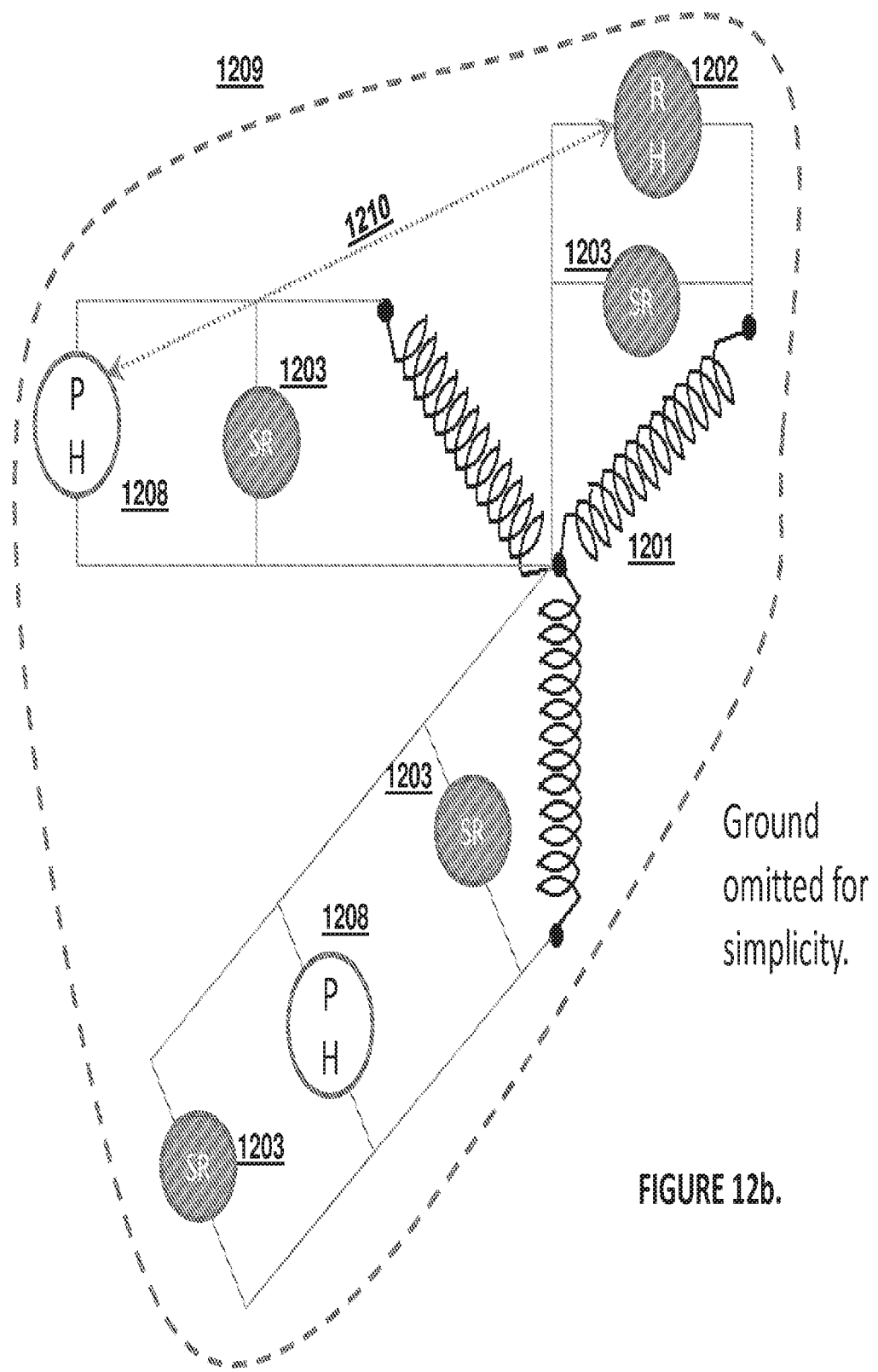
FIG. 12b illustrates a three-phase service transformer with one TAN and Proxy Remotes.

As is clear from the above description of a discovery and partitioning algorithm, it is possible that for some multi-phase transformers there is no set of PLC transmission frequencies that will yield a clean partitioning of the Remotes on the service transformer into single-phase TANs. When the partitioning algorithm fails at any step, the first Remote Hub attempts to form a multi-phase TAN which includes all Remotes on all phases of the service transformer, but no Remotes which are not on the service transformer. Refer now to FIG. 12b, which illustrates a multi-phase TAN. Recall that the first Remote Hub already has an inventory of all Remotes on any phase of the service transformer, and that it further is aware which node on each phase are Remote Hubs. Beginning with the previously recorded "initial" PLC transmission amplitude, the first Remote Hub initiates a PLC discovery process. If any Remotes are discovered which are on a different service transformer, the first Remote Hub lowers the PLC transmission amplitude, superseding the old value of the "initial" amplitude, and restarts the discovery process, repeating this until all and only the Remotes known to be on the service transformer are discovered. If a new Remote never before detected is found, the pilot beacon method above is used to determine the phase of the new Remote and whether it is on the same service transformer as the first Remote. If no transmission amplitude can be found that discovers all and only Remotes on the same service transformer as the first Remote Hub, the first Remote Hub transmits a distress alert on an Edge-to-Substation channel and organizes the TAN at the highest amplitude which does not discover any nodes outside the service transformer, even if some nodes on the service transformer are unresponsive.

For Grid Location Awareness and the energy management applications that depend on the Grid Map to be effective, probe transmissions must originate from each phase of the Service Transformer. To accomplish this, the first Remote Hub. Master 1202 in FIG. 12b, sends commands to the second (and third, if present) Remote Hubs 1208, causing them to operate as Proxy Hubs. A Proxy Hub behaves like a Subordinate Remote on the TAN, except that it is responsive to certain commands from its master Remote Hub that allow the Remote Hub to control the Proxy Hub's Edge Transmitter. Remote Hub 1202 stores the Edge-to-Substation provisioning policies that would normally be carried out by the Proxy Hubs 1208. Remote Hub 1202 carries out all the TAN management activities, such as polling the Subordinate Remotes, distributing updates, and computing derived results, for the Remotes, including Proxy Hubs, on all phases present. When it is time for a Proxy Hub to send an Edge-to-Substation transmission, the first Remote Hub 1202 formats the appropriate message and sends it to the Proxy Hub over the TAN. The Proxy Hub then retransmits the message on the Edge-to-Substation channel. In this way, Edge-to-Substation transmissions are always transmitted on the correct phase, even though the TAN master is on a different phase.

The partitioning and discovery methods disclosed above are designed to accommodate a standards-based PLC protocol stack such as PRIME. Use of alternative short-range PLC protocol stacks may require minor modifications to the methods. More straightforward methods may also be used in cases where customizations to the lower layers of the protocol stack are allowable.

Another aspect of a Remote Hub's channel management capability is that the Remote-hub may pre-modulate and store certain messages which do not contain variable data and may be sent repeatedly. Examples of pre-recordable messages include messages sent on the provisioning channel, such as the provisioning request and standard alerts on conditions such as sags, over-voltages, and the like. This strategy saves computing power at the Remote Hub. When policy changes such as changes in chip, channel placement, baud rate, FEC rate, and bandwidth occur, pre-modulated recordings may need to be discarded and re-computed. This may be done during idle periods when the Edge Transmitter's microcontroller CPU is not busy with preparing scheduled messages. To accommodate this, such policy changes may be announced in advance to take effect at a known future time as opposed to becoming effective immediately.

In some embodiments a Remote Hub may not be integrated into a GLA Smart Meter, but instead may be associated with another feature of a medium voltage distribution grid, such as a capacitor bank, step-down transformer, voltage regulator, storage battery, local generator, or switch set. The Remote Hub may be integrated with local or remotely controlled SCADA systems associated with the feature. The SCADA system may provide an Edge-to-Substation channel for provisioning Remote Hubs used in this manner, or the Edge-to-Substation channel associated with Remote Hubs in Smart Meters may also be operable to communicate with such feature-based Remote Hubs. Such Remote Hubs may incorporate a version of a Substation Receiver and be operable to send Pairing Messages associating the grid feature with other Remote Hubs electrically and schematically subordinate to the grid feature. A Remote Hub may also be embodied as a standalone device plugged into an electrical outlet. A form of Substation Receiver may additionally be associated with such medium voltage grid features, or any intermediate point on the medium voltage distribution grid. Such an intermediate Receiver may collect information regarding which Transformer Area Networks are impacted by an associated medium-voltage grid feature. The combination of such a secondary Receiver and Remote Hub may be employed to control intermediate grid features, such as using a switch or relay to isolate a microgrid or balance the load on a plurality of substations, or to alter the set-point on a voltage regulator.

In a further aspect of the invention, a Remote Hub may carry out line measurements to determine locally optimum conditions for transmitting. The Remote Hub always has the option to vary the amplitude of the injected signal, and may additionally have the option to vary the frequency band of the data bearing segment of the transmission.

To conduct the measurements, the Remote Hub transmits a sequence or simultaneous combination of pure tones. These tones may be independent of an actual message transmission, or they may be incorporated in the message preamble. Recall that the bandwidth of the preamble may be different than the bandwidth of the data-bearing segment of the transmission. If there is an opportunity to choose the frequency band of the data bearing segment, then the tones must span the entire available spectrum. When the tones are transmitted, the current generated at the requested voltage is measured. The relationship between the requested voltage and the generated current is calculated at each frequency. The result will be proportional to the line impedance of the grid at the Remote Hub for each frequency. This allows the Remote Hub to determine both how much drive voltage is required to generate the desired current at each frequency in the available frequency band, and, if there is a choice of frequency bands to use, to select the frequency range that requires the least voltage to achieve the desired current. In some embodiments where a Substation-to-Edge channel is available and has sufficient capacity, the Computing Platform may from time to time send feedback from the Substation Receiver about the messages as received. This may allow the Remote Hub to refine and calibrate its measurement process. Outcomes of this feedback may include changing the slot assignments and/or modulation methods of individual Remote Hubs and/or an entire channel to improve message success rate.

The foregoing description of the invention has been presented for purposes of illustration and description and is not intended to be exhaustive or to limit the invention to the precise forms disclosed. Obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method comprising:
   sending, by a first remote hub comprising a processor device, a first pilot signal on a first phase of a plurality of phases of an electrical distribution grid to which the first remote hub is coupled, the first remote hub being coupled to the first phase on a low voltage side of a transformer;
   receiving, from a second remote hub coupled to the first phase, a first acknowledgement message;
   in response to the first acknowledgement message, updating an inventory to identify the second remote hub as being coupled to the first phase on the low voltage side of the transformer;
   receiving, from a third remote hub, a negative acknowledgement message; and
   in response to the negative acknowledgement message, updating the inventory to identify the third remote hub as being coupled to a second phase on the low voltage side of the transformer.

2. The method of claim 1 further comprising sending, by the first remote hub to the third remote hub, a message instructing the third remote hub to initiate a second pilot signal on the second phase.

3. The method of claim 2 further comprising:
   receiving, from a fourth remote hub coupled to the second phase on the low voltage side of the transformer, a second acknowledgement message; and
   in response to the second acknowledgement message, updating the inventory to identify the fourth remote hub as being coupled to the second phase on the low voltage side of the transformer.

4. The method of claim 3 further comprising:
   iteratively transmitting, onto the first phase, a poll signal, wherein at each successive iteration an amplitude of the poll signal is increased; and
   recording an amplitude of the poll signal wherein the second remote hub responds to the poll signal and neither the third remote hub or the fourth remote hub respond to the poll signal.

5. The method of claim 1 further comprising:
   generating, by the first remote hub, a message; and
   sending, by the first remote hub to the second remote hub, the message and an instruction to send the message via the second phase to a substation receiver coupled to the electrical distribution grid on a high voltage side of the transformer.

6. A first remote hub comprising:
   a memory; and
   a processor device coupled to the memory and configured to:
      send a first pilot signal on a first phase of a plurality of phases of an electrical distribution grid to which the first remote hub is coupled;
      receive, from a second remote hub coupled to the first phase, a first acknowledgement message;
      in response to the first acknowledgement message, update an inventory to identify the second remote hub as being coupled to the first phase on a low voltage side of a transformer;
      receive, from a third remote hub, a negative acknowledgement message; and
      in response to the negative acknowledgement message, update the inventory to identify the third remote hub as being coupled to a second phase on the low voltage side of the transformer.

7. The first remote hub of claim 6 wherein the processor device is further configured to send, by the first remote hub to the third remote hub, a message instructing the third remote hub to initiate a second pilot signal on the second phase.

8. The first remote hub of claim 7 wherein the processor device is further configured to:
   receive, from a fourth remote hub coupled to the second phase on the low voltage side of the transformer, a second acknowledgement message; and
   in response to the second acknowledgement message, update the inventory to identify the fourth remote hub as being coupled to the second phase on the low voltage side of the transformer.

9. The first remote hub of claim 8 wherein the processor device is further configured to:
   iteratively transmit, onto the first phase, a poll signal, wherein at each successive iteration an amplitude of the poll signal is increased; and
   record an amplitude of the poll signal wherein the second remote hub responds to the poll signal and neither the third remote hub or the fourth remote hub respond to the poll signal.

10. The first remote hub of claim 6 wherein the processor device is further configured to:
    generate a message; and
    send, to the second remote hub, the message and an instruction to send the message via the second phase to a substation receiver coupled to the electrical distribution grid on a high voltage side of the transformer.

* * * * *